US012717230B2

(12) United States Patent
Aritoshi et al.

(10) Patent No.: US 12,717,230 B2

(45) Date of Patent: Aug. 25, 2026

(54) PHOTOSENSITIVE RESIN COMPOSITION, TRANSFER FILM, CURED FILM, LAMINATE, AND METHOD FOR MANUFACTURING TOUCH PANEL

(71) Applicant: FUJIFILM Corporation, Tokyo (JP)

(72) Inventors: Yohei Aritoshi, Fujinomiya (JP); Kunihiko Kodama, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 644 days.

(21) Appl. No.: 17/553,327

(22) Filed: Dec. 16, 2021

(65) Prior Publication Data

US 2022/0107562 A1 Apr. 7, 2022

Related U.S. Application Data

(63) Continuation of application No. PCT/JP2020/025883, filed on Jul. 1, 2020.

(30) Foreign Application Priority Data

Jul. 24, 2019 (JP) ................................ 2019-136028
Oct. 11, 2019 (JP) ................................ 2019-187553

(51) Int. Cl.

| | |
|---|---|
| ***G03F 7/004*** | (2006.01) |
| ***G03F 7/033*** | (2006.01) |
| ***G06F 3/044*** | (2006.01) |
| ***H05K 3/28*** | (2006.01) |

(52) U.S. Cl.

CPC ............ *G03F 7/0045* (2013.01); *G03F 7/033* (2013.01); *G06F 3/044* (2013.01); *H05K 3/287* (2013.01); *G06F 2203/04103* (2013.01)

(58) Field of Classification Search

CPC ..................................................... G03F 7/0045

See application file for complete search history.

(56) References Cited

U.S. PATENT DOCUMENTS

2015/0013763 A1* 1/2015 Matsumura .............. C08J 7/043 252/514
2017/0137605 A1* 5/2017 Suzuki ................. C09D 133/08

(Continued)

FOREIGN PATENT DOCUMENTS

CN 106019447 A 10/2016
CN 109643062 A 4/2019
JP 51148784 A * 12/1976

(Continued)

OTHER PUBLICATIONS

English translation of JP2018072789. (Year: 2018).*

(Continued)

*Primary Examiner* — Mark F. Huff
*Assistant Examiner* — Anna Malloy
(74) *Attorney, Agent, or Firm* — Sughrue Mion, PLLC

(57) ABSTRACT

A photosensitive resin composition contains a compound A which has a heterocyclic structure having at least one atom of an oxygen atom, a nitrogen atom, or a sulfur atom in a ring structure, and has at least one functional group selected from the group consisting of —SH, —OH, —COOH, $—NH_2$, and $—CONH_2$, an alkali-soluble binder polymer, an ethylenically unsaturated compound, and a photopolymerization initiator.

17 Claims, 1 Drawing Sheet

(56) References Cited

U.S. PATENT DOCUMENTS

| | | | | |
|---|---|---|---|---|
| 2019/0137874 A1* | 5/2019 | Aridomi | .................. | H05K 3/28 |
| 2019/0171103 A1* | 6/2019 | Shimoyama | ............ | G03F 7/033 |

FOREIGN PATENT DOCUMENTS

| | | | | | |
|---|---|---|---|---|---|
| JP | 04122936 A | * | 4/1992 | | |
| JP | 2002086613 A | * | 3/2002 | ............ | C09D 5/086 |
| JP | 2002131915 A | * | 5/2002 | | |
| JP | 2003-280196 A | | 10/2003 | | |
| JP | 2013200431 A | * | 10/2013 | | |
| JP | 2014202895 A | * | 10/2014 | ........... | G03F 7/0226 |
| JP | 2016-160393 A | | 9/2016 | | |
| JP | 2017-097320 A | | 6/2017 | | |
| JP | 2018072789 A | * | 5/2018 | ........... | G03F 7/0035 |
| JP | 2018120652 A | * | 8/2018 | | |
| JP | 2019-101322 A | | 6/2019 | | |
| JP | 2020024374 A | * | 2/2020 | | |
| WO | 2016/159043 A1 | | 10/2016 | | |
| WO | WO-2018008376 A1 | * | 1/2018 | ............ | G03F 7/027 |
| WO | WO-2018042833 A1 | * | 3/2018 | ............ | G03F 7/004 |

OTHER PUBLICATIONS

English translation of JP2018120652. (Year: 2018).*
English translation of JP2014202895. (Year: 2014).*
English translation of JP2020024374. (Year: 2020).*
English translation of JP51148784. (Year: 1976).*
English translation of JP2013200431. (Year: 2013).*
English translation of JP04122936. (Year: 1992).*
English translation of JP2002131915. (Year: 2002).*
English translation of JP2002086613. (Year: 2002).*
Japanese Office Action dated Jun. 20, 2023 in Application No. 2021-533899.
Notice of Reasons for Refusal dated Jan. 10, 2023 from the Japanese Patent Office in Japanese Application No. 2021-533899.
Japanese Office Action dated Nov. 28, 2023 in App. No. 2021-533899.
Chinese Office Action dated Dec. 15, 2023 in App. No. 202080045202.1.
International Search Report issued Sep. 24, 2020 in International Application No. PCT/JP2020/025883.
Written Opinion of the International Searching Authority issued Sep. 24, 2020 in International Application No. PCT/JP2020/025883.
International Preliminary Report on Patentability issued Jan. 25, 2022 in International Application No. PCT/JP2020/025883.
Office Action issued Jul. 16, 2024 in Japanese Application No. 2021-533899.
Office Action issued Dec. 3, 2024 in Japanese Application No. 2021-533899.
Office Action issued Oct. 7, 2025 in Japanese Application No. 2024-160253.
Office Action dated Mar. 24, 2026, issued in Japanese Application No. 2024-160253.

* cited by examiner

PHOTOSENSITIVE RESIN COMPOSITION, TRANSFER FILM, CURED FILM, LAMINATE, AND METHOD FOR MANUFACTURING TOUCH PANEL

CROSS-REFERENCE TO RELATED APPLICATIONS

This application is a Continuation of PCT International Application No. PCT/JP2020/025883 filed on Jul. 1, 2020, which claims priority under 35 U.S.C. § 119(a) to Japanese Patent Application No. 2019-136028 filed on Jul. 24, 2019 and Japanese Patent Application No. 2019-187553 filed on Oct. 11, 2019. Each of the above application(s) is hereby expressly incorporated by reference, in its entirety, into the present application.

BACKGROUND OF THE INVENTION

1. Field of the Invention

The present disclosure relates to a photosensitive resin composition, a transfer film, a cured film, a laminate, and a manufacturing method of a touch panel.

2. Description of the Related Art

In recent years, in electronic devices such as a mobile phone, a car navigator, a personal computer, a ticket vending machine, or a terminal of the bank, a tablet-type input device is disposed on a surface of a liquid crystal device or the like. In such an electronic device, while referring to an instruction image displayed in an image display region of a liquid crystal device, information corresponding to the instruction image can be input by touching a portion where the instruction image is displayed, with a finger or a touch pen.

The input device described above (hereinafter, also referred to as a "touch panel") includes a resistance film-type input device, an electrostatic capacity-type input device, and the like. The electrostatic capacity-type input device is advantageous in that a transmittance conductive film may be simply formed on one sheet of substrate. As such an electrostatic capacity-type input device, for example, there is a device in which electrode patterns are extended in directions intersecting each other, and which detects an input position by detecting a change of electrostatic capacity between electrodes, in a case where a finger or the like is touched.

In order to protect electrode patterns or lead wire (for example, metal wire such as copper wire) put together on a frame portion of the electrostatic capacity-type input device, a transparent resin layer is usually provided. A photosensitive resin composition is usually used as a material for forming such a transparent resin layer.

In addition, as a surface coating metal material in the related art, a material disclosed in JP2002-86613A can be mentioned.

JP2002-86613A discloses a surface coating metal material that is a metal material having, at at least one side, a corrosion-resistant coating layer in which at least a rust inhibitor is dispersed in a matrix, and contains, as the rust inhibitor, one or more organic compounds which have a heterocyclic structure including at least one element selected from nitrogen, sulfur, or oxygen, have one or more functional groups including at least one element of oxygen, nitrogen, or sulfur, and have a structure having 3 or more sites having an ability to adsorb to metal elements.

SUMMARY OF THE INVENTION

An object to be achieved by an embodiment of the present invention is to provide a photosensitive resin composition having excellent development residue inhibitory property and rust preventive property for exposed wire around a film or a cured film to be obtained after a heat treatment.

Another object to be achieved by another embodiment of the present invention is to provide a transfer film formed of the photosensitive resin composition, a cured film, a laminate, and a manufacturing method of a touch panel.

Methods for achieving the objects described above include the following aspects.

<1> A photosensitive resin composition comprising:

a compound A which has a heterocyclic structure having at least one atom of an oxygen atom, a nitrogen atom, or a sulfur atom in a ring structure, and has at least one functional group selected from the group consisting of —SH, —OH, —COOH, $—NH_2$, and $—CONH_2$;

an alkali-soluble binder polymer;

an ethylenically unsaturated compound; and a photopolymerization initiator.

<2> The photosensitive resin composition according to <1>, in which the compound A has, as the heterocyclic structure, a 5-membered heterocycle having a nitrogen atom in the ring structure or a 6-membered heterocycle having a nitrogen atom in the ring structure.

<3> The photosensitive resin composition according to <1> or <2>, in which the compound A has, as the heterocyclic structure, a 6-membered heterocycle having a nitrogen atom in the ring structure.

<4> The photosensitive resin composition according to any one of <1> to <3>, in which the heterocyclic structure in the compound A is a pyridine ring structure, a pyrimidine ring structure, or a 1,3,5-triazine ring structure.

<5> The photosensitive resin composition according to any one of <1> to <4>, in which the heterocyclic structure in the compound A is a pyridine ring structure.

<6> The photosensitive resin composition according to any one of <1> to <5>, in which the compound A is a compound having a total of 1 to 3 of the functional groups selected from the group consisting of —SH, —OH, —COOH, $—NH_2$, and $—CONH_2$.

<7> The photosensitive resin composition according to any one of <1> to <6>, in which the compound A is a compound having one functional group selected from the group consisting of —SH, —OH, —COOH, $—NH_2$, and $—CONH_2$.

<8> The photosensitive resin composition according to any one of <1> to <7>, in which the compound A is a compound having at least one functional group selected from the group consisting of —OH, —COOH, and $—CONH_2$.

<9> The photosensitive resin composition according to any one of <1> to <8>, in which the compound A is a compound having one or two functional groups selected from the group consisting of —OH, —COOH, and $—CONH_2$.

<10> The photosensitive resin composition according to any one of <1> to <9>, in which the compound A is a compound having one —COOH or —$CONH_2$ as the functional group.

<11> The photosensitive resin composition according to any one of <1> to <10>, in which the functional group in the compound A is a group directly bonded to a heterocycle in the heterocyclic structure.

<12> The photosensitive resin composition according to any one of <1> to <11>, in which a content of the compound A is 0.1% by mass to 2.0% by mass with respect to a total solid content of the photosensitive resin composition.

<13> The photosensitive resin composition according to any one of <1> to <12>, in which, in a case where a storage elastic modulus of the photosensitive resin composition at 100° C. is defined as $P\times10^2$ Pa and a content of the compound A with respect to a total solid content in the photosensitive resin composition is defined as $W^A$% by mass, Expression 1 is satisfied, $$0.01 \le P/W^A \le 1{,}000 \quad \text{Expression 1}$$

<14> The photosensitive resin composition according to any one of <1> to <13>, in which, in a case where a storage elastic modulus of the photosensitive resin composition at 100° C. is defined as $P\times10^2$ Pa and a content of the compound A with respect to a total solid content in the photosensitive resin composition is defined as $W^A$% by mass, Expression 2 is satisfied, $$0.1 \le P/W^A \le 500 \quad \text{Expression 2}$$

<15> The photosensitive resin composition according to any one of <1> to <14>, in which the photosensitive resin composition is a photosensitive resin composition for forming a protective film in a touch panel.

<16> A transfer film comprising:

a temporary support; and a photosensitive layer consisting of the photosensitive resin composition according to any one of <1> to <15>, or obtained by drying the photosensitive resin composition.

<17> A cured film obtained by curing the photosensitive resin composition according to any one of <1> to <15>.

<18> A laminate comprising:

a substrate; and a cured film obtained by curing the photosensitive resin composition according to any one of <1> to <15>.

<19> A manufacturing method of a touch panel, comprising:

preparing a substrate for a touch panel having a surface on which at least one of an electrode for a touch panel or a wire for a touch panel is disposed;

forming a photosensitive layer consisting of the photosensitive resin composition according to any one of <1> to <15> or a photosensitive layer obtained by drying the photosensitive resin composition on the surface of the substrate for a touch panel, on which at least one of the electrode for a touch panel or the wire for a touch panel is disposed;

performing a pattern exposure on the photosensitive layer formed on the substrate for a touch panel; and developing the photosensitive layer subjected to the pattern exposure to obtain a protective film which protects at least a part of at least one of the electrode for a touch panel or the wire for a touch panel.

According to the embodiment of the present invention, it is possible to provide a photosensitive resin composition having excellent development residue inhibitory property and rust preventive property for exposed wire around a film or a cured film to be obtained after a heat treatment.

According to another embodiment of the present invention, it is possible to provide a transfer film formed of the photosensitive resin composition, a cured film, a laminate, and a manufacturing method of a touch panel.

DESCRIPTION OF THE PREFERRED EMBODIMENTS

Figure 1:
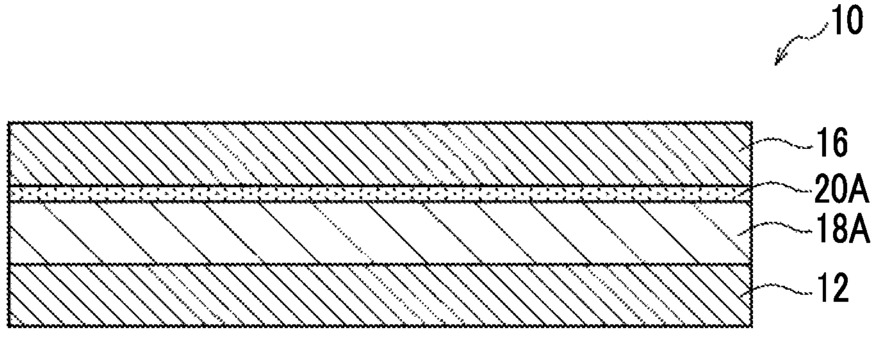
FIG. 1 is a schematic cross sectional view showing an example of a transfer film according to an embodiment of the present disclosure.

Hereinafter, the content of the present disclosure will be described in detail. The configuration requirements will be described below based on the representative embodiments of the present disclosure, but the present disclosure is not limited to such embodiments.

In the present disclosure, a term "to" showing a range of numerical values is used as a meaning including a lower limit value and an upper limit value disclosed before and after the term.

In a range of numerical values described in stages in this specification, the upper limit value or the lower limit value described in one range of numerical values may be replaced with an upper limit value or a lower limit value of the range of numerical values described in other stages. In addition, in a range of numerical values described in this specification, the upper limit value or the lower limit value of the range of numerical values may be replaced with values shown in the examples.

Regarding a term, group (atomic group) of this present disclosure, a term with no description of "substituted" and "unsubstituted" includes both a group not including a substituent and a group including a substituent. For example, an "alkyl group" not only includes an alkyl group not including a substituent (unsubstituted alkyl group), but also an alkyl group including a substituent (substituted alkyl group).

In addition, in the present disclosure, "% by mass" is identical to "% by weight" and "part by mass" is identical to "part by weight".

Further, in the present disclosure, a combination of two or more preferable aspects is the more preferable aspects.

In the present disclosure, in a case where a plurality of substances corresponding to components are present in a composition, an amount of each component in the composition means a total amount of the plurality of substances present in the composition, unless otherwise noted.

In the present disclosure, a term "step" not only includes an independent step, but also includes a step, in a case where the step may not be distinguished from the other step, as long as the expected object of the step is achieved.

In the present disclosure, "(meth)acrylic acid" has a concept including both acrylic acid and a methacrylic acid, "(meth)acrylate" has a concept including both acrylate and methacrylate, and "(meth)acryloyl group" has a concept including both acryloyl group and methacryloyl group.

A weight-average molecular weight (Mw) and a number average molecular weight (Mn) of the present disclosure, unless otherwise noted, are detected by a gel permeation chromatography (GPC) analysis apparatus using a column of TSKgel GMHxL, TSKgel G4000HxL, TSKgel G2000HxL (all product names manufactured by Tosoh Corporation), by using tetrahydrofuran (THF) as a solvent and a differential refractometer, and are molecular weights obtained by conversion using polystyrene as a standard substance.

In the present disclosure, unless otherwise specified, a molecular weight of a compound having a molecular weight distribution is the weight-average molecular weight.

In the present disclosure, unless otherwise specified, a ratio of constitutional units of a polymer is a molar ratio.

In the present disclosure, unless otherwise specified, a refractive index is a value at a wavelength of 550 nm measured at 25° C. with an ellipsometer.

Hereinafter, the present disclosure will be described in detail.

(Photosensitive Resin Composition)

A photosensitive resin composition according to an embodiment of the present disclosure contains a compound A which has a heterocyclic structure having at least one atom of an oxygen atom, a nitrogen atom, or a sulfur atom in a ring structure, and has at least one functional group selected from the group consisting of —SH, —OH, —COOH, —$NH_2$, and —$CONH_2$, an alkali-soluble binder polymer, an ethylenically unsaturated compound, and a photopolymerization initiator.

Since the photosensitive resin composition according to the embodiment of the present disclosure has excellent development residue inhibitory property and excellent rust preventive property for exposed wire around a film or a cured film to be obtained after a heat treatment (hereinafter, also simply referred to as "rust preventive property), the photosensitive resin composition according to the embodiment of the present disclosure can be suitably used as a photosensitive resin composition for a touch panel, more suitably used as a photosensitive resin composition for forming a protective film in a touch panel, and particularly suitably used as a photosensitive resin composition for forming an electrode protective film in a touch panel.

As a result of intensive studies by the present inventors, with the above-described configuration, it is found that it is possible to provide a photosensitive resin composition having excellent development residue inhibitory property and rust preventive property for exposed wire around a cured film to be obtained after a heat treatment.

An operation mechanism for excellent effect by this is not clear, but is assumed as follows.

Since the photosensitive resin composition according to the embodiment of the present disclosure contains the compound A which has a heterocyclic structure having at least one atom of an oxygen atom, a nitrogen atom, or a sulfur atom in a ring structure, and has at least one functional group selected from the group consisting of —SH, —OH, —COOH, —$NH_2$, and —$CONH_2$, the compound A volatilizes during the heat treatment (also referred to as "baking") after forming the film or cured film to prevent corrosion of the exposed wire (for example, copper wire) around the film or cured film, and it is assumed that the rust preventive property is excellent. In addition, since the above-described compound A has a heterocyclic structure having at least one atom of an oxygen atom, a nitrogen atom, or a sulfur atom in a ring structure, and has at least one functional group selected from the group consisting of —SH, —OH, —COOH, —$NH_2$, and —$CONH_2$, adsorptivity to the wire in a case where the heterocyclic structure and the functional group volatilize is improved, and it is assumed that the rust preventive property is excellent.

In addition, since the above-described compound A has at least one functional group selected from the group consisting of —SH, —OH, —COOH, —$NH_2$, and —$CONH_2$, aggregation of development residue is suppressed while improving solubility and dispersibility of the development residue, and it is assumed that the generation of development residue can be suppressed.

<Compound A>

The photosensitive resin composition according to the embodiment of the present disclosure contains a compound A which has a heterocyclic structure having at least one atom of an oxygen atom, a nitrogen atom, or a sulfur atom in a ring structure, and has at least one functional group selected from the group consisting of —SH, —OH, —COOH, —$NH_2$, and —$CONH_2$.

In the compound A, from the viewpoint of development residue inhibitory property and rust preventive property, the above-described functional group is preferably a group directly bonded to a heterocycle in the above-described heterocyclic structure.

As the above-described heterocyclic structure included in the compound A, from the viewpoint of development residue inhibitory property and rust preventive property, it is preferable to have at least one atom of a nitrogen atom or a sulfur atom in the ring structure (also referred to as "have as a ring member in the present disclosure), it is more preferable to have a nitrogen atom in the ring structure, it is still more preferably to have one or two nitrogen atoms in the ring structure, and it is particularly preferable to have only one nitrogen atom in the ring structure.

In addition, as the above-described heterocyclic structure included in the compound A, from the viewpoint of development residue inhibitory property and rust preventive property, a 5-membered heterocyclic structure or a 6-membered heterocyclic structure is preferable, and a 6-membered heterocyclic structure is more preferable.

Further, as the above-described heterocyclic structure, from the viewpoint of development residue inhibitory property and rust preventive property, the compound A preferably has a 5-membered heterocyclic structure having a nitrogen atom in the ring structure or a 6-membered heterocyclic structure having a nitrogen atom in the ring structure, and more preferably has a 6-membered heterocyclic structure having a nitrogen atom in the ring structure.

In addition, the above-described heterocyclic structure included in the compound A may be an aliphatic heterocyclic structure or an aromatic heterocyclic structure, and may be a monocyclic heterocyclic structure or a polycyclic structure in which at least one heterocycle is condensed. From the viewpoint of volatility and rust preventive property, the above-described heterocyclic structure is preferably an aromatic heterocyclic structure, and more preferably a monocyclic aromatic heterocyclic structure.

Further, the compound A may have only one of the above-described heterocyclic structure or two or more thereof, and from the viewpoint of development residue inhibitory property, volatility, and rust preventive property, it is preferable to have only one of the above-described heterocyclic structure.

Specific examples of the above-described heterocyclic structure included in the compound A include a pyridine ring structure, a pyrimidine ring structure, a 1,3,5-triazine ring structure, a pyrrole ring structure, a furan ring structure, a thiophene ring structure, an imidazole ring structure, a pyrazole ring structure, a triazole ring structure, a benzotriazole ring structure, a tetrazole ring structure, a thiadiazole ring structure, an oxazole ring structure, a thiazole ring structure, a benzothiazole ring structure, an indole ring structure, an isoindole ring structure, a benzimidazole ring structure, a benzoxazole ring structure, a quinoline ring structure, an isoquinoline ring structure, a phthalazine ring structure, a naphthylidine ring structure, a quinoxaline ring structure, a quinazoline ring structure, a cinnoline ring structure, a purine ring structure, a carbazole ring structure, a phenanthridine ring structure, and an acridine ring structure.

Among these, from the viewpoint of development residue inhibitory property, volatility, and rust preventive property, a pyridine ring structure, a pyrimidine ring structure, or a 1,3,5-triazine ring structure is preferable, and a pyridine ring structure is more preferable.

As the above-described functional group included in the compound A, from the viewpoint of development residue inhibitory property, adsorptivity to the wire, and rust preventive property, at least one group selected from the group consisting of —SH, —OH, —COOH, and —$CONH_2$ is preferable, at least one group selected from the group consisting of —OH, —COOH, and —$CONH_2$ is more preferable, at least one group selected from the group consisting of —COOH and —$CONH_2$ is still more preferable, and —$CONH_2$ is particularly preferable.

From the viewpoint of development residue inhibitory property and rust preventive property, the compound A is preferably a compound having a total of 1 to 3 of the above-described functional groups selected from the group consisting of —SH, —OH, —COOH, —$NH_2$, and —$CONH_2$, more preferably a compound having a total of 1 or 2 of the above-described functional groups selected from the group consisting of —SH, —OH, —COOH, —$NH_2$, and —$CONH_2$, and particularly preferably a compound having one functional group selected from the group consisting of —SH, —OH, —COOH, —$NH_2$, and —$CONH_2$.

In addition, from the viewpoint of development residue inhibitory property, adsorptivity to the wire, volatility, and rust preventive property, the compound A is preferably a compound having at least one functional group selected from the group consisting of —OH, —COOH, and —$CONH_2$, more preferably a compound having one or two functional groups selected from the group consisting of —OH, —COOH, and —$CONH_2$, and particularly preferably a compound having, as the above-described functional group, one —COOH or —$CONH_2$.

From the viewpoint of volatility and rust preventive property, the molecular weight of the compound A is preferably 500 or less, more preferably 80 to 300, still more preferably 100 to 200, and particularly preferably 100 to 150.

From the viewpoint of development residue inhibitory property and rust preventive property, the compound A is preferably a compound represented by any one of Formula (A-1), Formula (A-2), or Formula (A-3), and more preferably a compound represented by Formula (A-1).

(A-1)

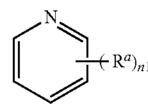

(A-2)

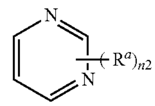

(A-3)

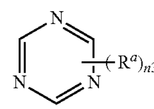

In Formulae (A-1) to (A-3), $R^a$'s each independently represent —SH, —OH, —COOH, —$NH_2$, or —$CONH_2$, n1 represents an integer of 1 to 5, n2 represents an integer of 1 to 4, and n3 represents an integer of 1 to 3.

In Formulae (A-1) to (A-3), from the viewpoint of development residue inhibitory property, adsorptivity to the wire, and rust preventive property, $R^a$ is preferably —SH, —OH, —COOH, or —$CONH_2$, more preferably —OH, —COOH, or —$CONH_2$, still more preferably —COOH or —$CONH_2$, and particularly preferably —$CONH_2$.

From the viewpoint of development residue inhibitory property, adsorptivity to the wire, volatility, and rust preventive property, n1 in Formula (A-1) is preferably an integer of 1 to 3, more preferably 1 or 2, and particularly preferably 1.

From the viewpoint of development residue inhibitory property, adsorptivity to the wire, volatility, and rust preventive property, n2 in Formula (A-2) is preferably an integer of 1 to 3, more preferably 1 or 2, and particularly preferably 1.

From the viewpoint of development residue inhibitory property and rust preventive property, n3 in Formula (A-3) is preferably 1 or 3 and more preferably 1.

The compound A is not particularly limited, and specific examples thereof include pyridine-2-carboxylic acid (picolinic acid), pyridine-3-carboxylic acid (nicotinic acid), pyridine-4-carboxylic acid (isonicotinic acid), 2-hydroxypyridine, 3-hydroxypyridine, 4-hydroxypyridine, 2-mercaptopyridine, 3-mercaptopyridine, 4-mercaptopyridine, 2-aminopyridine, 3-aminopyridine, 4-aminopyridine, pyridine-3,5-dicarboxylic acid, 2,3-dihydroxypyridine, pyridine-2-hydroxy-3-carboxylic acid, 2-aminopyrimidine, 4-hydroxypyrimidine, 2-pyrimidinethiol, pyrimidine-4-carboxylic acid, 4,6-dihydroxypyrimidine, 4-amino-6-hydroxypyrimidine, 4,5-diaminopyrimidine, 2,4-diamino-1,3,5-triazine, pyrazole-4-carboxylic acid, 5-benzotriazolecarboxylic acid, 2,6-dihydroxyisonicotinic acid, 2-amino-4,6-dihydroxypyrimidine, 2,4-diamino-6-hydroxypyrimidine, 4,6-diamino-2-mercaptopyrimidine, cyanulic acid (trihydroxytriazine), nicotinamide, 6-methylnicotinamide, isonicotinamide, 2-aminoisonicotinamide, and 6-aminoisonicotinamide.

Among these, as the compound A, from the viewpoint of development residue inhibitory property and rust preventive property, at least one compound selected from the group consisting of pyridine-2-carboxylic acid, pyridine-3-carboxylic acid, 2-hydroxypyridine, 2-mercaptopyridine, 2-aminopyridine, 2,3-dihydroxypyridine, pyridine-2-hydroxy-3-carboxylic acid, 2-aminopyrimidine, 4-hydroxypyrimidine, pyrimidine-4-carboxylic acid, 4,6-dihydroxypyrimidine, pyrazole-4-carboxylic acid, 5-benzotriazolecarboxylic acid, 2,6-dihydroxyisonicotinic acid, cyanulic acid, nicotinamide, and isonicotinamide is preferable, at least one compound selected from the group consisting of pyridine-2-carboxylic acid, pyridine-3-carboxylic acid, 2-hydroxypyridine, 2,3-dihydroxypyridine, pyridine-2-hydroxy-3-carboxyli c acid, 4-hydroxypyrimidine, pyrimidine-4-carboxylic acid, 4,6-dihydroxypyrimidine, nicotinamide, and isonicotinamide is more preferable, and at least one compound selected from the group consisting of pyridine-2-carboxylic acid, pyridine-3-carboxylic acid, 2-hydroxypyridine, 2,3-dihydroxypyridine, pyridine-2-hydroxy-3-carboxylic acid, and isonicotinamide is particularly preferable.

In addition, as the compound A, from the viewpoint of general-purpose properties, nicotinamide, isonicotinamide, or pyridine-3-carboxylic acid is preferable, and from the viewpoint of the balance between volatility and adsorptivity to the wire, at least one compound selected from the group consisting of isonicotinamide, pyridine-2-carboxylic acid, 2-hydroxypyridine, 2,3-dihydroxypyridine, pyridine-2-hydroxy-3-carboxylic acid, 4-hydroxypyrimidine, pyrimidine-4-carboxylic acid, and 4,6-dihydroxypyrimidine is preferable.

The compound A may be used alone or in combination of two or more thereof.

From the viewpoint of development residue inhibitory property and rust preventive property, the content of the compound A is preferably 0.01% by mass to 20% by mass, more preferably 0.05% by mass to 10% by mass, still more preferably 0.1% by mass to 2.0% by mass, and particularly preferably 0.2% by mass to 1.8% by mass with respect to the total solid content in the photosensitive resin composition.

The total solid content in the photosensitive resin composition in the present disclosure refers to an amount excluding volatile components such as a solvent, and it is not necessary that the solid content in the present disclosure is a solid, and the solid content may be a liquid or a mixture of a solid and a liquid.

In the photosensitive resin composition according to the embodiment of the present disclosure, in a case where a storage elastic modulus of the photosensitive resin composition at 100° C. is defined as $P\times10^2$ Pa and a content of the compound A with respect to a total solid content in the photosensitive resin composition is defined as $W^A$% by mass, it is preferable that Expression 1 is satisfied, it is more preferable that Expression 2 is satisfied, it is still more preferable that Expression 3 is satisfied, and it is particularly preferable that Expression 4 is satisfied.

$$0.01\leq P/W^A\leq 1{,}000 \quad \text{Expression 1}$$

$$0.1\leq P/W^A\leq 500 \quad \text{Expression 2}$$

$$0.5\leq P/W^A\leq 10 \quad \text{Expression 3}$$

$$0.5\leq P/W^A\leq 4 \quad \text{Expression 4}$$

In the present disclosure, the storage elastic modulus of the photosensitive resin composition at 100° C. is measured by the following method.

A rheometer (Discovery HR-2) manufactured by TA Instruments is used for measuring the storage elastic modulus. A 20 mmφ parallel plate is used as a jig for a sample fixing.

On a polyethylene terephthalate film (temporary support, 16QS62 (16KS40) (manufactured by Toray Industries, Inc.)) having a thickness of 16 μm, a coating liquid for a photosensitive layer is applied using a slit-shaped nozzle such that the thickness after drying is adjusted to 10 μm, and the solvent is removed by drying the coating liquid with a hot air convection dryer having a temperature gradient of 75° C. to 120° C. to form a photosensitive layer. This operation is repeated 50 times to be laminated, thereby obtaining a sample having a film thickness of approximately 500 μm.

The produced sample is placed between the plates, and the sample is closely attached to the plates. Dynamic viscoelasticity is measured at a heating rate of 5° C./min in a temperature range of 20° C. to 125° C. in a shear mode, frequency of 1.0 Hz, and a strain of 0.5% to obtain a storage elastic modulus G' (Pa) at 100° C.

<Alkali-Soluble Binder Polymer>

The photosensitive resin composition according to the embodiment of the present disclosure contains an alkali-soluble binder polymer (hereinafter, also simply referred to as a "binder polymer").

In the present disclosure, the "alkali-soluble" means that the solubility in 100 g of aqueous solution of 1% by mass sodium carbonate at 22° C. is 0.1 g or more.

From a viewpoint of developability, for example, the binder polymer is preferably a binder polymer having an acid value of 60 mgKOH/g or more.

In addition, from the viewpoint that it is easy to form a strong film by thermally crosslinking with a crosslinking component by heating, for example, the binder polymer is still more preferably a resin (so-called a carboxy group-containing resin) having an acid value of 60 mgKOH/g or more and having a carboxy group, and particularly preferably an acrylic resin (so-called a carboxy group-containing acrylic resin) having an acid value of 60 mgKOH/g or more and having a carboxy group.

In the present disclosure, the acrylic resin refers to a resin having a constitutional unit derived from a (meth)acrylic compound, and the content of the constitutional unit is preferably 30% by mass or more and more preferably 50% by mass or more with respect to the total mass of the resin.

In a case where the binder polymer is a resin having a carboxy group, for example, the three-dimensional crosslinking density can be increased by adding a thermal crosslinking compound such as a blocked isocyanate compound and thermally crosslinking. In addition, in a case where the carboxy group of the resin having a carboxy group is anhydrous and hydrophobized, wet heat resistance can be improved.

The carboxy group-containing acrylic resin having an acid value of 60 mgKOH/g or more is not particularly limited as long as the above-described conditions of acid value are satisfied, and a known acrylic resin can be appropriately selected and used.

For example, a carboxy group-containing acrylic resin having an acid value of 60 mgKOH/g or more among polymers described in paragraph 0025 of JP2011-95716A, a carboxy group-containing acrylic resin having an acid value of 60 mgKOH/g or more among polymers described in paragraphs 0033 to 0052 of JP2010-237589A, and the like can be preferably used.

From the viewpoint of development residue inhibitory property, water vapor permeability of a cured film to be obtained, and pressure-sensitive adhesiveness of an uncured film to be obtained, the binder polymer is preferably an acrylic resin or a styrene-acrylic copolymer and more preferably a styrene-acrylic copolymer.

In the present disclosure, the styrene-acrylic copolymer refers to a resin having a constitutional unit derived from a styrene compound and a constitutional unit derived from a (meth)acrylic compound, and the total content of the constitutional unit derived from a styrene compound and the constitutional unit derived from a (meth)acrylic compound is preferably 30% by mass or more and more preferably 50% by mass or more with respect to the total mass of the copolymer.

In addition, the content of the constitutional unit derived from a styrene compound is preferably 1% by mass or more, more preferably 5% by mass or more, and still more preferably 5% by mass to 80% by mass with respect to the total mass of the above-described copolymer.

In addition, the content of the constitutional unit derived from a (meth)acrylic compound is preferably 5% by mass or more, more preferably 10% by mass or more, and still more preferably 20% by mass to 95% by mass with respect to the total mass of the above-described copolymer.

Further, examples of the above-described (meth)acrylic compound include a (meth)acrylate compound, a (meth) acrylic acid, a (meth)acrylamide compound, and a (meth) acrylonitrile. Among these, at least one compound selected from the group consisting of a (meth)acrylate compound and a (meth)acrylic acid is preferable.

—Constitutional Unit Having Aromatic Ring—

From the viewpoint of development residue inhibitory property, water vapor permeability of a cured film to be obtained, and hardness, the binder polymer preferably has a constitutional unit having an aromatic ring.

Examples of a monomer forming the constitutional unit having an aromatic ring include styrene compounds such as styrene, tert-butoxystyrene, methylstyrene, and α-methylstyrene, and benzyl (meth)acrylate.

Among these, a styrene compound is preferable, and styrene is particularly preferable.

In addition, from the viewpoint of water vapor permeability and hardness of a cured film to be obtained, the binder polymer more preferably has a constitutional unit (constitutional unit derived from styrene) represented by Formula (S).

(S)

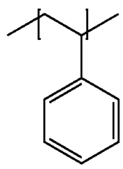

In a case where the binder polymer includes the constitutional unit having an aromatic ring, from the viewpoint of water vapor permeability and hardness of a cured film to be obtained, the content of the constitutional unit having an aromatic ring is preferably 5% by mass to 90% by mass, more preferably 10% by mass to 70% by mass, and particularly preferably 20% by mass to 50% by mass with respect to the total mass of the binder polymer.

In addition, from the viewpoint of water vapor permeability and hardness of a cured film to be obtained, the content of the constitutional unit having an aromatic ring in the binder polymer is preferably 5 mol % to 70 mol %, more preferably 10 mol % to 60 mol %, and particularly preferably 20 mol % to 50 mol % with respect to the total amount of the binder polymer.

Further, from the viewpoint of water vapor permeability and hardness of a cured film to be obtained, the content of the constitutional unit represented by Formula (S) in the binder polymer is preferably 5 mol % to 70 mol %, more preferably 10 mol % to 60 mol %, and particularly preferably 20 mol % to 50 mol % with respect to the total amount of the binder polymer.

In the present disclosure, in a case where the content of a "constitutional unit" is defined by a molar ratio, the "constitutional unit" is synonymous with the "monomer unit". In addition, in the present disclosure, the "monomer unit" may be modified after polymerization by a polymer reaction or the like. The same applies to the following.

—Constitutional Unit Having Aliphatic Hydrocarbon Ring—

From the viewpoint of development residue inhibitory property, hardness of a cured film to be obtained, and pressure-sensitive adhesiveness of an uncured film to be obtained, the binder polymer preferably has a constitutional unit having an aliphatic hydrocarbon ring.

Examples of the aliphatic hydrocarbon ring in the constitutional unit having an aliphatic hydrocarbon ring include a tricyclodecane ring, a cyclohexane ring, a cyclopentane ring, a norbornane ring, and an isophorone ring.

Among these, from the viewpoint of hardness of a cured film to be obtained and pressure-sensitive adhesiveness of an uncured film to be obtained, a ring in which two or more aliphatic hydrocarbon rings are fused is preferable, and a tetrahydrodicyclopentadiene ring (tricyclo[5.2.1.0$^{2,6}$]decane ring) is particularly preferable.

Examples of a monomer forming the constitutional unit having an aliphatic hydrocarbon ring include dicyclopentanyl (meth)acrylate, cyclohexyl (meth)acrylate, and isobornyl (meth)acrylate.

In addition, from the viewpoint of hardness of a cured film to be obtained and pressure-sensitive adhesiveness of an uncured film to be obtained, the binder polymer more preferably has a constitutional unit represented by Formula (Cy), and particularly preferably has the constitutional unit represented by Formula (S) and the constitutional unit represented by Formula (Cy).

(Cy)

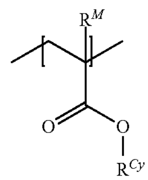

In Formula (Cy), $R^M$ represents a hydrogen atom or a methyl group, and $R^{Cy}$ represents a monovalent group having an aliphatic hydrocarbon ring structure.

$R^M$ in Formula (Cy) is preferably a methyl group.

From the viewpoint of hardness of a cured film to be obtained and pressure-sensitive adhesiveness of an uncured film to be obtained, $R^{Cy}$ in Formula (Cy) is preferably a monovalent group having an aliphatic hydrocarbon ring structure having 5 to 20 carbon atoms, more preferably a monovalent group having an aliphatic hydrocarbon ring structure having 6 to 16 carbon atoms, and particularly preferably a monovalent group having an aliphatic hydrocarbon ring structure having 8 to 14 carbon atoms.

In addition, from the viewpoint of hardness of a cured film to be obtained and pressure-sensitive adhesiveness of an uncured film to be obtained, the aliphatic hydrocarbon ring structure in $R^{Cy}$ of Formula (Cy) is preferably a cyclopentane ring structure, a cyclohexane ring structure, a tetrahydrodicyclopentadiene ring structure, a norbornane ring structure, or an isophorone ring structure, more preferably a cyclohexane ring structure or a tetrahydrodicyclopentadiene ring structure, and particularly preferably a tetrahydrodicyclopentadiene ring structure.

Further, from the viewpoint of hardness of a cured film to be obtained and pressure-sensitive adhesiveness of an uncured film to be obtained, the aliphatic hydrocarbon ring structure in $R^{Cy}$ of Formula (Cy) is preferably a ring structure in which two or more aliphatic hydrocarbon rings are fused, and more preferably a ring structure in which two to four aliphatic hydrocarbon rings are fused.

Furthermore, from the viewpoint of hardness of a cured film to be obtained and pressure-sensitive adhesiveness of an uncured film to be obtained, $R^{Cy}$ in Formula (Cy) is preferably a group in which the oxygen atom in —C(═O)O— of Formula (Cy) and the aliphatic hydrocarbon ring structure are directly bonded, that is, an aliphatic hydrocarbon ring group, more preferably a cyclohexyl group or a dicyclopentanyl group, and particularly preferably a dicyclopentanyl group.

The binder polymer may have one constitutional unit having an aliphatic hydrocarbon ring alone, or two or more kinds thereof.

In a case where the binder polymer includes the constitutional unit having an aliphatic hydrocarbon ring, from the viewpoint of water vapor permeability and hardness of a cured film to be obtained, the content of the constitutional unit having an aliphatic hydrocarbon ring is preferably 5% by mass to 90% by mass, more preferably 10% by mass to 80% by mass, and particularly preferably 20% by mass to 70% by mass with respect to the total mass of the binder polymer.

In addition, from the viewpoint of water vapor permeability and hardness of a cured film to be obtained, the content of the constitutional unit having an aliphatic hydrocarbon ring in the binder polymer is preferably 5 mol % to 70 mol %, more preferably 10 mol % to 60 mol %, and particularly preferably 20 mol % to 50 mol % with respect to the total amount of the binder polymer.

Further, from the viewpoint of water vapor permeability and hardness of a cured film to be obtained, the content of the constitutional unit represented by Formula (Cy) in the binder polymer is preferably 5 mol % to 70 mol %, more preferably 10 mol % to 60 mol %, and particularly preferably 20 mol % to 50 mol % with respect to the total amount of the binder polymer.

In a case where the binder polymer includes the constitutional unit having an aromatic ring and the constitutional unit having an aliphatic hydrocarbon ring, from the viewpoint of water vapor permeability and hardness of a cured film to be obtained, the total content of the constitutional unit having an aromatic ring and the constitutional unit having an aliphatic hydrocarbon ring is preferably 10% by mass to 90% by mass, more preferably 20% by mass to 80% by mass, and particularly preferably 40% by mass to 75% by mass with respect to the total mass of the binder polymer.

In addition, from the viewpoint of water vapor permeability and hardness of a cured film to be obtained, the total content of the constitutional unit having an aromatic ring and the constitutional unit having an aliphatic hydrocarbon ring in the binder polymer is preferably 10 mol % to 80 mol %, more preferably 20 mol % to 70 mol %, and particularly preferably 40 mol % to 60 mol % with respect to the total amount of the binder polymer.

Further, from the viewpoint of water vapor permeability and hardness of a cured film to be obtained, the total content of the constitutional unit represented by Formula (S) and the constitutional unit represented by Formula (Cy) in the binder polymer is preferably 10 mol % to 80 mol %, more preferably 20 mol % to 70 mol %, and particularly preferably 40 mol % to 60 mol % with respect to the total amount of the binder polymer.

In addition, from the viewpoint of water vapor permeability and hardness of a cured film to be obtained, the molar amount nS of the constitutional unit represented by Formula (S) and the molar amount nCy of the constitutional unit represented by Formula (Cy) in the binder polymer preferably satisfy the relationship shown in the following expression (SCy), more preferably satisfy the following expression (SCy-1), and particularly preferably satisfy the following expression (SCy-2).

$$0.2 \leq nS/(nS+nCy) \leq 0.8 \quad \text{Expression (SCy)}$$

$$0.30 \leq nS/(nS+nCy) \leq 0.75 \quad \text{Expression (SCy-1)}$$

$$0.40 \leq nS/(nS+nCy) \leq 0.70 \quad \text{Expression (SCy-2)}$$

—Constitutional Unit Having Acid Group—

From the viewpoint of development residue inhibitory property, hardness of a cured film to be obtained, and developability, the binder polymer preferably has a constitutional unit having an acid group.

Examples of the above-described acid group include a carboxy group, a sulfo group, a phosphonic acid group, and a phosphoric acid group, and a carboxy group is preferable.

Preferred examples of the above-described constitutional unit having an acid group include constitutional units derived from (meth)acrylic acid, which are shown below, and more preferred examples thereof include a constitutional unit derived from methacrylic acid.

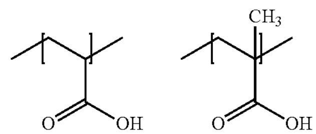

The binder polymer may have one constitutional unit having an acid group alone, or two or more kinds thereof.

In a case where the binder polymer includes the constitutional unit having an acid group, from the viewpoint of hardness of a cured film to be obtained, and developability, the content of the constitutional unit having an acid group is preferably 5% by mass to 50% by mass, more preferably 5% by mass to 40% by mass, and particularly preferably 10% by mass to 30% by mass with respect to the total mass of the binder polymer.

In addition, from the viewpoint of hardness of a cured film to be obtained, and developability, the content of the constitutional unit having an acid group in the binder polymer is preferably 5 mol % to 70 mol %, more preferably 10 mol % to 50 mol %, and particularly preferably 20 mol % to 40 mol % with respect to the total amount of the binder polymer.

Further, from the viewpoint of hardness of a cured film to be obtained, and developability, the content of the constitutional unit derived from (meth)acrylic acid in the binder polymer is preferably 5 mol % to 70 mol %, more preferably 10 mol % to 50 mol %, and particularly preferably 20 mol % to 40 mol % with respect to the total amount of the binder polymer.

—Constitutional Unit Having Reactive Group—

From the viewpoint of hardness of a cured film to be obtained and pressure-sensitive adhesiveness of an uncured film to be obtained, the binder polymer preferably has a reactive group, and more preferably has a constitutional unit having a reactive group.

As the reactive group, a radically polymerizable group is preferable, and an ethylenically unsaturated group is more preferable. In addition, in a case where the binder polymer has an ethylenically unsaturated group, the binder polymer preferably has a constitutional unit having an ethylenically unsaturated group in the side chain.

In the present disclosure, the "main chain" represents a relatively longest binding chain in a molecule of a polymer compound constituting a resin, and the "side chain" represents an atomic group branched from the main chain.

The ethylenically unsaturated group is preferably a (meth) acryloyl group and more preferably a (meth)acryloxy group.

Examples of the constitutional unit having a reactive group include those shown below, but it is needless to say that the constitutional unit having a reactive group is not limited thereto.

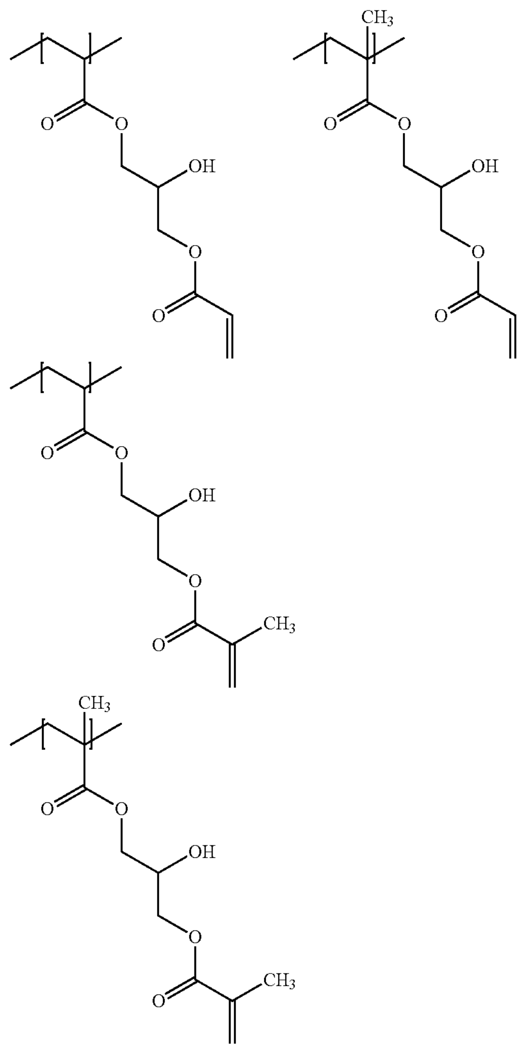

The binder polymer may have one constitutional unit having a reactive group alone, or two or more kinds thereof.

In a case where the binder polymer includes the constitutional unit having a reactive group, from the viewpoint of hardness of a cured film to be obtained and pressure-sensitive adhesiveness of an uncured film to be obtained, the content of the constitutional unit having a reactive group is preferably 5% by mass to 70% by mass, more preferably 10% by mass to 50% by mass, and particularly preferably 20% by mass to 40% by mass with respect to the total mass of the binder polymer.

In addition, from the viewpoint of hardness of a cured film to be obtained and pressure-sensitive adhesiveness of an uncured film to be obtained, the content of the constitutional unit having a reactive group in the binder polymer is preferably 5 mol % to 70 mol %, more preferably 10 mol % to 60 mol %, and particularly preferably 20 mol % to 50 mol % with respect to the total amount of the binder polymer.

Examples of a method for introducing the reactive group into the binder polymer include a method of reacting an epoxy compound, a blocked isocyanate compound, an isocyanate compound, a vinyl sulfone compound, an aldehyde compound, a methylol compound, a carboxylic acid anhydride, or the like with a hydroxy group, a carboxy group, a primary amino group, a secondary amino group, an acetoacetyl group, a sulfo group, or the like.

Preferred examples of the method for introducing the reactive group into the binder polymer include a method in which a polymer having a carboxy group is synthesized by a polymerization reaction, and then a glycidyl (meth)acrylate is reacted with a part of the carboxy group of the obtained polymer by a polymer reaction, thereby introducing a (meth)acryloxy group into the polymer. By this method, a binder polymer having a (meth)acryloxy group in the side chain can be obtained.

The above-described polymerization reaction is preferably carried out under a temperature condition of 70° C. to 100° C., and more preferably carried out under a temperature condition of 80° C. to 90° C. As a polymerization initiator used in the above-described polymerization reaction, an azo-based initiator is preferable, and for example, V-601 (product name) or V-65 (product name) manufactured by FUJIFILM Wako Pure Chemical Corporation is more preferable. The above-described polymer reaction is preferably carried out under a temperature condition of 80° C. to 110° C. In the above-described polymer reaction, it is preferable to use a catalyst such as an ammonium salt.

From the viewpoint of development residue inhibitory property, preferred examples of the binder polymer include the following polymers. The content ratios (a to d) and the weight-average molecular weight Mw of each of the constitutional units shown below can be appropriately changed according to the purpose.

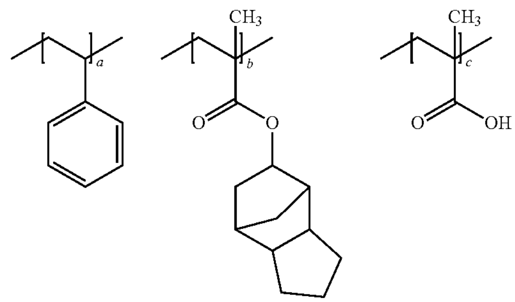

-continued

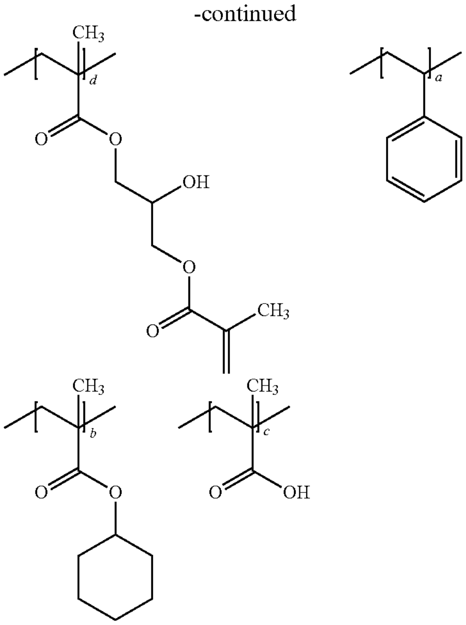

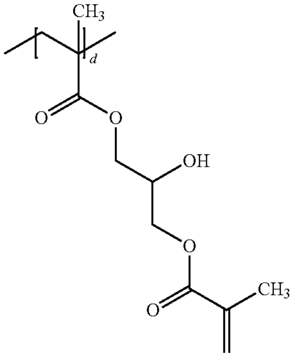

In addition, as the binder polymer, a polymer (hereinafter, also referred to as a "polymer B") including a constitutional unit having a carboxylic acid anhydride structure may be contained. In a case where the photosensitive resin composition contains the polymer B, developability and hardness after curing can be improved.

The carboxylic acid anhydride structure may be either a chain carboxylic acid anhydride structure or a cyclic carboxylic acid anhydride structure, and a cyclic carboxylic acid anhydride structure is preferable.

The ring of the cyclic carboxylic acid anhydride structure is preferably a 5- to 7-membered ring, more preferably a 5-membered ring or a 6-membered ring, and particularly preferably a 5-membered ring.

The constitutional unit having a carboxylic acid anhydride structure is preferably a constitutional unit containing a divalent group obtained by removing two hydrogen atoms from a compound represented by Formula P-1 in a main chain, or a constitutional unit in which a monovalent group obtained by removing one hydrogen atom from a compound represented by Formula P-1 is bonded to the main chain directly or through a divalent linking group.

P-1

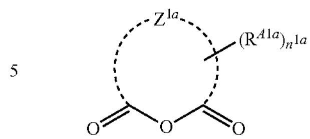

In Formula P-1, $R^{A1a}$ represents a substituent, $n^{1a}$ pieces of $R^{A1a}$'s may be the same or different, $Z^{1a}$ represents a divalent group forming a ring including —C(═O)—O—C(═O)—, and $n^{1a}$ represents an integer of 0 or more.

Examples of the substituent represented by $R^{A1a}$ include an alkyl group.

$Z^{1a}$ is preferably an alkylene group having 2 to 4 carbon atoms, more preferably an alkylene group having 2 or 3 carbon atoms, and particularly preferably an alkylene group having 2 carbon atoms.

$n^{1a}$ represents an integer of 0 or more. In a case where $Z^{1a}$ represents an alkylene group having 2 to 4 carbon atoms, $n^{1a}$ is preferably an integer of 0 to 4, more preferably an integer of 0 to 2, and particularly preferably 0.

In a case where $n^{1a}$ represents an integer of 2 or more, a plurality of $R^{A1a}$'s existing may be the same or different. In addition, the plurality of $R^{A1a}$'s existing may be bonded to each other to form a ring, but it is preferable that they are not bonded to each other to form a ring.

The constitutional unit having a carboxylic acid anhydride structure is preferably a constitutional unit derived from an unsaturated carboxylic acid anhydride, more preferably a constitutional unit derived from an unsaturated cyclic carboxylic acid anhydride, still more preferably a constitutional unit derived from an unsaturated aliphatic carboxylic acid anhydride, particularly preferably a constitutional unit derived from maleic acid anhydride or itaconic acid anhydride, and most preferably a constitutional unit derived from maleic acid anhydride.

Hereinafter, specific examples of the constitutional unit having a carboxylic acid anhydride structure will be described, but the constitutional unit having a carboxylic acid anhydride structure is not limited to these specific examples. In the following constitutional units, Rx represents a hydrogen atom, a methyl group, a $CH_2OH$ group, or a $CF_3$ group, and Me represents a methyl group.

Formula a2-1

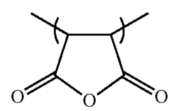

Formula a2-2

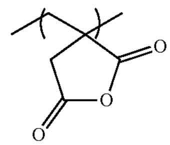

Formula a2-3

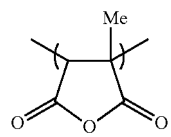

-continued
Formula a2-4
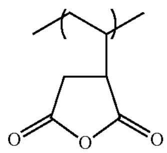
Formula a2-5
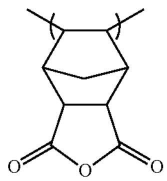
Formula a2-6
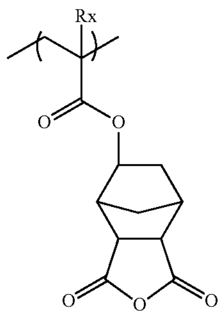
Formula a2-7
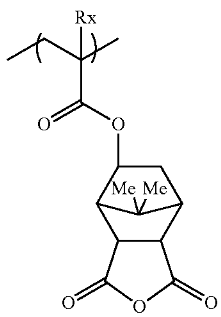
Formula a2-8
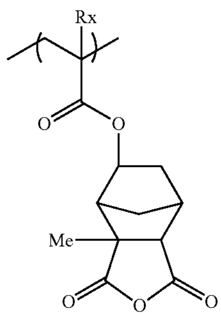
Formula a2-9
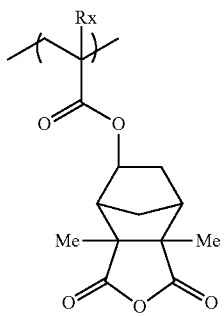
-continued
Formula a2-10
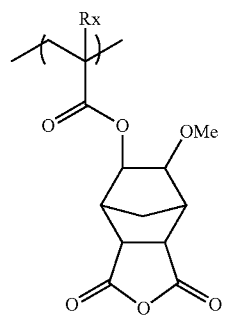
Formula a2-11
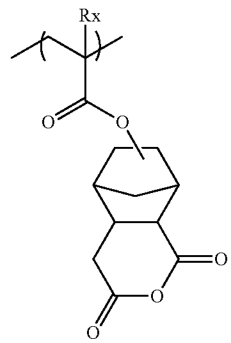
Formula a2-12
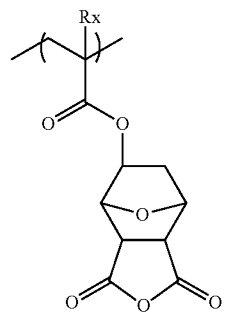
Formula a2-13
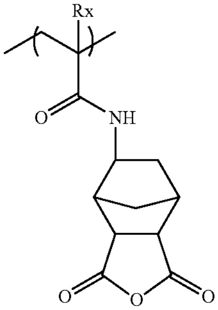
Formula a2-14
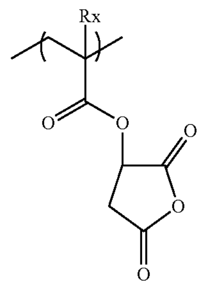

-continued

Formula a2-15

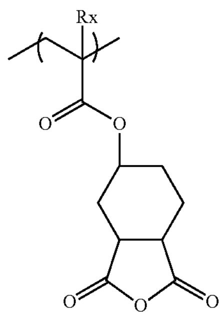

Formula a2-16

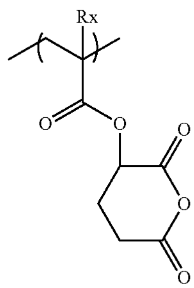

Formula a2-17

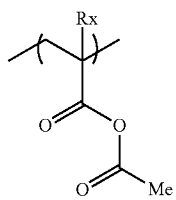

Formula a2-18

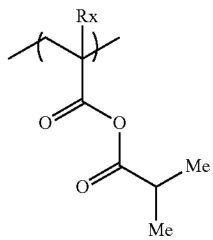

Formula a2-19

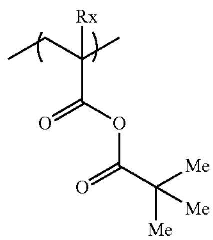

Formula a2-20

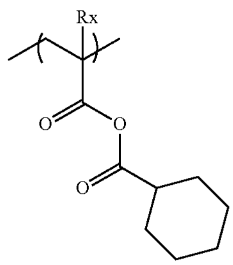

-continued

Formula a2-21

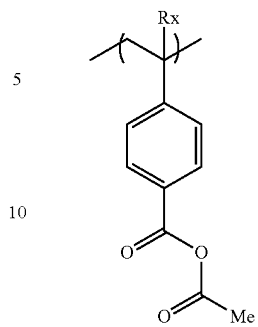

The polymer B may have one constitutional unit having a carboxylic acid anhydride structure alone, or two or more kinds thereof.

The total content of the constitutional unit having a carboxylic acid anhydride structure is preferably 0 mol % to 60 mol %, more preferably 5 mol % to 40 mol %, and particularly preferably 10 mol % to 35 mol % with respect to the total amount of the polymer B.

The photosensitive resin composition according to the embodiment of the present disclosure may include only one kind of the polymer B, or may include two or more kinds thereof.

In a case where the photosensitive resin composition according to the embodiment of the present disclosure contains the polymer B, from the viewpoint of photocuring properties, developability, and hardness of a cured film to be obtained, the content of the polymer B is preferably 0.1% by mass to 30% by mass, more preferably 0.2% by mass to 20% by mass, still more preferably 0.5% by mass to 20% by mass, and particularly preferably 1% by mass to 20% by mass with respect to the total solid content of the photosensitive resin composition.

From the viewpoint of hardness of a cured film to be obtained and pressure-sensitive adhesiveness of an uncured film to be obtained, the weight-average molecular weight (Mw) of the binder polymer is preferably 5,000 or more, more preferably 10,000 or more, still more preferably 10,000 to 50,000, even more preferably 15,000 to 30,000, and particularly preferably 20,000 to 30,000.

The acid value of the binder polymer is preferably 10 mgKOH/g to 200 mgKOH/g, more preferably 60 mgKOH/g to 200 mgKOH/g, still more preferably 60 mgKOH/g to 150 mgKOH/g, and particularly preferably 60 mgKOH/g to 110 mgKOH/g.

The acid value of the binder polymer is a value measured according to the method described in JIS K0070: 1992.

The photosensitive resin composition according to the embodiment of the present disclosure may include only one kind of the binder polymer, or may include two or more kinds thereof.

From the viewpoint of hardness of the cured film and handleability of the transfer film, for example, the content of the binder polymer is preferably 10% by mass to 90% by mass, more preferably 20% by mass to 80% by mass, and still more preferably 30% by mass to 70% by mass with respect to the total solid content of the photosensitive resin composition.

From the viewpoint of patterning properties and reliability, the content of the residual monomer of each constitutional unit in the binder polymer is preferably 5,000 ppm by mass or less, more preferably 2,000 ppm by mass or less, and still more preferably 500 ppm by mass or less with respect to the total mass of the binder polymer having the constitutional units. The lower limit is not particularly limited, but is preferably 1 ppm by mass or more and more preferably 10 ppm by mass or more.

From the viewpoint of patterning properties and reliability, the residual monomer of each constitutional unit in the binder polymer is preferably 3,000 ppm by mass or less, more preferably 600 ppm by mass or less, and still more preferably 100 ppm by mass or less with respect to the photosensitive layer described later. The lower limit is not particularly limited, but is preferably 0.1 ppm by mass or more and more preferably 1 ppm by mass or more.

It is preferable that the amount of residual monomer of the monomer in a case of synthesizing the binder polymer by the polymer reaction is also within the above-described range. For example, in a case where glycidyl acrylate is reacted with a side chain of carboxylic acid to synthesize the binder polymer, the content of glycidyl acrylate is preferably within the above-described range.

<Ethylenically Unsaturated Compound>

The photosensitive resin composition according to the embodiment of the present disclosure contains an ethylenically unsaturated compound.

In the photosensitive resin composition according to the embodiment of the present disclosure, the ethylenically unsaturated compound contributes to photosensitivity (that is, photocuring properties) and hardness of the cured film.

In addition, the ethylenically unsaturated compound in the present disclosure is a compound other than the above-described binder polymer, and preferably has a molecular weight of less than 5,000.

In addition, among these, as the above-described ethylenically unsaturated compound, from the viewpoint of substrate adhesiveness, development residue inhibitory property, and rust preventive property, the photosensitive resin composition according to the embodiment of the present disclosure preferably includes a compound represented by Formula (M) described later and an ethylenically unsaturated compound having an acid group, more preferably includes 1,9-nonanediol diacrylate, tricyclodecane dimethanol diacrylate, and a polyfunctional ethylenically unsaturated compound having a carboxylic acid group, and particularly preferably includes 1,9-nonanediol diacrylate, tricyclodecane dimethanol diacrylate, and a succinic acid-modified form of dipentaerythritol pentaacrylate.

Further, as the above-described ethylenically unsaturated compound, from the viewpoint of hardness of a cured film to be obtained, substrate adhesiveness, development residue inhibitory property, and rust preventive property, the photosensitive resin composition according to the embodiment of the present disclosure preferably includes a compound represented by Formula (M) described later, an ethylenically unsaturated compound having an acid group, and a thermal crosslinking compound described later, and more preferably includes a compound represented by Formula (M) described later, an ethylenically unsaturated compound having an acid group, and a blocked isocyanate compound described later.

From the viewpoint of development residue inhibitory property, rust preventive property, and bending resistance of a cured film to be obtained, the above-described ethylenically unsaturated compound preferably includes a compound (also simply referred to as a "compound M") represented by Formula (M).

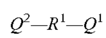

Formula (M)

In Formula (M), $Q^1$ and $Q^2$ each independently represent a (meth)acryloyloxy group, and $1Z^1$ represents a divalent linking group having a chain structure.

From the viewpoint of easiness of synthesis, $Q^1$ and $Q^2$ in Formula (M) preferably have the same group.

In addition, from the viewpoint of reactivity, $Q^1$ and $Q^2$ in Formula (M) are preferably acryloyloxy groups.

From the viewpoint of bending resistance of a cured film to be obtained, $R^1$ in Formula (M) is preferably an alkylene group, an alkyleneoxyalkylene group ($-L^1-O-L^1-$) or a polyalkyleneoxyalkylene group ($-(L^1-O)_p-L^1$), more preferably a hydrocarbon group having 2 to 20 carbon atoms or a polyalkyleneoxyalkylene group, still more preferably an alkylene group having 4 to 20 carbon atoms, and particularly preferably a linear alkylene group having 6 to 18 carbon atoms. It is sufficient that the above-described hydrocarbon group has a chain structure at least in part, and a portion other than the chain structure is not particularly limited. For example, the portion may be a branched chain, a cyclic or a linear alkylene group having 1 to 5 carbon atoms, an arylene group, an ether bond, or a combination thereof, and from the viewpoint of bending resistance of a cured film to be obtained, an alkylene group or a group in which two or more alkylene groups and one or more arylene groups are combined is preferable, an alkylene group is more preferable, and a linear alkylene group is particularly preferable.

The above-described $L^1$'s each independently represent an alkylene group, and an ethylene group, a propylene group, or a butylene group is preferable and an ethylene group or a 1,2-propylene group is more preferable. p represents an integer of 2 or more, and is preferably an integer of 2 to 10.

In addition, from the viewpoint of water vapor permeability and bending resistance of a cured film to be obtained, the number of atoms in the shortest linking chain which links $Q^1$ and $Q^2$ in the compound M is preferably 3 to 50, more preferably 4 to 40, still more preferably 6 to 20, and particularly preferably 8 to 12.

In the present disclosure, the "number of atoms in the shortest linking chain which links $Q^1$ and $Q^2$" is the shortest number of atoms linking from an atom in $R^1$ linked to $Q^1$ to an atom in $R^1$ linked to $Q^2$.

Specific examples of the compound M include 1,3-butanediol di(meth)acrylate, tetramethylene glycol di(meth)acrylate, neopentyl glycol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 1,10-decanediol di(meth)acrylate, 1,4-cyclohexanediol di(meth)acrylate, tricyclodecane dimethanol di(meth)acrylate, hydrogenated bisphenol A di(meth)acrylate, hydrogenated bisphenol F di(meth)acrylate, polyethylene glycol di(meth)acrylate, polypropylene glycol di(meth)acrylate, poly (ethylene glycol/propylene glycol) di(meth)acrylate, and polybutylene glycol di(meth)acrylate. The above-described ester monomers can also be used as a mixture.

Among the above-described compounds, from the viewpoint of bending resistance of a cured film to be obtained, at least one compound selected from the group consisting of 1,6-hexanediol di(meth)acrylate, 1,9-nonanediol di(meth)acrylate, 1,10-decanediol di(meth)acrylate, and neopentyl glycol di(meth)acrylate is preferable, at least one compound selected from the group consisting of 1,6-hexanediol di(meth)acrylate, 1,9-nonanediol di(meth)acrylate, and 1,10-decanediol di(meth)acrylate is more preferable, and at least one compound selected from the group consisting of 1,9-nonanediol di(meth)acrylate and 1,10-decanediol di(meth)acrylate is particularly preferable.

The compound M may be used alone or in combination of two or more thereof.

From the viewpoint of water vapor permeability and bending resistance of a cured film to be obtained, the content of the compound M is preferably 10% by mass to 90% by mass, more preferably 15% by mass to 70% by mass, still more preferably 20% by mass to 50% by mass, and particularly preferably 25% by mass to 35% by mass with respect to the total mass of the ethylenically unsaturated compound in the photosensitive resin composition.

The ethylenically unsaturated compound in the present disclosure refers to a compound having a (weight-average) molecular weight of 10,000 or less and having an ethylenically unsaturated group.

In addition, from the viewpoint of water vapor permeability and bending resistance of a cured film to be obtained, the content of the compound M is preferably 1% by mass to 30% by mass, more preferably 3% by mass to 25% by mass, still more preferably 5% by mass to 20% by mass, and particularly preferably 6% by mass to 14.5% by mass with respect to the total solid content in the photosensitive resin composition.

The total solid content in the photosensitive resin composition in the present disclosure refers to an amount excluding volatile components such as a solvent.

In addition, the ethylenically unsaturated compound preferably includes a bi- or higher functional ethylenically unsaturated compound.

In the present disclosure, the "bi- or higher functional ethylenically unsaturated compound" means a compound having two or more ethylenically unsaturated groups in one molecule.

As the ethylenically unsaturated group in the ethylenically unsaturated compound, a (meth)acryloyl group is preferable.

As the ethylenically unsaturated compound, a (meth) acrylate compound is preferable.

From the viewpoint of hardness of the cured film after curing, for example, the ethylenically unsaturated compound particularly preferably includes a bifunctional ethylenically unsaturated compound (preferably, a bifunctional (meth)acrylate compound) and a tri- or higher functional ethylenically unsaturated compound (preferably, a tri- or higher functional (meth)acrylate compound).

The bifunctional ethylenically unsaturated compound is not particularly limited and can be appropriately selected from a known compound.

Examples of the bifunctional ethylenically unsaturated compound other than the above-described compound M include tricyclodecane dimethanol di(meth)acrylate and tricyclodecane dimethanol di(meth)acrylate.

Examples of a commercially available product of the bifunctional ethylenically unsaturated compound include tricyclodecane dimethanol diacrylate (product name: NK ESTER A-DCP, manufactured by Shin-Nakamura Chemical Co., Ltd.), tricyclodecane dimethanol dimethacrylate (product name: NK ESTER DCP, manufactured by Shin-Nakamura Chemical Co., Ltd.), 1,9-nonanediol diacrylate (product name: NK ESTER A-NOD-N, manufactured by Shin-Nakamura Chemical Co., Ltd.), and 1,6-hexanediol diacrylate (product name: NK ESTER A-HD-N, manufactured by Shin-Nakamura Chemical Co., Ltd.).

The tri- or higher functional ethylenically unsaturated compound is not particularly limited and can be appropriately selected from a known compound.

Examples of the tri- or higher functional ethylenically unsaturated compound include dipentaerythritol (tri/tetra/penta/hexa) (meth)acrylate, pentaerythritol (tri/tetra) (meth) acrylate, trimethylolpropane tri(meth)acrylate, ditrimethylolpropane tetra(meth)acrylate, isocyanuric acid (meth) acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth) acrylate and tetra(meth)acrylate.

Examples of the ethylenically unsaturated compound also include a caprolactone-modified compound of a (meth) acrylate compound (KAYARAD (registered trademark) DPCA-20 manufactured by Nippon Kayaku Co., Ltd., A-9300-1CL manufactured by Shin-Nakamura Chemical Co., Ltd., or the like), an alkylene oxide-modified compound of a (meth)acrylate compound (KAYARAD (registered trademark) RP-1040 manufactured by Nippon Kayaku Co., Ltd., ATM-35E or A-9300 manufactured by Shin-Nakamura Chemical Co., Ltd., EBECRYL (registered trademark) 135 manufactured by Daicel-Allnex Ltd., or the like), and ethoxylated glycerin triacrylate (NK ESTER A-GLY-9E manufactured by Shin-Nakamura Chemical Co., Ltd., or the like).

Examples of the ethylenically unsaturated compound also include a urethane (meth)acrylate compound [preferably, a tri- or higher functional urethane (meth)acrylate compound]. Examples thereof include propylene oxide-modified urethane di(meth)acrylate and ethylene oxide and propylene oxide-modified urethane di(meth)acrylate.

In the tri- or higher functional urethane (meth)acrylate compound, the number of functional groups is more preferably 6 or more and still more preferably 8 or more. For example, the upper limit of the number of functional groups may be 20 or less. Examples of a commercially available product thereof include 8UX-015A (manufactured by Taisei Fine Chemical Co., Ltd.), NK ESTER UA-32P (manufactured by Shin-Nakamura Chemical Co., Ltd.), U-15HA (manufactured by Shin-Nakamura Chemical Co., Ltd.), NK ESTER UA-1100H (manufactured by Shin-Nakamura Chemical Co., Ltd.), UA-306H, UA-306T, UA-306I, UA-510H, and UX-5000 (all manufactured by Nippon Kayaku Co., Ltd.).

From the viewpoint of developability and development residue inhibitory property, the ethylenically unsaturated compound preferably includes an ethylenically unsaturated compound having an acid group.

Examples of the acid group include a phosphoric acid group, a sulfo group, and a carboxy group.

Among these, as the acid group, a carboxy group is preferable.

Examples of the ethylenically unsaturated compound having an acid group include a tri- or tetra-functional ethylenically unsaturated compound having an acid group [component obtained by introducing a carboxy group to pentaerythritol tri- and tetra-acrylate (PETA) skeleton (acid value: 80 mgKOH/g to 120 mgKOH/g)), and a penta- or hexa-functional ethylenically unsaturated compound having an acid group [component obtained by introducing a carboxy group to dipentaerythritol penta- and hexa-acrylate (DPHA) skeleton (acid value: 25 mgKOH/g to 70 mgKOH/g)].

The tri- or higher functional ethylenically unsaturated compound having an acid group may be used in combination with the bifunctional ethylenically unsaturated compound having an acid group, as necessary.

As the ethylenically unsaturated compound having an acid group, at least one selected from the group consisting of bi- or higher functional ethylenically unsaturated compound having a carboxy group and a carboxylic acid anhydride thereof is preferable.

In a case where the ethylenically unsaturated compound having an acid group is at least one selected from the group consisting of bi- or higher functional ethylenically unsaturated compound having a carboxy group and a carboxylic acid anhydride thereof, developability and film hardness are further enhanced.

The bi- or higher functional ethylenically unsaturated compound having a carboxy group is not particularly limited and can be appropriately selected from a known compound.

As the bi- or higher functional ethylenically unsaturated compound having a carboxy group, ARONIX (registered trademark) TO-2349 (manufactured by Toagosei Co., Ltd.), ARONIX (registered trademark) M-520 (manufactured by Toagosei Co., Ltd.), ARONIX (registered trademark) M-510 (manufactured by Toagosei Co., Ltd.), or the like can be preferably used.

As the ethylenically unsaturated compound having an acid group, polymerizable compounds having an acid group, which are described in paragraphs 0025 to 0030 of JP2004-239942A, can be preferably used, and the contents described in this publication are incorporated in the present disclosure.

The photosensitive resin composition according to the embodiment of the present disclosure may contain one ethylenically unsaturated compound having an acid group alone, or two or more kinds thereof.

From the viewpoint of developability, and pressure-sensitive adhesiveness of an uncured film to be obtained, the content of the ethylenically unsaturated compound having an acid group is preferably 0.1% by mass to 30% by mass, more preferably 0.5% by mass to 20% by mass, still more preferably 1% by mass to 10% by mass, and particularly preferably 1% by mass to 5% by mass with respect to the total solid content of the photosensitive resin composition.

In addition, from the viewpoint of water vapor permeability and bending resistance of a cured film to be obtained, and pressure-sensitive adhesiveness of an uncured film to be obtained, the ethylenically unsaturated compound preferably includes a bifunctional ethylenically unsaturated compound having an aliphatic hydrocarbon ring structure, more preferably include a bifunctional ethylenically unsaturated compound having a ring structure in which two or more aliphatic hydrocarbon rings are fused, and particularly preferably include tricyclodecane dimethanol di(meth)acrylate.

From the viewpoint of water vapor permeability and bending resistance of a cured film to be obtained, and pressure-sensitive adhesiveness of an uncured film to be obtained, the above-described aliphatic hydrocarbon ring structure is preferably a cyclopentane ring structure, a cyclohexane ring structure, a tricyclodecane ring structure, a norbornane ring structure, or an isophorone ring structure, more preferably a cyclohexane ring structure or a tricyclodecane ring structure, and particularly preferably a tricyclodecane ring structure.

In addition, from the viewpoint of water vapor permeability and bending resistance of a cured film to be obtained, and pressure-sensitive adhesiveness of an uncured film to be obtained, the photosensitive resin composition according to the embodiment of the present disclosure preferably includes the bifunctional ethylenically unsaturated compound having an aliphatic hydrocarbon ring structure and the binder polymer having the constitutional unit having an aliphatic hydrocarbon ring.

The photosensitive resin composition according to the embodiment of the present disclosure may contain one bifunctional ethylenically unsaturated compound having an aliphatic hydrocarbon ring structure alone, or two or more kinds thereof.

From the viewpoint of water vapor permeability and bending resistance of a cured film to be obtained, and pressure-sensitive adhesiveness of an uncured film to be obtained, the content of the bifunctional ethylenically unsaturated compound having an aliphatic hydrocarbon ring structure is preferably 1% by mass to 50% by mass, more preferably 5% by mass to 40% by mass, still more preferably 10% by mass to 30% by mass, and particularly preferably 15% by mass to 25% by mass with respect to the total solid content of the photosensitive resin composition.

As the above-described ethylenically unsaturated compound, from the viewpoint of rust preventive property, it is preferable to include the compound M and the bifunctional ethylenically unsaturated compound having an aliphatic hydrocarbon ring structure.

In addition, as the above-described ethylenically unsaturated compound, from the viewpoint of substrate adhesiveness, development residue inhibitory property, and rust preventive property, it is preferable to include the compound M and the ethylenically unsaturated compound having an acid group, it is more preferable to include the compound M, the bifunctional ethylenically unsaturated compound having an aliphatic hydrocarbon ring structure, and the ethylenically unsaturated compound having an acid group, it is still more preferable to include the compound M, the bifunctional ethylenically unsaturated compound having an aliphatic hydrocarbon ring structure, the tri- or higher functional ethylenically unsaturated compound, and the ethylenically unsaturated compound having an acid group, and it is particularly preferable to include the compound M, the bifunctional ethylenically unsaturated compound having an aliphatic hydrocarbon ring structure, the tri- or higher functional ethylenically unsaturated compound, the ethylenically unsaturated compound having an acid group, and the urethane (meth)acrylate compound.

Further, as the above-described ethylenically unsaturated compound, from the viewpoint of substrate adhesiveness, development residue inhibitory property, and rust preventive property, it is preferable to include 1,9-nonanediol diacrylate and the polyfunctional ethylenically unsaturated compound having a carboxylic acid group, it is more preferable to include 1,9-nonanediol diacrylate, tricyclodecane dimethanol diacrylate, and the polyfunctional ethylenically unsaturated compound having a carboxylic acid group, it is still more preferable to include 1,9-nonanediol diacrylate, tricyclodecane dimethanol diacrylate, dipentaerythritol hexaacrylate, and an ethylenically unsaturated compound having a carboxylic acid group, and it is particularly preferable to include 1,9-nonanediol diacrylate, tricyclodecane dimethanol diacrylate, an ethylenically unsaturated compound having a carboxylic acid group, and a urethane acrylate compound.

The photosensitive resin composition according to the embodiment of the present disclosure may include a monofunctional ethylenically unsaturated compound as the ethylenically unsaturated compound.

The content of the bi- or higher functional ethylenically unsaturated compound in the above-described ethylenically unsaturated compound is preferably 60% by mass to 100% by mass, more preferably 80% by mass to 100% by mass, and particularly preferably 90% by mass to 100% by mass with respect to the total content of all ethylenically unsaturated compounds included in the photosensitive resin composition.

The molecular weight of the ethylenically unsaturated compound is preferably 200 to 3,000, more preferably 250 to 2,600, still more preferably 280 to 2,200, and particularly preferably 300 to 2,200.

The proportion of the content of the ethylenically unsaturated compound having a molecular weight of 300 or less in the ethylenically unsaturated compounds included in the photosensitive resin composition according to the embodiment of the present disclosure is preferably 30% by mass or less, more preferably 25% by mass or less, and still more preferably 20% by mass or less with respect to the content of all ethylenically unsaturated compounds included in the photosensitive resin composition.

The photosensitive resin composition according to the embodiment of the present disclosure may include only one kind of the ethylenically unsaturated compound, or may include two or more kinds thereof.

The content of the ethylenically unsaturated compound in the photosensitive resin composition according to the embodiment of the present disclosure is preferably 1% by mass to 70% by mass, more preferably 10% by mass to 70% by mass, still more preferably 20% by mass to 60% by mass, and particularly preferably 20% by mass to 50% by mass with respect to the total solid content of the photosensitive resin composition.

<Photopolymerization Initiator>

The photosensitive resin composition according to the embodiment of the present disclosure contains a photopolymerization initiator.

The photopolymerization initiator is not particularly limited and a known photopolymerization initiator can be used.

Examples of the photopolymerization initiator include a photopolymerization initiator having an oxime ester structure (hereinafter, also referred to as an "oxime-based photopolymerization initiator"), a photopolymerization initiator having an α-aminoalkylphenone structure (hereinafter, also referred to as an "α-aminoalkylphenone-based photopolymerization initiator"), a photopolymerization initiator having an α-hydroxyalkylphenone structure (hereinafter also referred to as an "α-hydroxyalkylphenone-based photopolymerization initiator"), a photopolymerization initiator having an acylphosphine oxide structure, (hereinafter, also referred to as an "acylphosphine oxide-based photopolymerization initiator"), and a photopolymerization initiator having an N-phenylglycine structure (hereinafter, also referred to as an N-phenylglycine-based photopolymerization initiator").

The photopolymerization initiator preferably includes at least one kind selected from the group consisting of the oxime-based photopolymerization initiator, the α-aminoalkylphenone-based photopolymerization initiator, the α-hydroxyalkylphenone-based photopolymerization initiator, and the N-phenylglycine-based photopolymerization initiator, and more preferably includes at least one kind selected from the group consisting of the oxime-based photopolymerization initiator, the α-aminoalkylphenone-based photopolymerization initiator, and the N-phenylglycine-based photopolymerization initiator.

In addition, from the viewpoint of substrate adhesiveness, development residue inhibitory property, and rust preventive property, it is preferable to use two or more photopolymerization initiators in combination, it is more preferable to include the oxime-based photopolymerization initiator and the α-aminoalkylphenone-based photopolymerization initiator, and it is particularly preferable to include 1-[9-ethyl-6-(2-methylbenzoyl)-9H-carbazol-3-yl]ethanone-1-(O-acetyloxime) and 2-methyl-1-(4-methylthiophenyl)-2-morpholinopropan-1-one.

In addition, as the photopolymerization initiator, for example, polymerization initiators disclosed in paragraphs 0031 to 0042 of JP2011-95716A and paragraphs 0064 to 0081 of JP2015-014783A may be used.

Examples of a commercially available product of the photopolymerization initiator include 1-[4-(phenylthio)phenyl]-1,2-octanedione-2-(O-benzoyloxime) [product name: IRGACURE (registered trademark) OXE-01, manufactured by BASF SE], 1-[9-ethyl-6-(2-methylbenzoyl)-9H-carbazol-3-yl]ethanone-1-(O-acetyloxime) [product name: IRGACURE (registered trademark) OXE-02, manufactured by BASF SE], [8-[5-(2,4,6-trimethylphenyl)-11-(2-ethylhexyl)-11H-benzo[a]carbazoyl][2-(2,2,3,3-tetrafluoro propoxy)phenyl]methanone-(O-acetyloxime) [product name: IRGACURE (registered trademark) OXE-03, manufactured by BASF SE], 1-[4-[4-(2-benzofuranylcarbonyl)phenyl]thio]phenyl]-4-methylpentanone-1-(O-acetyloxime) [product name: IRGACURE (registered trademark) OXE-04, manufactured by BASF SE], 2-(dimethylamino)-2-[(4-methylphenyOmethyl]-1-[4-(4-morpholinyl)phenyl]-1-butanone [product name: IRGACURE (registered trademark) 379EG, manufactured by BASF SE], 2-methyl-1-(4-methylthiophenyl)-2-morpholinopropan-1-one [product name: IRGACURE (registered trademark) 907, manufactured by BASF SE], 2-hydroxy-1-{4-[4-(2-hydroxy-2-methylpropionyl)benzyl]phenyl}-2-methylpropan-1-one [product name: IRGACURE (registered trademark) 127, manufactured by BASF SE], 2-benzyl-2-dimethylamino-1-(4-morpholinophenyl)butanone-1 [product name: IRGACURE (registered trademark) 369, manufactured by BASF SE], 2-hydroxy-2-methyl-1-phenylpropan-1-one [product name: IRGACURE (registered trademark) 1173, manufactured by BASF SE], 1-hydroxy cyclohexyl phenyl ketone [product name: IRGACURE (registered trademark) 184, manufactured by BASF SE], 2,2-dimethoxy-1,2-diphenylethan-1-one (product name: IRGACURE (registered trademark) 651, manufactured by BASF SE], an oxime ester-based product [product name: Lunar (registered trademark) 6, manufactured by DKSH Management Ltd.], 1-[4-(phenylthio)phenyl]-3-cyclopentylpropan-1,2-dione-2-(O-benzoyloxime) (product name: TR-PBG-305, manufactured by TRONLY), 1,2-propanedione, 3-cyclohexyl-1-[9-ethyl-6-(2-furanylcarbonyl)-9H-carbazole-3-yl]-, 2-(O-acetyloxime) (product name: TR-PBG-326, manufactured by TRONLY), and 3-cyclohexyl-1-(6-(2-(benzoyloxyimino)hexanoyl)-9-ethyl-9H-carbazole-3-yl)-propan-1,2-dione-2-(O-benzoyloxime) (product name: TR-PBG-391, manufactured by TRONLY).

The photosensitive resin composition according to the embodiment of the present disclosure may include only one kind of the photopolymerization initiator, or may include two or more kinds thereof.

The content of the photopolymerization initiator in the photosensitive resin composition according to the embodiment of the present disclosure is not particularly limited, but is preferably 0.1% by mass or more, more preferably 0.5% by mass or more, and still more preferably 1.0% by mass or more with respect to the total solid content of the photosensitive resin composition.

In addition, the content of the photopolymerization initiator in the photosensitive resin composition according to the embodiment of the present disclosure is preferably 10% by mass or less and more preferably 5% by mass or less with respect to the total solid content of the photosensitive resin composition.

<Thermal Crosslinking Compound>

From the viewpoint of hardness of a cured film to be obtained and pressure-sensitive adhesiveness of an uncured film to be obtained, it is preferable that the photosensitive resin composition according to the embodiment of the present disclosure contains a thermal crosslinking compound. In the present disclosure, a thermal crosslinking compound having an ethylenically unsaturated group, which will be described later, is not treated as the ethylenically unsaturated compound, but is treated as the thermal crosslinking compound.

Examples of the thermal crosslinking compound include an epoxy compound, an oxetane compound, a methylol compound, and a blocked isocyanate compound. Among these, from the viewpoint of hardness of a cured film to be obtained and pressure-sensitive adhesiveness of an uncured film to be obtained, a blocked isocyanate compound is preferable.

Since the blocked isocyanate compound reacts with a hydroxy group and a carboxy group, for example, in a case where at least one of the binder polymer or the radically polymerizable compound having an ethylenically unsaturated group has at least one of a hydroxy group or a carboxy group, hydrophilicity of the formed film tends to decrease, and the function as a protective film tends to be strengthened.

The blocked isocyanate compound refers to a "compound having a structure in which the isocyanate group of isocyanate is protected (so-called masked) with a blocking agent".

The dissociation temperature of the blocked isocyanate compound is not particularly limited, but is preferably 100° C. to 160° C. and more preferably 130° C. to 150° C.

The dissociation temperature of blocked isocyanate in the present disclosure means "temperature at an endothermic peak accompanied with a deprotection reaction of blocked isocyanate, in a case where the measurement is performed by differential scanning calorimetry (DSC) analysis using a differential scanning calorimeter".

As the differential scanning calorimeter, for example, a differential scanning calorimeter (model: DSC6200) manufactured by Seiko Instruments Inc. can be suitably used. However, the differential scanning calorimeter is not limited thereto.

Examples of the blocking agent having a dissociation temperature of 100° C. to 160° C. include an active methylene compound [diester malonates (such as dimethyl malonate, diethyl malonate, di-n-butyl malonate, and di-2-ethylhexyl malonate)], and an oxime compound (compound having a structure represented by —C(═N—OH)— in a molecule, such as formaldoxime, acetoaldoxime, acetoxime, methyl ethyl ketoxime, and cyclohexanoneoxime).

Among these, from the viewpoint of storage stability, the blocking agent having a dissociation temperature of 100° C. to 160° C. is preferably, for example, at least one selected from oxime compounds.

From the viewpoint of improving brittleness of the film and improving the adhesion to a transferred material, for example, the blocked isocyanate compound preferably has an isocyanurate structure.

The blocked isocyanate compound having an isocyanurate structure can be obtained, for example, by isocyanurate-forming and protecting hexamethylene diisocyanate.

Among the blocked isocyanate compounds having an isocyanurate structure, a compound having an oxime structure using an oxime compound as a blocking agent is preferable from the viewpoint that the dissociation temperature can be easily set in a preferred range and the development residue can be easily reduced, as compared with a compound having no oxime structure.

The blocked isocyanate compound may have a polymerizable group.

The polymerizable group is not particularly limited, and a known polymerizable group can be used. Preferred examples thereof include a radically polymerizable group.

Examples of the polymerizable group include a (meth)acryloxy group, a (meth)acrylamide group, an ethylenically unsaturated group such as styryl group, and an epoxy group such as a glycidyl group.

Among these, as the polymerizable group, from the viewpoint of surface shape of the surface of the cured film to be obtained, a development speed, and reactivity, an ethylenically unsaturated group is preferable, a (meth)acryloxy group is more preferable, and an acryloxy group is particularly preferable.

As the blocked isocyanate compound, a commercially available product can be used.

Examples of the commercially available product of the blocked isocyanate compound include Karenz (registered trademark) AOI-BM, Karenz (registered trademark) MOI-BM, Karenz (registered trademark) MOI-BP, and the like (all of which are manufactured by SHOWA DENKO K.K.), and block-type DURANATE series (for example, DURANATE (registered trademark) TPA-B80E, DURANATE (registered trademark) WT32-B75P, and the like manufactured by Asahi Kasei Corporation).

The photosensitive resin composition according to the embodiment of the present disclosure may include only one kind of the thermal crosslinking compound, or may include two or more kinds thereof.

In a case where the photosensitive resin composition according to the embodiment of the present disclosure includes the thermal crosslinking compound, the content of the thermal crosslinking compound is preferably 1% by mass to 50% by mass and more preferably 5% by mass to 30% by mass with respect to the total solid content of the photosensitive resin composition.

<Aliphatic Thiol Compound>

The photosensitive resin composition according to the embodiment of the present disclosure preferably includes an aliphatic thiol compound other than the above-described compound A.

In a case where the photosensitive resin composition according to the embodiment of the present disclosure includes an aliphatic thiol compound, the ene-thiol reaction of the aliphatic thiol compound suppresses a curing contraction of the formed film and relieves stress. Therefore, adhesiveness of the formed cured film to the substrate (particularly, adhesiveness after exposure) tends to be improved.

In general, in a case where a photosensitive resin composition includes an aliphatic thiol compound, the metal (particularly, copper) is more easily corroded. On the other hand, the photosensitive resin composition according to the embodiment of the present disclosure has an advantage that a cured film having excellent corrosion inhibitory property of the metal (particularly, copper) can be formed even in a case where the photosensitive resin composition according to the embodiment of the present disclosure includes an aliphatic thiol compound.

As the aliphatic thiol compound, a monofunctional aliphatic thiol compound or a polyfunctional aliphatic thiol compound (that is, bi- or higher functional aliphatic thiol compound) is suitably used.

Among these, for example, from the viewpoint of adhesiveness of the formed cured film to the substrate (particularly, adhesiveness after exposure), the aliphatic thiol compound preferably includes a polyfunctional aliphatic thiol compound, and is more preferably a polyfunctional aliphatic thiol compound.

In the present disclosure, the "polyfunctional aliphatic thiol compound" refers to an aliphatic compound having two or more thiol groups (also referred to as "mercapto groups") in a molecule.

The polyfunctional aliphatic thiol compound is preferably a low-molecular-weight compound having a molecular weight of 100 or more. Specifically, the molecular weight of the polyfunctional aliphatic thiol compound is more preferably 100 to 1,500 and still more preferably 150 to 1,000.

From the viewpoint of adhesiveness of the formed cured film to the substrate, for example, the number of functional groups of the polyfunctional aliphatic thiol compound is preferably 2 to 10, more preferably 2 to 8, and still more preferably 2 to 6.

Examples of the polyfunctional aliphatic thiol compound include trimethylolpropane tris(3-merc aptobutyrate), 1,4-bis(3-merc aptobutyryloxy)butane, pentaerythritol tetrakis (3-mercaptobutyrate), trimethylolethane tris(3-mercaptobutyrate), trimethylolpropane tris(3-mercaptopropionate), pentaerythritol tetrakis(3-mercaptopropionate), tetraethylene glycol bis(3-mercaptopropionate), dipentaerythritol hexakis(3-mercaptopropionate), ethylene glycol bisthiopropionate, 1,2-ethanedithiol, 1,3-propanedithiol, 1,6-hexamethylenedithiol, 2,2'-(ethylenedithio)diethanethiol, meso-2,3-dimercaptosuccinic acid, and di(mercaptoethyl) ether.

Among these, the polyfunctional aliphatic thiol compound is preferably at least one selected from the group consisting of trimethylolpropane tris(3-mercaptobutyrate) and 1,4-bis(3-mercaptobutylyloxy)butane.

Examples of the monofunctional aliphatic thiol compound include 1-octanethiol, 1-dodecanethiol, β-mercaptopropionic acid, methyl-3-mercaptopropionate, 2-ethylhexyl-β-mercaptopropionate, n-octyl-3-mercaptopropionate, methoxybutyl-3-mercaptopropionate, and stearyl-3-mercaptopropionate.

The photosensitive resin composition according to the embodiment of the present disclosure may include only one kind of the aliphatic thiol compound, or may include two or more kinds thereof.

In a case where the photosensitive resin composition according to the embodiment of the present disclosure includes the aliphatic thiol compound, the content of the aliphatic thiol compound is preferably 5% by mass or more, more preferably 5% by mass to 50% by mass, still more preferably 5% by mass to 30% by mass, and particularly preferably 8% by mass to 20% by mass with respect to the total solid content of the photosensitive resin composition.

In a case where the content of the aliphatic thiol compound is 5% by mass or more with respect to the total solid content of the photosensitive resin composition, a cured film having more excellent adhesiveness (particularly, adhesiveness after exposure) to the substrate (particularly, a copper substrate) tends to be formed.

<Surfactant>

The photosensitive resin composition according to the embodiment of the present disclosure may include a surfactant.

The surfactant is not particularly limited, and a known surfactant can be used.

Examples of the surfactant include surfactants described in paragraph 0017 of JP4502784B and paragraphs 0060 to 0071 of JP2009-237362A.

As the surfactant, a fluorine-based surfactant or a silicon-based surfactant (also referred to as a "silicone-based surfactant") is preferable.

Examples of a commercially available product of the fluorine-based surfactant include: MEGAFACE F-171, F-172, F-173, F-176, F-177, F-141, F-142, F-143, F-144, F-437, F-475, F-477, F-479, F-482, F-551-A, F-552, F-554, F-555-A, F-556, F-557, F-558, F-559, F-560, F-561, F-565, F-563, F-568, F-575, F-780, EXP, MFS-330, R-41, R-41-LM, R-01, R-40, R-40-LM, RS-43, TF-1956, RS-90, R-94, RS-72-K, and DS-21 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); POLYFOX PF636, PF656, PF6320, PF6520, and PF7002 (all of which are manufactured by OMNOVA Solutions Inc.); and FTERGENT 710FM, 610FM, 601AD, 601ADH2, 602A, 215M, and 245F (manufactured by NEOS COMPANY LIMITED).

In addition, as the fluorine-based surfactant, an acrylic compound, which has a molecular structure having a functional group containing a fluorine atom and in which, by applying heat to the molecular structure, the functional group containing a fluorine atom is broken to volatilize a fluorine atom, can also be suitably used. Examples of such a fluorine-based surfactant include MEGAFACE DS series manufactured by DIC Corporation (The Chemical Daily (Feb. 22, 2016) and Nikkei Business Daily (Feb. 23, 2016)), for example, MEGAFACE DS-21.

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant.

A block polymer can also be used as the fluorine-based surfactant. As the fluorine-based surfactant, a fluorine-containing polymer compound can be preferably used, the fluorine-containing polymer compound including: a repeating unit derived from a (meth)acrylate compound having a fluorine atom; and a repeating unit derived from a (meth) acrylate compound having 2 or more (preferably 5 or more) alkyleneoxy groups (preferably an ethyleneoxy group and a propyleneoxy group).

As the fluorine-based surfactant, a fluorine-containing polymer having an ethylenically unsaturated bond-containing group in the side chain can be used. Examples thereof include MEGAFACE RS-101, RS-102, RS-718K, and RS-72-K (all of which are manufactured by DIC Corporation.

Examples of the nonionic surfactant include glycerol, trimethylolpropane, trimethylolethane, an ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid esters, PLURONIC L10, L31, L61, L62, 10R5, 17R2, and 25R2 (all of which are manufactured by BASF SE), TETRONIC 304, 701, 704, 901, 904, and 150R1 (all of which are manufactured by BASF SE), SOLSPERSE 20000 (manufactured by Lubrizol Corporation), NCW-101, NCW-1001, and NCW-1002 (all of which are manufactured by FUJIFILM Wako Pure Chemical Corporation), PIONIN D-6112, D-6112-W, and D-6315 (all of which are manufactured by Takemoto Oil&Fat Co., Ltd.), and OLFINE E1010 and SURFYNOL 104, 400, and 440 (all of which are manufactured by Nissin Chemical Co., Ltd.).

Examples of a commercially available product of the silicon-based surfactant include a linear polymer consisting of a siloxane bond and a modified siloxane polymer with an organic group introduced in the side chain or the terminal.

Specific examples of the surfactant include DOWSIL 8032 ADDITIVE, TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH3OPA, and TORAY SILICONE SH8400 (all of which are manufactured by Dow Corning Toray Co., Ltd.), X-22-4952, X-22-4272, X-22-6266, KF-351A, K354L, KF-355A, KF-945, KF-640, KF-642, KF-643, X-22-6191, X-22-4515, KF-6004, KP-341, KF-6001, and KF-6002 (all of which are manufactured by Shin-Etsu Silicone Co., Ltd.), F-4440, TSF-4300, TSF-4445, TSF-4460, and TSF-4452 (all of which are manufactured by Momentive Performance Materials Co., Ltd.), and BYK307, BYK323, and BYK330 (all of which are manufactured by BYK Chemie).

The photosensitive resin composition according to the embodiment of the present disclosure may include only one kind of the surfactant, or may include two or more kinds thereof.

In a case where the photosensitive resin composition according to the embodiment of the present disclosure includes the surfactant, the content of the surfactant is preferably 0.01% by mass to 3.0% by mass, more preferably 0.05% by mass to 1% by mass, and still more preferably 0.1% by mass to 0.8% by mass with respect to the total solid content of the photosensitive resin composition.

<Hydrogen Donating Compound>

It is preferable that the photosensitive resin composition according to the embodiment of the present disclosure includes a hydrogen donating compound.

In the photosensitive resin composition according to the embodiment of the present disclosure, the hydrogen donating compound has a function of further improving sensitivity of the photopolymerization initiator to actinic ray, or suppressing inhibition of polymerization of the polymerizable compound by oxygen.

Examples of such a hydrogen donating compound include amines, for example, compounds described in M. R. Sander et al., "Journal of Polymer Society," Vol. 10, page 3173 (1972), JP1969-20189B (JP-544-20189B), JP1976-82102A (JP-551-82102A), JP1977-134692A (JP-552-134692A), JP1984-138205A (JP-559-138205A), JP1985-84305A (JP-560-84305A), JP1987-18537A (JP-562-18537A), JP1989-33104A (JP-564-33104A), and Research Disclosure 33825.

Specific examples of the hydrogen donating compound include triethanolamine, p-dimethylaminobenzoic acid ethyl ester, p-formyldimethylaniline, and p-methylthiodimethylaniline.

In addition, examples of the hydrogen donating compound also include an amino acid compound (N-phenylglycine and the like), an organic metal compound described in JP1973-42965B (JP-548-42965B) (tributyl tin acetate and the like), a hydrogen donor described in JP1980-34414B (JP-555-34414B), and a sulfur compound described in JP1994-308727A (JP-H06-308727A) (trithiane and the like).

The photosensitive resin composition according to the embodiment of the present disclosure may include only one kind of the hydrogen donating compound, or may include two or more kinds thereof.

In a case where the photosensitive resin composition according to the embodiment of the present disclosure includes the hydrogen donating compound, for example, from the viewpoint of improving a curing rate by balancing the polymerization growth rate and chain transfer, the content of the hydrogen donating compound is preferably 0.01% by mass to 10% by mass, more preferably 0.03% by mass to 5% by mass, and still more preferably 0.05% by mass to 3% by mass with respect to the total solid content of the photosensitive resin composition.

<Solvent>

It is preferable that the photosensitive resin composition according to the embodiment of the present disclosure includes a solvent.

In a case where the photosensitive resin composition according to the embodiment of the present disclosure includes a solvent, the formation of the photosensitive layer by coating tends to be easier.

As the solvent, a generally used solvent can be used without particular limitation.

The solvent is preferably an organic solvent.

Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol.

As the solvent, a mixed solvent of methyl ethyl ketone and propylene glycol monomethyl ether acetate or a mixed solvent of diethylene glycol ethyl methyl ether and propylene glycol monomethyl ether acetate is preferably used.

As the solvent, a solvent described in paragraphs 0054 and 0055 of US2005/282073A can also be used, and the contents of this specification are incorporated in the present disclosure.

In addition, as the solvent, an organic solvent (high-boiling-point solvent) having a boiling point of 180° C. to 250° C. can also be used, as necessary.

In a case where the photosensitive resin composition according to the embodiment of the present disclosure includes a solvent, the photosensitive resin composition according to the embodiment of the present disclosure may include only one kind of the solvent, or may include two or more kinds thereof.

In a case where the photosensitive resin composition according to the embodiment of the present disclosure includes the solvent, the solid content of the photosensitive resin composition according to the embodiment of the present disclosure is preferably 5% by mass to 80% by mass, more preferably 5% by mass to 40% by mass, and particularly preferably 5% by mass to 30% by mass with respect to the total mass of the photosensitive resin composition.

In a case where the photosensitive resin composition according to the embodiment of the present disclosure includes the solvent, for example, from the viewpoint of coatability, the viscosity of the photosensitive resin composition at 25° C. is preferably 1 mPa·s to 50 mPa·s, more preferably 2 mPa·s to 40 mPa·s, and still more preferably 3 mPa·s to 30 mPa·s.

The viscosity is measured using a viscometer. As the viscometer, for example, a viscometer (product name: VIS- COMETER TV-22) manufactured by Toki Sangyo Co. Ltd. can be suitably used. However, the viscometer is not limited thereto.

In a case where the photosensitive resin composition according to the embodiment of the present disclosure includes the solvent, for example, from the viewpoint of coatability, the surface tension of the photosensitive resin composition at 25° C. is preferably 5 mN/m to 100 mN/m, more preferably 10 mN/m to 80 mN/m, and still more preferably 15 mN/m to 40 mN/m.

The surface tension is measured using a tensiometer. As the tensiometer, for example, a tensiometer (product name: Automatic Surface Tensiometer CBVP-Z) manufactured by Kyowa Interface Science Co., Ltd. can be suitably used. However, the tensiometer is not limited thereto.

<Other Components>

The photosensitive resin composition according to the embodiment of the present disclosure may include components (so-called other components) other than the components described above.

Examples of the other components include particles (for example, metal oxide particles) and a colorant.

In addition, examples of the other components include a thermal polymerization inhibitor described in paragraph 0018 of JP4502784B and other additives described in paragraphs 0058 to 0071 of JP2000-310706A.

—Particles—

The photosensitive resin composition according to the embodiment of the present disclosure may include particles (for example, metal oxide particles; the same applies hereinafter) for the purpose of adjusting refractive index, light-transmitting property, and the like.

The metal of the metal oxide particles also includes semimetal such as B, Si, Ge, As, Sb, or Te.

From the viewpoint of transparency of the cured film, for example, the average primary particle diameter of the particles is preferably 1 nm to 200 nm and more preferably 3 nm to 80 nm.

The average primary particle diameter of the particles is calculated by measuring particle diameters of 200 random particles using an electron microscope and arithmetically averaging the measurement result. In a case where the shape of the particle is not a spherical shape, the longest side is set as the particle diameter.

In a case where the photosensitive resin composition according to the embodiment of the present disclosure includes particles, the photosensitive resin composition according to the embodiment of the present disclosure may include only one kind of particles having different metal types, sizes, and the like, or may include two or more kinds thereof.

It is preferable that the photosensitive resin composition according to the embodiment of the present disclosure does not include particles, or the content of the particles is more than 0% by mass to 35% by mass or less with respect to the total solid content of the photosensitive resin composition; it is more preferable that the photosensitive resin composition according to the embodiment of the present disclosure does not include particles, or the content of the particles is more than 0% by mass to 10% by mass or less with respect to the total solid content of the photosensitive resin composition; it is still more preferable that the photosensitive resin composition according to the embodiment of the present disclosure does not include particles, or the content of the particles is more than 0% by mass to 5% by mass or less with respect to the total solid content of the photosensitive resin composition; it is even more preferable that the photosensitive resin composition according to the embodiment of the present disclosure does not include particles, or the content of the particles is more than 0% by mass to 1% by mass or less with respect to the total solid content of the photosensitive resin composition; and it is particularly preferably that the photosensitive resin composition according to the embodiment of the present disclosure does not include particles.

—Colorant—

The photosensitive resin composition according to the embodiment of the present disclosure may include a trace amount of a colorant (pigment, dye, and the like), but for example, from the viewpoint of transparency, it is preferable that the photosensitive resin composition according to the embodiment of the present disclosure does not substantially include the colorant.

In a case where the photosensitive resin composition according to the embodiment of the present disclosure includes the colorant, the content of the colorant is preferably less than 1% by mass and more preferably less than 0.1% by mass with respect to the total solid content of the photosensitive resin composition.

<Use>

The use of the photosensitive resin composition according to the embodiment of the present disclosure is not particularly limited, but since the photosensitive resin composition according to the embodiment of the present disclosure has a low moisture permeability of a cured film to be obtained and has excellent bending resistance, the photosensitive resin composition according to the embodiment of the present disclosure can be suitably used as a photosensitive resin composition for a touch panel, more suitably used as a photosensitive resin composition for forming a protective film in a touch panel, and particularly suitably used as a photosensitive resin composition for forming an electrode protective film in a touch panel.

(Cured Film)

The cured film according to the embodiment of the present disclosure is a film obtained by curing the photosensitive resin composition according to the embodiment of the present disclosure. In a case where the photosensitive resin composition according to the embodiment of the present disclosure includes the solvent, the cured film according to the embodiment of the present disclosure is a cured film obtained by curing the solid content of the photosensitive resin composition according to the embodiment of the present disclosure.

In a case where the photosensitive resin composition according to the embodiment of the present disclosure includes a solvent, the photosensitive resin composition according to the embodiment of the present disclosure is applied to a base material in a film shape. Then, it is preferable that, after removing at least a part of the solvent, the curing is performed to form a cured film, by a known method such as heating drying, air drying, or drying under reduced pressure.

In addition, the above-described cured film may have a desired patterned shape.

The cured film according to the embodiment of the present disclosure can be suitably used as an interlayer insulating film (so-called insulating film), an overcoat film (so-called protective film), or the like. In addition, since the cured film according to the embodiment of the present disclosure has excellent film properties, the cured film according to the embodiment of the present disclosure can be suitably used for an organic EL display device, a liquid crystal display device, and the like.

In addition, the cured film according to the embodiment of the present disclosure can be suitably used as a protective film for a touch panel, and can be particularly suitably used as an electrode protective film for a touch panel.

The thickness of the cured film according to the embodiment of the present disclosure is not particularly limited, but is preferably 1 μm to 20 nm, more preferably 2 μm to 15 nm, and still more preferably 3 μm to 12 nm.

(Transfer Film)

The transfer film according to the embodiment of the present disclosure includes a temporary support and a photosensitive layer including at least the solid content of the photosensitive resin composition according to the embodiment of the present disclosure, and preferably includes a temporary support and a photosensitive layer consisting of the photosensitive resin composition according to the embodiment of the present disclosure or obtained by drying the photosensitive resin composition.

<Temporary Support>

The transfer film according to the embodiment of the present disclosure includes a temporary support.

The temporary support is preferably a film and more preferably a resin film. As the temporary support, a film which has flexibility and does not generate significant deformation, contraction, or stretching under pressure or under pressure and heating can be used.

Examples of such a film include a polyethylene terephthalate film (for example, a biaxial stretching polyethylene terephthalate film), a cellulose triacetate film, a polystyrene film, a polyimide film, and a polycarbonate film.

Among these, as the temporary support, a biaxial stretching polyethylene terephthalate film is particularly preferable.

In addition, it is preferable that the film used as the temporary support does not have deformation such as wrinkles or scratches.

From the viewpoint that pattern exposure through the temporary support can be performed, the temporary support preferably has high transparency, and the transmittance at 365 nm is preferably 60% or more and more preferably 70% or more.

From the viewpoint of pattern formation during pattern exposure through the temporary support and transparency of the temporary support, it is preferable that the haze of the temporary support is small. Specifically, the haze value of the temporary support is preferably 2% or less, more preferably 0.5% or less, and particularly preferably 0.1% or less.

From the viewpoint of pattern formation during pattern exposure through the temporary support and transparency of the temporary support, it is preferable that the number of fine particles, foreign substances, and defects included in the temporary support is small. The number of fine particles, foreign substances, and defects having a diameter of 1 μm or more is preferably 50 pieces/10 $mm^2$ or less, more preferably 10 pieces/10 $mm^2$ or less, still more preferably 3 pieces/10 $mm^2$ or less, and particularly preferably 0 pieces/10 $mm^2$.

In addition, from the viewpoint of improving handleability, a layer (lubricant layer) containing fine particles may be provided on the surface of the temporary support. The lubricant layer may be provided on one surface of the temporary support, or on both surfaces thereof. The diameter of the particles included in the lubricant layer may be 0.05 μm to 0.8 μm. In addition, the film thickness of the lubricant layer may be 0.05 μm to 1.0 μm.

The thickness of the temporary support is not particularly limited, but is preferably 5 μm to 200 μm. In addition, from the viewpoint of ease of handling and general-purpose properties, the thickness of the temporary support is more preferably 10 μm to 150 μm and still more preferably 10 to 50 μm.

Examples of the temporary support include a biaxial stretching polyethylene terephthalate film having a film thickness of 16 μm, a biaxial stretching polyethylene terephthalate film having a film thickness of 12 μm, and a biaxial stretching polyethylene terephthalate film having a film thickness of 9 μm.

Preferred aspects of the temporary support are described in, for example, paragraphs 0017 and 0018 of JP2014-85643A, paragraphs 0019 to 0026 of JP2016-27363A, paragraphs 0041 to 0057 of WO2012/081680A, and paragraphs 0029 to 0040 of WO2018/179370A, and the contents of these publications are incorporated in the present specification.

Examples of the temporary support include LUMIRROR (registered trademark) 16FB40 manufactured by Toray Industries, Inc., LUMIRROR (registered trademark) 16QS62 (16KS40) manufactured by Toray Industries, Inc., and COSMOSHINE (registered trademark) A4100, COSMOSHINE (registered trademark) A4300, and COSMOSHINE (registered trademark) A8300 (all of which are manufactured by TOYOBO Co., Ltd.).

In addition, particularly preferred examples of the temporary support include a biaxial stretching polyethylene terephthalate film having a thickness of 16 μm, a biaxial stretching polyethylene terephthalate film having a thickness of 12 μm, and a biaxial stretching polyethylene terephthalate film having a thickness of 10 μm.

<Photosensitive Layer>

The transfer film according to the embodiment of the present disclosure includes a photosensitive layer including at least the solid content of the photosensitive resin composition according to the embodiment of the present disclosure, and preferably includes a photosensitive layer consisting of the photosensitive resin composition according to the embodiment of the present disclosure or obtained by drying the photosensitive resin composition.

In a case where the photosensitive resin composition according to the embodiment of the present disclosure the solvent, it is preferable that at least a part of the solvent is removed by a known method to form the photosensitive layer.

It is not necessary that the solvent is completely removed. For example, the content of the solvent in the photosensitive layer is preferably 5% by mass or less, more preferably 1% by mass or less, and particularly preferably 0.5% by mass or less with respect to the total mass of the photosensitive layer.

The thickness of the photosensitive layer is not particularly limited, but is preferably 20 μm or less, more preferably 15 μm or less, and still more preferably 12 μm or less.

The case where the thickness of the photosensitive layer is 20 μm or less is advantageous from the viewpoint of reducing the thickness of the entire transfer film, improving transmittance of the photosensitive layer or the cured film to be obtained, and preventing yellowing of the photosensitive layer or the cured film to be obtained.

For example, from the viewpoint of manufacturing suitability, the thickness of the photosensitive layer is preferably 1 μm or more, more preferably 2 μm or more, and particularly preferably 3 μm or more.

The thickness of the photosensitive layer is obtained as an average value of 5 random points measured by cross-sectional observation with a scanning electron microscope (SEM).

The refractive index of the photosensitive layer is not particularly limited, but is preferably 1.47 to 1.56, more preferably 1.50 to 1.53, still more preferably 1.50 to 1.52, and particularly preferably 1.51 to 1.52.

A method for forming the photosensitive layer is not particularly limited, and a known method can be used.

As an example of the method for forming the photosensitive layer, a method forming the photosensitive layer by applying a photosensitive resin composition including a solvent onto a temporary support and then drying, as necessary is used.

As a coating method, a known method can be used.

Examples of the coating method include a printing method, a spray coating method, a roll coating method, a bar coating method, a curtain coating method, a spin coating method, and a die coating method (that is, a slit coating method).

Among these, a die coating method is preferable as the coating method.

As a drying method, known methods such as natural drying, heating drying, and drying under reduced pressure can be used, and these methods can be applied alone or in combination of plural thereof.

In the present disclosure, the "drying" means removing at least a part of the solvent included in the composition.

<Second Resin Layer>

The transfer film according to the embodiment of the present disclosure may further include a second resin layer on a side opposite to a side where the temporary support is present in a case of being viewed from the photosensitive layer.

As the second resin layer, a refractive index adjusting layer is preferably used.

In addition, the second resin layer may include the compound A. The preferred aspect, preferred content, and the like of the compound A are the same as those in the preferred aspects of the above-described photosensitive layer.

The second resin layer is preferably disposed to be adjacent to the photosensitive layer.

From the viewpoint of wiring visibility suppression, the refractive index of the second resin layer is preferably higher than the refractive index of the photosensitive layer.

The refractive index of the second resin layer is preferably 1.50 or more, more preferably 1.55 or more, still more preferably 1.60 or more, and particularly preferably 1.70 or more.

The upper limit of the refractive index of the second resin layer is not particularly limited, but is preferably 2.10 or less, more preferably 1.85 or less, still more preferably 1.78 or less, and particularly preferably 1.74 or less.

The second resin layer may have photocuring properties (that is, photosensitivity), may have thermosetting properties, or may have both photocuring properties and thermosetting properties, but from the viewpoint of forming a cured film having excellent hardness, the second resin layer preferably has photocuring properties.

The second resin layer preferably has alkali solubility (for example, solubility with respect to weak alkali aqueous solution).

The thickness of the second resin layer is not particularly limited.

The thickness of the second resin layer is preferably 50 nm to 500 nm, more preferably 55 nm to 110 nm, and still more preferably 60 nm to 100 nm.

The thickness of the second resin layer is obtained as an average value of 5 random points measured by cross-sectional observation with a scanning electron microscope (SEM).

A method for controlling the refractive index of the second resin layer is not particularly limited, and examples thereof include a method using a resin having a predetermined refractive index alone, a method using a resin and metal oxide particles and metal particles, and a method using a composite body of metal salt and a resin.

The type of the metal oxide particles is not particularly limited, and known metal oxide particles can be used.

The metal of the metal oxide particles also includes semimetal such as B, Si, Ge, As, Sb, or Te.

In addition, from the viewpoint of transparency, the average primary particle diameter of the particles is preferably 1 nm to 200 nm and more preferably 3 nm to 80 nm.

The average primary particle diameter of the particles is calculated by measuring particle diameters of 200 random particles using an electron microscope and arithmetically averaging the measurement result. In a case where the shape of the particle is not a spherical shape, the longest side is set as the particle diameter.

Specifically, as the metal oxide particles, at least one selected from the group consisting of zirconium oxide particles ($ZrO_2$ particles), $Nb_2O_5$ particles, titanium oxide particles ($TiO_2$ particles), and silicon dioxide particles ($SiO_2$ particles) or composite particles thereof is preferable.

Among these, for example, from the viewpoint that the refractive index of the second resin layer can be easily adjusted to 1.6 or more, the metal oxide particles are more preferably at least one selected from the group consisting of zirconium oxide particles and titanium oxide particles.

Examples of a commercially available product of the metal oxide particles include calcined zirconium oxide particles (manufactured by CIK-Nano Tek., product name: ZRPGM15WT %-F04), calcined zirconium oxide particles (manufactured by CIK-Nano Tek., product name: ZRPGM15WT %-F74), calcined zirconium oxide particles (manufactured by CIK-Nano Tek., product name: ZRPGM15WT %-F75), calcined zirconium oxide particles (manufactured by CIK-Nano Tek., product name: ZRPGM15WT %-F76), zirconium oxide particles (NanoUse OZ-S30M, manufactured by Nissan Chemical Corporation), and zirconium oxide particles (NanoUse OZ-S30K, manufactured by Nissan Chemical Corporation).

In a case where the second resin layer includes the metal oxide particles, the second resin layer may include only one kind of metal oxide particles, or may include two or more kinds thereof.

From the viewpoint that covering property of a concealed object such as the electrode pattern is improved and visibility of the concealed object can be effectively improved, the content of the metal oxide particles is preferably 1% by mass to 95% by mass, more preferably 20% by mass to 90% by mass, and still more preferably 40% by mass to 85% by mass with respect to the total mass of the second resin layer.

In a case where titanium oxide is used as the metal oxide particles, the content of the titanium oxide particles is preferably 1% by mass to 95% by mass, more preferably 20% by mass to 90% by mass, and still more preferably 40% by mass to 85% by mass with respect to the total mass of the second resin layer.

In addition, the second resin layer preferably includes a binder polymer and an ethylenically unsaturated compound.

With regard to the components of the second resin layer, components of a curable second resin layer described in paragraphs 0019 to 0040 and 0144 to 0150 of JP2014-108541A, and components of a transparent layer described in paragraphs 0024 to 0035 and 0110 to 0112 of JP2014-10814A, and components of a composition including ammonium salt described in paragraphs 0034 to 0056 of WO2016/009980A can be referred to.

As the binder polymer included in the second resin layer, the same binder polymer as that in the photosensitive layer can be used, and the preferred range is also the same.

As the ethylenically unsaturated compound included in the second resin layer, the same ethylenically unsaturated compound as the radically polymerizable compound having an ethylenically unsaturated group, which is included in the photosensitive layer, can be used, and the preferred range is also the same.

In addition, from the viewpoint of suppressing oxidation of the metal in contact with the second resin layer, the second resin layer may include a metal oxidation inhibitor other than the compound A.

Preferred examples of the metal oxidation inhibitor other than the compound A include a compound having an aromatic ring including a nitrogen atom in the molecule.

Examples of the metal oxidation inhibitor other than the compound A include imidazole, triazole, benzimidazole, tetrazole, mercaptothiadiazole, benzotriazole, and purine.

In addition, from the viewpoint of suppressing oxidation of the metal in contact with the second resin layer, the second resin layer also preferably includes adenine as the compound A.

From the viewpoint of manufacturing suitability, the second resin layer may include an amine compound having a chain group having 3 or more atoms. Examples of the amine compound having a chain group having 3 or more atoms include 3-(diethylamino)-1,2-propanediol and N-methyldiethanolamine.

The second resin layer may include a component other than the components described above.

Examples of other components which can be included in the second resin layer include the same components as those included in the photosensitive layer described above.

The second resin layer preferably includes a surfactant as the other components.

A forming method of the second resin layer is not particularly limited.

As an example of the forming method of the second resin layer, a method of forming a second resin layer by applying and, as necessary, drying a composition for forming the second resin layer including an aqueous solvent, on the photosensitive layer formed on the temporary support is used.

Specific examples of coating and drying methods in the forming method of the second resin layer are the same as the specific examples of coating and drying in the forming method of the photosensitive layer, respectively.

<Protective Film>

The transfer film according to the embodiment of the present disclosure may further have a protective film on a side of the photosensitive layer opposite to the temporary support.

In a case where the transfer film according to the embodiment of the present disclosure has the second resin layer on the side of the photosensitive layer opposite to the temporary support, the protective film is preferably disposed on a side opposite to the temporary support in a case of being viewed from the second resin layer.

The above-described protective film is preferably an outermost layer on the surface opposite to the temporary support in the transfer film according to the embodiment of the present disclosure.

Examples of the protective film include a polyethylene terephthalate film, a polypropylene film, a polyethylene film, a polystyrene film, and a polycarbonate film.

As the protective film, for example, films described in paragraphs 0083 to 0087 and 0093 of JP2006-259138A may be used.

The protective film is also available as ALPHAN (registered trademark) FG-201 manufactured by Oji F-Tex Co., Ltd., ALPHAN (registered trademark) E-201F manufactured by Oji F-Tex Co., Ltd., Cerapeel (registered trademark) 25WZ manufactured by TORAY ADVANCED FILM CO., LTD., or LUMIRROR (registered trademark) 16QS62 (16KS40) manufactured by Toray Industries, Inc.

In addition, the protective film preferably has 5 pieces/$m^2$ or less of the number of fisheyes with a diameter of 80 μm or more in the protective film. The "fisheye" means that, in a case where a material is hot-melted, kneaded, extruded, biaxially stretched, cast or the like to produce a film, foreign substances, undissolved substances, oxidatively deteriorated substances, and the like of the material are incorporated into the film.

The number of particles having a diameter of 3 μm or more included in the protective film is preferably 30 particles/$mm^2$ or less, more preferably 10 particles/$mm^2$ or less, and still more preferably 5 particles/$mm^2$ or less. As a result, it is possible to suppress defects caused by ruggedness due to the particles included in the protective film being transferred to the photosensitive resin layer.

In the protective film, from the viewpoint of imparting take-up property, the arithmetic average roughness Ra on a surface opposite to a surface in contact with the photosensitive layer is preferably 0.01 μm or more, more preferably 0.02 μm or more, and still more preferably 0.03 μm or more. On the other hand, from the viewpoint of suppressing defects during transfer, Ra is preferably less than 0.50 μm, more preferably 0.40 μm or less, and still more preferably 0.30 μm or less.

In addition, in the protective film, from the viewpoint of suppressing defects during transfer, the surface roughness Ra on the surface in contact with the photosensitive layer is preferably 0.01 μm or more, more preferably 0.02 μm or more, and still more preferably 0.03 μm or more. On the other hand, it is preferable to be less than 0.50 μm, it is more preferable to be 0.40 μm or less, and it is still more preferable to be 0.30 μm or less.

<Thermoplastic Resin Layer>

The transfer film according to the embodiment of the present disclosure may further have a thermoplastic resin layer between the temporary support and the photosensitive layer.

In a case where the transfer film further has a thermoplastic resin layer, air bubbles due to lamination are hardly generated in a case where the transfer film is transferred to a substrate to form a laminate. In a case where this laminate is used in an image display device, image unevenness is hardly generated and excellent display properties are obtained.

The thermoplastic resin layer preferably has alkali solubility.

The thermoplastic resin layer functions as a cushion material which absorbs ruggedness of the surface of the substrate in a case of transfer.

The ruggedness of the surface of the substrate includes an image, an electrode, a wiring, and the like which are formed in advance.

The thermoplastic resin layer preferably has properties capable of being deformed in accordance with ruggedness.

The thermoplastic resin layer preferably includes an organic polymer substance described in JP1993-72724A (JP-H05-72724A), and more preferably includes an organic polymer substance having a softening point approximately 80° C. or lower by a Vicat method (specifically, polymer softening point measurement method using an American Society for Testing and Materials ASTM D1235).

The thickness of the thermoplastic resin layer is preferably 3 μm to 30 μm, more preferably 4 μm to 25 μm, and still more preferably 5 μm to 20 μm.

In a case where the thickness of the thermoplastic resin layer is 3 μm or more, followability with respect to the ruggedness of the surface of the substrate is improved, and the ruggedness of the surface of the substrate can be effectively absorbed.

In a case where the thickness of the thermoplastic resin layer is 30 μm or less, since the manufacturing suitability is more improved, for example, burden of the drying (so-called drying for removing the solvent) in a case of applying and forming the thermoplastic resin layer on the temporary support is further reduced, and the development time of the thermoplastic resin layer after the transfer is further shortened.

The thickness of the thermoplastic resin layer is obtained as an average value of 5 random points measured by cross-sectional observation with a scanning electron microscope (SEM).

The thermoplastic resin layer can be formed by applying and, as necessary, drying a composition for forming a thermoplastic resin layer including a solvent and a thermoplastic organic polymer on the temporary support.

Specific examples of coating and drying methods in the forming method of the thermoplastic resin layer are the same as the specific examples of coating and drying in the forming method of the photosensitive layer, respectively.

The solvent is not particularly limited as long as the solvent dissolves the polymer component forming the thermoplastic resin layer.

Examples of the solvent include organic solvents (for example, methyl ethyl ketone, cyclohexanone, propylene glycol monomethyl ether acetate, n-propanol, and 2-propanol).

The viscosity of the thermoplastic resin layer measured at 100° C. is preferably 1,000 Pa·s to 10,000 Pa·s. In addition, the viscosity of the thermoplastic resin layer measured at 100° C. is preferably lower than the viscosity of the photosensitive layer measured at 100° C.

<Interlayer>

The transfer film according to the embodiment of the present disclosure may further have an interlayer between the temporary support and the photosensitive layer.

In a case where the transfer film according to the embodiment of the present disclosure has the thermoplastic resin layer, the interlayer is preferably disposed between the thermoplastic resin layer and the photosensitive layer.

Examples of a component included in the interlayer include at least one polymer selected from the group consisting of polyvinyl alcohol, polyvinylpyrrolidone, and cellulose.

In addition, as the interlayer, a component described in JP1993-72724A (JP-H05-72724A) as a "separation layer" can also be used.

In a case of producing the transfer film having the thermoplastic resin layer, the interlayer, and the photosensitive layer on the temporary support in this order, for example, the interlayer can be formed by applying and, as necessary, drying a composition for forming an interlayer including a solvent which does not dissolve the thermoplastic resin layer, and the above-described polymer as the component of the interlayer.

Specifically, first, the composition for forming a thermoplastic resin layer is applied and dried on the temporary support to form the thermoplastic resin layer. Next, the composition for forming an interlayer is applied on the formed thermoplastic resin layer and dried as necessary to form the interlayer. Next, a photosensitive resin composition (so-called a composition for forming a photosensitive layer) including an organic solvent is applied on the formed interlayer and dried to form the photosensitive layer. The organic solvent included in the composition for forming a photosensitive layer is preferably an organic solvent which does not dissolve the interlayer.

Specific examples of coating and drying methods in the forming method of the interlayer are the same as the specific examples of coating and drying in the forming method of the photosensitive layer, respectively.

—Impurities—

In the transfer film according to the embodiment of the present disclosure, from the viewpoint of improving reliability and patterning properties, it is preferable that the photosensitive layer and the second resin layer have a low content of impurities.

Specific examples of the impurities include sodium, potassium, magnesium, calcium, iron, manganese, copper, aluminum, titanium, chromium, cobalt, nickel, zinc, tin, ions of these, and halide ions (chloride ion, bromide ion, iodide ion, and the like). Among these, sodium ion, potassium ion, and chloride ion are easily mixed as impurities, so that the following content is particularly preferable.

The content of impurities in each layer is preferably 1,000 ppm or less, more preferably 200 ppm or less, still more preferably 40 ppm or less, particularly preferably 10 ppm or less, and most preferably 5 ppm or less on a mass basis. Although the lower limit is not particularly defined, from the viewpoint of the limit that can be reduced realistically and the limit of measurement, the lower limit may be 10 ppb or more or 100 ppb or more on a mass basis.

Examples of a method for reducing the impurities to the above-described range include selecting a raw material of each layer containing no impurities, preventing the impurities from being mixed in a case of forming the layer, and washing and removing the impurities. By such a method, the amount of impurities can be kept within the above-described range.

The impurities can be quantified by a known method such as inductively coupled plasma (ICP) emission spectroscopy, atomic absorption spectroscopy, and ion chromatography.

In addition, it is preferable that the content of compounds such as benzene, formaldehyde, trichlorethylene, 1,3-butadiene, carbon tetrachloride, chloroform, N,N-dimethylformamide, N,N-dimethylacetamide, and hexane is low in each layer. The content of these compounds in each layer is preferably 1,000 ppm or less, more preferably 200 ppm or less, still more preferably 40 ppm or less, particularly preferably 10 ppm or less, and most preferably 5 ppm or less on a mass basis. Although the lower limit is not particularly defined, from the viewpoint of the limit that can be reduced realistically and the limit of measurement, the lower limit may be 10 ppb or more or 100 ppb or more on a mass basis.

The content of compounds as impurities can be suppressed in the same manner as in the above-described metal as impurities. In addition, the compounds can be quantified by a known measurement method.

—Moisture—

In the transfer film according to the embodiment of the present disclosure, from the viewpoint of improving laminating property, reliability, and patterning properties, the moisture content in the above-described photosensitive layer and the above-described second resin layer is preferably 0.01% by mass to 1.0% by mass and more preferably 0.1% by mass to 0.5% by mass with respect to the total mass of the above-described photosensitive layer and the above-described second resin layer.

In addition, the photosensitive layer and the second resin layer are preferably achromatic. Specifically, in CIE1976 ($L^*$, $a^*$, $b^*$) color space of the total reflection (incidence angle: 8°, light source: D-65 (visual field: 2°)), the $L^*$ value is preferably 10 to 90, the $a^*$ value is preferably −1.0 to 1.0, and the $b^*$ value is preferably −1.0 to 1.0.

—Specific Example of Transfer Film—

FIG. 1 is a schematic cross sectional view of a transfer film 10 which is a specific example of the transfer film according to the embodiment of the present disclosure. As shown in FIG. 1, the transfer film 10 has a laminated structure of protective film 16/second resin layer 20A/photosensitive layer 18A/temporary support 12 (that is, laminated structure in which a temporary support 12, a photosensitive layer 18A, a second resin layer 20A, and a protective film 16 are arranged in this order).

However, the transfer film according to the embodiment of the present disclosure is not limited to the transfer film 10, and for example, the second resin layer 20A and the protective film 16 may be omitted. In addition, at least one of the thermoplastic resin layer or the interlayer described above may be included between the temporary support 12 and the photosensitive layer 18A.

The second resin layer 20A is a layer disposed on a side of the photosensitive layer 18A opposite to the side where the temporary support 12 is present, and a layer having a refractive index at a wavelength of 550 nm 1.50 or more.

The transfer film 10 is a negative type material (so-called negative type film).

A manufacturing method of the transfer film 10 is not particularly limited.

The manufacturing method of the transfer film 10, for example, includes a step of forming the photosensitive layer 18A on the temporary support 12, a step of forming the second resin layer 20A on the photosensitive layer 18A, and a step of forming the protective film 16 on the second resin layer 20A in this order.

The manufacturing method of the transfer film 10 may include a step of volatilizing ammonia described in a paragraph 0056 of WO2016/009980A, between the step of forming the second resin layer 20A and the step of forming the protective film 16.

After being produced, it is preferable that the transfer film according to the embodiment of the present disclosure is rolled up in a roll and stored in a refrigerator until the transfer film according to the embodiment of the present disclosure is used. Examples of a refrigerating temperature include 2° C. to 10° C.

(Laminate and Electrostatic Capacity-Type Input Device)

The laminate according to the embodiment of the present disclosure includes a substrate and a cured film obtained by curing the photosensitive resin composition according to the embodiment of the present disclosure.

The laminate according to the embodiment of the present disclosure may include the cured film according to the embodiment of the present disclosure, but is preferably a laminate obtained by laminating a substrate, an electrode, and the cured film according to the embodiment of the present disclosure in this order.

The cured film may have a desired patterned shape.

The electrostatic capacity-type input device according to the present disclosure includes the cured film according to the embodiment of the present disclosure or the laminate according to the embodiment of the present disclosure.

The substrate is preferably a substrate including an electrode of the electrostatic capacity-type input device.

The electrode is preferably an electrode of the electrostatic capacity-type input device.

The electrode of the electrostatic capacity-type input device may be a transparent electrode pattern or a lead wire.

In the laminate, the electrode of the electrostatic capacity-type input device is preferably an electrode pattern and more preferably a transparent electrode pattern.

The laminate according to the embodiment of the present disclosure and the cured film obtained by curing the photosensitive resin composition according to the embodiment of the present disclosure are preferably achromatic. Specifically, in CIE1976 ($L^*$, $a^*$, $b^*$) color space, the total reflection (incidence angle: 8°, light source: D-65 (visual field: 2°)) preferably has a pattern $L^*$ value of 10 to 90, preferably has a pattern $a^*$ value of −1.0 to 1.0, and preferably has a pattern $b^*$ value of −1.0 to 1.0.

It is preferable that the laminate according to the embodiment of the present disclosure includes a substrate, a transparent electrode pattern, a second resin layer disposed to be adjacent to the transparent electrode pattern, and a photosensitive layer disposed to be adjacent to the second resin layer, in which a refractive index of the second resin layer is higher than a refractive index of the photosensitive layer.

The refractive index of the second resin layer is preferably 1.6 or more.

In a case where the laminate has the above-described configuration, covering property of the transparent electrode pattern is improved.

As the substrate, a glass substrate or a resin substrate is preferable.

In addition, the substrate is preferably a transparent substrate and more preferably a transparent resin substrate.

The refractive index of the substrate is preferably 1.50 to 1.52.

As the glass substrate, tempered glass such as GORILLA GLASS (registered trademark) manufactured by Corning Incorporated can be used.

As the resin substrate, at least one of a component with no optical strains or a component having high transparency is preferably used, and examples thereof include a substrate consisting of a resin such as polyethylene terephthalate (PET), polyethylene naphthalate (PEN), polycarbonate (PC), triacetyl cellulose (TAC), polyimide (PI), polybenzoxazole (PBO), and cycloolefin polymer (COP).

As a material of the transparent substrate, a material described in JP2010-86684A, JP2010-152809A, and JP2010-257492A is preferable.

As the electrostatic capacity-type input device, a touch panel is suitably used.

As the electrode for a touch panel, a transparent electrode pattern disposed at least in an image display region of the touch panel is used. The electrode for a touch panel may extend from the image display region to a frame portion of the touch panel.

As the wire for a touch panel, the lead wire (so-called lead-out wire) disposed on the frame portion of the touch panel is used.

As an aspect of the substrate for a touch panel and the touch panel, an aspect in which the transparent electrode pattern and the lead wire are electrically connected to each other by laminating a part of the lead wire on a portion of the transparent electrode pattern extending to the frame portion of the touch panel is suitable.

As a material of the transparent electrode pattern, a metal oxide film such as indium tin oxide (ITO) and indium zinc oxide (IZO), or a fine metal wire such as metal mesh and silver nanowire is preferable.

Examples of the fine metal wire include thin wire of silver and copper. Among these, silver conductive materials such as silver mesh and silver nanowire are preferable.

As a material of the lead wire, metal is preferable.

Examples of a metal which is the material of the lead wire include gold, silver, copper, molybdenum, aluminum, titanium, chromium, zinc, manganese, and alloy consisting of two or more kinds of these metal elements. As the material of the lead wire, copper, molybdenum, aluminum, or titanium is preferable, copper is particularly preferable.

The electrode protective film for a touch panel, which is formed by using the transfer film according to the embodiment of the present disclosure, is provided so as to cover the electrode and the like directly or through other layers, in order to protect the electrode and the like (that is, at least one of the electrode for a touch panel or the wire for a touch panel).

The preferred range of a thickness of the electrode protective film for a touch panel is the same as the preferred range of a thickness of the photosensitive layer described above.

The above-described electrode protective film (preferably, the electrode protective film for a touch panel) may include an opening portion.

The opening portion can be formed by dissolving an unexposed portion of the photosensitive layer with a developer.

The touch panel may further include a first refractive index adjusting layer between the electrode and the like and the electrode protective layer for a touch panel (for example, see the first specific example of the touch panel which will be described later).

The preferred aspect of the first refractive index adjusting layer is the same as the preferred aspect of the second resin layer which can be included in the transfer film. However, the first refractive index adjusting layer is a layer after curing in a case where the second resin layer is curable, and as a preferred aspect of the first refractive index adjusting layer, it is needless to say that preferred aspects such as photocuring properties, thermosetting properties, and alkali solubility in the second resin layer do not apply.

The first refractive index adjusting layer may be formed by applying and drying a composition for forming the first refractive index adjusting layer, or may be formed by transferring the refractive index adjusting layer of the transfer film having the refractive index adjusting layer.

The touch panel of the aspect including the first refractive index adjusting layer is preferably formed by transferring the photosensitive layer and the second resin layer of the transfer film by using the transfer film according to the embodiment of the present disclosure of the aspect having the second resin layer. In this case, the electrode protective layer for a touch panel is formed of the photosensitive layer of the transfer film, and the first refractive index adjusting layer is formed of the second resin layer of the transfer film.

In addition, the touch panel or the substrate for a touch panel may include a second refractive index adjusting layer between the substrate and the electrode and the like (for example, see, first specific example of the touch panel which will be described later).

The preferred aspect of the second refractive index adjusting layer is the same as the preferred aspect of the second resin layer which can be included in the transfer film.

The aspect in which the touch panel includes the first refractive index adjusting layer (more preferably, the aspect of including the first refractive index adjusting layer and the second refractive index adjusting layer) has an advantage in which the electrode and the like are hardly visible (that is, wire visibility is prevented).

With regard to the structure of the touch panel, a structure of an electrostatic capacity-type input device described in JP2014-10814A and JP2014-108541A may be referred to.

—First Specific Example of Touch Panel—

Figure 2:
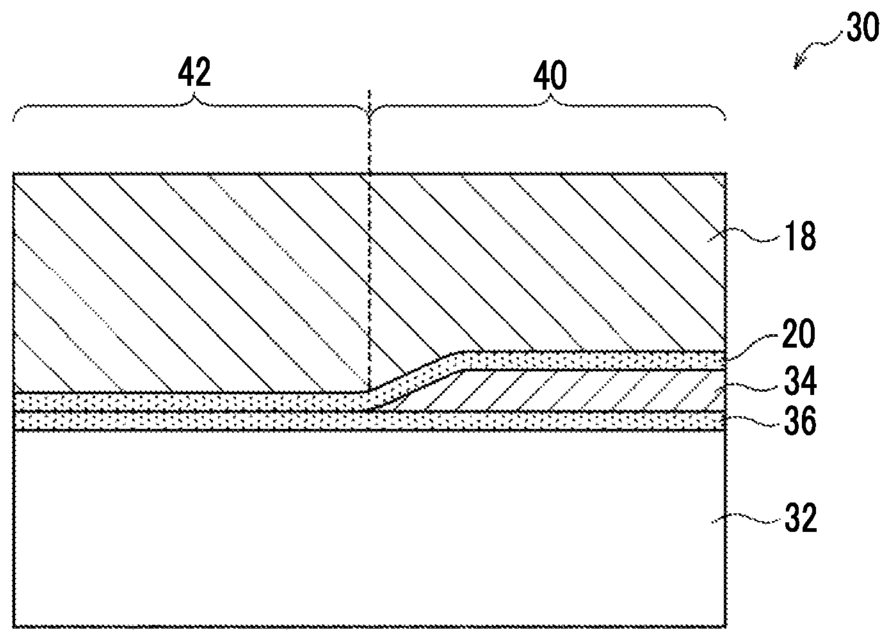
FIG. 2 is a schematic cross sectional view showing a first specific example of a touch panel to which a photosensitive layer including a photosensitive resin composition according to an embodiment of the present disclosure is applied.

FIG. 2 is a schematic cross sectional view of a touch panel 30 which is the first specific example of the touch panel according to the present disclosure. More specifically, FIG. 2 is a schematic cross sectional view of an image display region of the touch panel 30.

As shown in FIG. 2, the touch panel 30 has a structure in which a substrate 32, a second refractive index adjusting layer 36, a transparent electrode pattern 34 as the electrode for a touch panel, a first refractive index adjusting layer 20, and an electrode protective film 18 for a touch panel are disposed in this order.

In the touch panel 30, the electrode protective film 18 for a touch panel and the first refractive index adjusting layer 20 cover the entire transparent electrode pattern 34. However, the touch panel according to the present disclosure is not limited to this aspect. The electrode protective film 18 for a touch panel and the first refractive index adjusting layer 20 may cover at least a portion of the transparent electrode pattern 34.

The second refractive index adjusting layer 36 and the first refractive index adjusting layer 20 are preferably respectively continuously coated over a first region 40 in which the transparent electrode pattern 34 is present and a second region 42 in which the transparent electrode pattern 34 is not present directly or through another layer. According to such an aspect, the transparent electrode pattern 34 is less visible.

The second refractive index adjusting layer 36 and the first refractive index adjusting layer 20 are preferably coated directly over both of the first region 40 and the second region 42, rather than the coating through the other layer.

Examples of the "other layer" include an insulating layer and an electrode pattern other than the transparent electrode pattern 34.

The first refractive index adjusting layer 20 is laminated over both of the first region 40 and the second region 42. The first refractive index adjusting layer 20 is adjacent to the second refractive index adjusting layer 36 and is also adjacent to the transparent electrode pattern 34.

In a case where the shape of the end part of the transparent electrode pattern 34 at a portion in contact with the second refractive index adjusting layer 36 is a tapered shape as shown in FIG. 2, the first refractive index adjusting layer 20 is preferably laminated along the tapered shape (that is, at the same tilt as the taper angle).

As the transparent electrode pattern 34, the ITO transparent electrode pattern is suitable.

The transparent electrode pattern 34 can be, for example, formed by the following method.

A thin film for an electrode (for example, ITO film) is formed on the substrate 32 on which the second refractive index adjusting layer 36 is formed by sputtering. Next, by applying a photosensitive resist for etching or transferring a photosensitive film for etching on the formed thin film for an electrode, an etching protective layer is formed. Next, the formed etching protective layer is patterned into a desired patterned shape by exposure and development. Next, a portion of the thin film for an electrode which is not covered with the patterned etching protective layer is removed by etching to form the thin film for an electrode into a pattern having a desired shape (that is, the transparent electrode pattern 34). Next, the patterned etching protective layer is removed by a stripper.

The first refractive index adjusting layer 20 and the electrode protective film 18 for a touch panel are, for example, formed on the substrate 32 (that is, substrate for a touch panel) on which the second refractive index adjusting layer 36 and the transparent electrode pattern 34 are provided in this order as described below.

First, the transfer film 10 (that is, transfer film 10 having a laminated structure of protective film 16/second resin layer 20A/photosensitive layer 18A/temporary support 12) shown in FIG. 1 is prepared.

Next, the protective film 16 is removed from the transfer film 10.

Then, the transfer film 10, from which the protective film 16 is removed, is laminated on the substrate 32 (that is, substrate for a touch panel) on which the second refractive index adjusting layer 36 and the transparent electrode pattern 34 are provided in this order. The laminating is performed in a direction in which the second resin layer 20A of the transfer film 10, from which the protective film 16 is removed, and the transparent electrode pattern 34 are in contact with each other. By this laminating, a laminate having a laminated structure of temporary support 12/photosensitive layer 18A/second resin layer 20A/transparent electrode pattern 34/second refractive index adjusting layer 36/substrate 32 is obtained.

Next, the temporary support 12 is removed from the laminate.

Next, by performing the pattern exposure with respect to the laminate, from which the temporary support 12 is removed, the photosensitive layer 18A and the second resin layer 20A are cured in a patterned shape. The curing of the photosensitive layer 18A and the second resin layer 20A in a patterned shape may be respectively individually performed by individual pattern exposure, but the curing is preferably performed at the same time by the pattern exposure at one time.

Next, by removing the unexposed portion (that is, uncured portion) of the photosensitive layer 18A and the second resin layer 20A by the development, the electrode protective film 18 for a touch panel which is a patterned cured product of the photosensitive layer 18A (not shown regarding the patterned shape), and the first refractive index adjusting layer 20 which is a patterned cured product of the second resin layer 20A (not shown regarding the patterned shape) are respectively obtained. The development of the photosensitive layer 18A and the second resin layer 20A after the pattern exposure may be respectively individually performed by individual development, but the development is preferably performed at the same time by the development at one time.

The preferred aspects of the laminating, the pattern exposure, and the development will be described later.

—Second Specific Example of Touch Panel—

Figure 3:
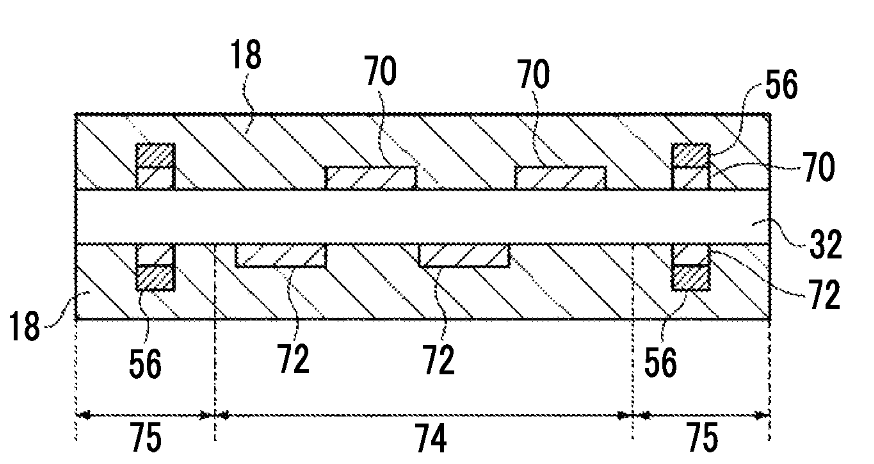
FIG. 3 is a schematic cross sectional view showing a second specific example of a touch panel to which a photosensitive layer including a photosensitive resin composition according to an embodiment of the present disclosure is applied.

FIG. 3 is a schematic cross sectional view of a touch panel 90 which is a second specific example of the touch panel according to the present disclosure.

As shown in FIG. 3, the touch panel 90 has an image display region 74 and an image non-display region 75 (that is, frame portion).

In addition, the touch panel 90 includes the electrode for a touch panel on both surfaces of the substrate 32. Specifically, the touch panel 90 includes a first transparent electrode pattern 70 on one surface of the substrate 32 and includes a second transparent electrode pattern 72 on the other surface thereof.

In the touch panel 90, a lead wire 56 is connected to the first transparent electrode pattern 70 and the second transparent electrode pattern 72, respectively. The lead wire 56 is, for example, a copper wire.

In the touch panel 90, the electrode protective film 18 for a touch panel is formed on one surface of the substrate 32 so as to cover the first transparent electrode pattern 70 and the lead wire 56, and the electrode protective film 18 for a touch panel is formed on the other surface of the substrate 32 so as to cover the second transparent electrode pattern 72 and the lead wire 56.

The first refractive index adjusting layer and the second refractive index adjusting layer of the first specific example may be formed on the one surface and the other surface of the substrate 32, respectively.

(Manufacturing Method of Touch Panel)

The manufacturing method of a touch panel according to the embodiment of the present disclosure is not particularly limited, but the following method is preferable.

The manufacturing method of a touch panel according to the embodiment of the present disclosure preferably includes

- a step of preparing a substrate for a touch panel having a structure in which the electrode and the like (that is, at least one of the electrode for a touch panel or the wire for a touch panel) are disposed on a substrate (hereinafter, also referred to as a "preparation step"),
- a step of forming, on the surface on a side where an electrode and the like of the substrate for a touch panel are disposed, a photosensitive layer including the photosensitive resin composition according to the embodiment of the present disclosure (hereinafter, also referred to as a "photosensitive layer forming step"),
- a step of performing a pattern exposure of the photosensitive layer formed on the substrate for a touch panel (hereinafter, also referred to as a "pattern exposure step"), and
- a step of developing the photosensitive layer subjected to the pattern exposure to obtain an electrode protective film for a touch panel which protects at least a part of the electrode or the like (hereinafter, also referred to as a "development step").

According to the preferred manufacturing method of a touch panel according to the embodiment of the present disclosure, it is possible to manufacture a touch panel provided with a cured film having excellent adhesiveness to a substrate and corrosion inhibitory property of a metal.

Hereinafter, each step in the preferred manufacturing method of a touch panel according to the embodiment of the present disclosure will be described.

<Preparation Step>

The preparation step is a step for convenience, and is a step of preparing a substrate for a touch panel having a structure in which the electrode and the like (that is, at least one of the electrode for a touch panel or the wire for a touch panel) are disposed on the substrate.

The preparation step may be a step of only simply preparing the substrate for a touch panel manufactured in advance, or may be a step of manufacturing the substrate for a touch panel.

The preferred aspect of the substrate for a touch panel is as described above.

<Photosensitive Layer Forming Step>

The photosensitive layer forming step is a step of forming, on the surface on a side where an electrode and the like of the substrate for a touch panel are disposed, a photosensitive layer including the photosensitive resin composition according to the embodiment of the present disclosure.

Hereinafter, in the photosensitive layer forming step, an aspect of forming the photosensitive layer including the photosensitive resin composition according to the embodiment of the present disclosure using the transfer film according to the embodiment of the present disclosure will be described.

In this aspect, the photosensitive layer is formed on the surface by laminating the transfer film according to the embodiment of the present disclosure on the surface of the substrate for a touch panel on a side on which the electrode and the like are disposed, and transferring the photosensitive layer of the transfer film according to the embodiment of the present disclosure on the surface.

The laminating (so-called transfer of the photosensitive layer) can be performed using a known laminator such as a vacuum laminator or an auto-cut laminator.

As the laminating condition, a general condition can be applied.

The laminating temperature is preferably 80° C. to 150° C., more preferably 90° C. to 150° C., and still more preferably 100° C. to 150° C.

In a case of using a laminator including a rubber roller, the laminating temperature indicates a temperature of the rubber roller.

A temperature of the substrate in a case of laminating is not particularly limited.

The temperature of the substrate in a case of laminating is preferably 10° C. to 150° C., more preferably 20° C. to 150° C., and still more preferably 30° C. to 150° C.

In a case of using a resin substrate as the substrate, the temperature of the substrate in a case of laminating is preferably 10° C. to 80° C., more preferably 20° C. to 60° C., and still more preferably 30° C. to 50° C.

In addition, the linear pressure in a case of laminating is preferably 0.5 N/cm to 20 N/cm, more preferably 1 N/cm to 10 N/cm, and still more preferably 1 N/cm to 5 N/cm.

In addition, the transportation speed (laminating speed) in a case of laminating is preferably 0.5 m/min to 5 m/min and more preferably 1.5 m/min to 3 m/min.

In a case of using the transfer film having a laminated structure of protective film/photosensitive layer/interlayer/thermoplastic resin layer/temporary support, first, the protective film is peeled off from the transfer film to expose the photosensitive layer, the transfer film and the substrate for a touch panel are attached to each other so that the exposed photosensitive layer and the surface of the substrate for a touch panel on a side on which the electrode and the like are disposed are in contact with each other, and heating and pressurizing are performed. By such an operation, the photosensitive layer of the transfer film is transferred onto the surface of the substrate for a touch panel on a side on which the electrode and the like are disposed, and a laminate having a laminated structure of temporary support/thermoplastic resin layer/interlayer/photosensitive layer/electrode and the like/substrate is formed. In this laminated structure, the portion of "electrode and the like/substrate" is the substrate for a touch panel.

Thereafter, the temporary support is peeled off from the laminate, as necessary. However, the pattern exposure which will be described later can be also performed, by leaving the temporary support.

As an example of the method of transferring the photosensitive layer of the transfer film on the substrate for a touch panel and performing pattern exposure and development, a description described in paragraphs 0035 to 0051 of JP2006-23696A can also be referred to.

<Pattern Exposure Step>

The pattern exposure step is a step of performing a pattern exposure of the photosensitive layer formed on the substrate for a touch panel.

The "pattern exposure" refers to exposure of the aspect of performing the exposure in a patterned shape, that is, the embodiment in which an exposed portion and an unexposed portion are present.

The exposed portion of the photosensitive layer on the substrate for a touch panel in the pattern exposure is cured and finally becomes the cured film.

Meanwhile, the unexposed portion of the photosensitive layer on the substrate for a touch panel in the pattern exposure is not cured, and is dissolved and removed with a developer in the subsequent development step. With the unexposed portion, the opening portion of the cured film can be formed after the development step.

The pattern exposure may be an exposure through a mask or may be a digital exposure using a laser or the like.

As a light source of the pattern exposure, a light source can be appropriately selected, as long as it can emit light at a wavelength region (for example, 365 nm or 405 nm) at which the photosensitive layer can be cured.

Examples of the light source include various lasers, a light emitting diode (LED), an ultra-high pressure mercury lamp, a high pressure mercury lamp, and a metal halide lamp.

The exposure amount is preferably 5 $mJ/cm^2$ to 200 $mJ/cm^2$ and more preferably 10 $mJ/cm^2$ to 200 $mJ/cm^2$.

In a case where the photosensitive layer is formed on the substrate using the transfer film, the pattern exposure may be performed after peeling the temporary support, or the temporary support may be peeled off after performing the pattern exposure before peeling off the temporary support.

In addition, in the exposure step, the heat treatment (so-called post exposure bake (PEB)) may be performed with respect to the photosensitive layer after the pattern exposure and before the development.

<Development Step>

The development step is a step of obtaining the electrode protective film for a touch panel which protects at least a portion of the electrode and the like, by developing the photosensitive layer subjected to the pattern exposure (that is, by dissolving the unexposed portion in the pattern exposure with a developer).

A developer used in the development is not particularly limited, and a well-known developer such as a developer disclosed in JP1993-72724A (JP-H05-72724A) can be used.

As the developer, an alkali aqueous solution is preferably used.

Examples of an alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

The pH of the alkali aqueous solution at 25° C. is preferably 8 to 13, more preferably 9 to 12, and particularly preferably 10 to 12.

The content of the alkali compound in the alkali aqueous solution is preferably 0.1% by mass to 5% by mass and more preferably 0.1% by mass to 3% by mass with respect to the total mass of the alkali aqueous solution.

The developer may include an organic solvent having miscibility with water.

Examples of the organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, E-Caprolactam, and N-methylpyrrolidone.

The concentration of the organic solvent is preferably 0.1% by mass to 30% by mass.

The developer may include a known surfactant.

The concentration of the surfactant is preferably 0.01% by mass to 10% by mass.

The liquid temperature of the developer is preferably 20° C. to 40° C.

Examples of the development method include methods such as puddle development, shower development, shower and spin development, and dip development.

In a case of the shower development, the unexposed portion of the photosensitive layer is removed by spraying the developer to the photosensitive layer after the pattern exposure as a shower.

In a case of using the transfer film including at least one of the photosensitive layer, the thermoplastic resin layer, or the interlayer, after the transfer of these layers onto the substrate and before the development of the photosensitive layer, an alkali solution having a low solubility of the photosensitive layer may be sprayed as a shower, and at least one of the thermoplastic resin layer or the interlayer (both layers, in a case where both layers are present) may be removed in advance.

In addition, after the development, the development residue is preferably removed by spraying a washing agent with a shower and rubbing with a brush or the like.

The liquid temperature of the developer is preferably 20° C. to 40° C.

The development step may include a stage of performing the development, and a stage of performing the heat treatment (hereinafter, also referred to as "post baking") with respect to the cured film obtained by the development.

In a case where the substrate is a resin substrate, a temperature of the post baking is preferably 100° C. to 160° C. and more preferably 130° C. to 160° C.

A resistance value of the transparent electrode pattern can also be adjusted by this post baking.

In a case where the photosensitive layer includes a carboxy group-containing (meth)acrylic resin, at least a part of the carboxy group-containing (meth)acrylic resin can be changed to carboxylic acid anhydride by the post baking. In a case of being changed in this way, developability and hardness of the cured film are excellent.

The development step may include a stage of performing the development, and a stage of exposing the cured film obtained by the development (hereinafter, also referred to as "post exposure").

In a case where the development step includes both a stage of performing the post exposure and a stage of performing the post baking, it is preferable to perform the post-baking after the post-exposure.

With regard to the pattern exposure and the development, for example, a description described in paragraphs 0035 to 0051 of JP2006-23696A can be referred to.

The manufacturing method of a touch panel according to the embodiment of the present disclosure may include a step (so-called other steps) other than the steps described above.

Examples of the other step include a known step (for example, washing step) which may be provided in a normal photolithography step.

EXAMPLES

Hereinafter, the present disclosure will be described in more detail with reference to Examples.

The material, the amount used, the ratio, the process contents, the process procedure, and the like shown in the following examples can be appropriately changed, within a range not departing from a gist of the present disclosure. Accordingly, the range of the present disclosure is not limited to specific examples shown below.

Example 1

<Production of Photosensitive Transfer Material (Transfer Film)>

<<Formation of Photosensitive Layer>>

On a polyethylene terephthalate film (temporary support, 16QS62 (16KS40) (manufactured by Toray Industries, Inc.)) having a thickness of 16 μm, a coating liquid for a photosensitive layer composed of the following formulation 101 was applied using a slit-shaped nozzle such that the thickness after drying was adjusted to 4.5 μm, and the solvent was removed by drying the coating liquid with a hot air convection dryer having a temperature gradient of 75° C. to 120° C. to form a photosensitive layer.

—Coating Liquid for Photosensitive Layer: Formulation 101 (Organic Solvent-Based Resin Composition (Photosensitive Resin Composition))—

Ethylenically Unsaturated Compound

- A-NOD-N (M-1, 1,9-nonanediol diacrylate, manufactured by Shin-Nakamura Chemical Co., Ltd.): 8.41 parts
- A-DCP (M-3, tricyclodecanedimethanol diacrylate, manufactured by Shin-Nakamura Chemical Co., Ltd.): 16.83 parts
- ARONIX TO-2349 (M-4, polyfunctional ethylenically unsaturated compound having a carboxylic acid group, manufactured by Toagosei Co., Ltd.): 2.80 parts Binder Polymer

- P-1 (resin shown below, constitutional unit derived from styrene (St)/constitutional unit derived from dicyclopentanyl methacrylate (DCPMA)/constitutional unit derived from methacrylic acid (MAA)/constitutional unit obtained by adding glycidyl methacrylate to a constitutional unit derived from methacrylic acid (GMA-MAA)=41.0/15.2/23.9/19.9 (mol %), Mw=17,000): 56.32 parts (solid content)

Photopolymerization Initiator

1-[9-ethyl-6-(2-methylbenzoyl)-9H-carbazole-3-yl]ethanone-1-(O-acetyloxime) (D-1, Irgacure OXE-02, manufactured by BASF SE): 0.32 parts 2-methyl-1-(4-methylthi ophenyl)-2-morpholinopropan-1-one (D-2, Irgacure 907, manufactured by BASF SE): 0.64 parts Thermal Crosslinking Compound DURANATE WT32-B75P (E-3, blocked isocyanate compound, manufactured by Asahi Kasei Corporation): 12.50 parts Compound A Pyridine-2-carboxylic acid: 0.69 parts Other Additives Hydrogen donating compound (AD-1, N-phenylglycine, manufactured by JUNSEI CHEMICAL CO., LTD.): 0.10 parts Copolymer of styrene/maleic acid anhydride=4:1 (molar ratio) (AD-2, SMA EF-40, acid anhydride value: 1.94 mmol/g, weight-average molecular weight: 10,500, manufactured by Cray Valley): 1.20 parts Surfactant (AD-3, fluorine-based surfactant, MEGAFACE F551A, manufactured by DIC Corporation): 0.32 parts Organic solvent: mixed solvent of 1:1 (mass ratio) of 1-methoxy-2-propyl acetate and methyl ethyl ketone was added so that the concentration of solid contents of the coating liquid for forming a photosensitive layer was 29% by mass.

P-1

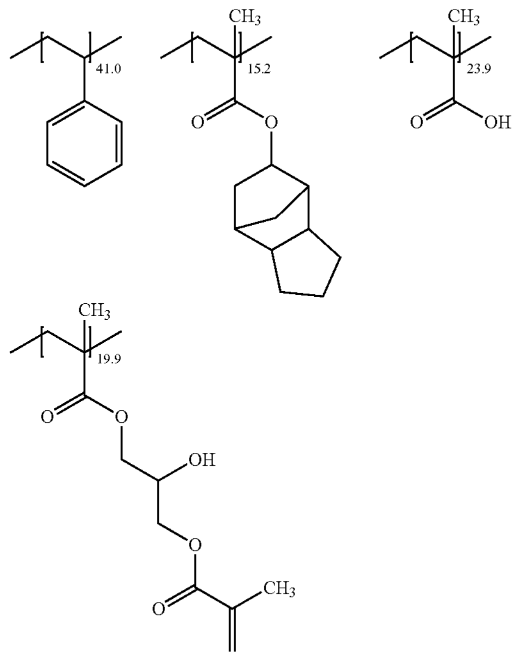

<<Formation of Second Resin Layer>>

Next, on the above-described photosensitive layer, a coating liquid for a second resin layer composed of the following formulation 201 was applied using a slit-shaped nozzle such that the thickness after drying was adjusted to 70 nm, and the solvent was removed by drying the coating liquid with a hot air convection dryer having a temperature gradient of 40° C. to 95° C. to form a second resin layer which was disposed to be directly adjacent to the photosensitive layer. The refractive index of the second resin layer was 1.68 at a wavelength of 550 nm at 25° C.

Here, the formulation 201 was prepared using a resin having an acid group, and an ammonia aqueous solution, and the resin having an acid group was neutralized with the ammonia aqueous solution to prepare the coating liquid for a second resin layer, which was an aqueous resin composition including an ammonium salt of the resin having an acid group.

—Coating Liquid for Second Resin Layer: Formulation 201 (Aqueous Resin Composition)—

Acrylic resin (ZB-015M, manufactured by FUJIFILM Fine Chemicals Co., Ltd., copolymer resin of methacrylic acid/allyl methacrylate, weight-average molecular weight: 25,000, compositional ratio (molar ratio)=20/80, solid content: 5.00%, ammonia aqueous solution): 4.92 parts Polyfunctional ethylenically unsaturated compound having a carboxylic acid group (ARONIX TO-2349, manufactured by Toagosei Co., Ltd.): 0.04 parts $ZrO_2$ particles (NanoUse OZ-S30M, solid content: 30.5%, methanol 69.5, refractive index: 2.2, average particle diameter: approximately 12 nm, manufactured by Nissan Chemical Corporation): 4.34 parts Rust inhibitor (benzotriazole derivative, BT-LX, manufactured by JOHOKU CHEMICAL CO., LTD.): 0.03 parts Surfactant (fluorine-based surfactant, MEGAFACE F444, manufactured by DIC Corporation): 0.01 parts Distilled water: 24.83 parts Methanol: 65.83 parts <Formation of Protective Film>>

For a laminate obtained as described above, in which the photosensitive layer and the second resin layer which was disposed to be directly adjacent to the photosensitive layer were provided on the temporary support in this order, a polyethylene terephthalate film (protective film, 16QS62 (16KS40) (manufactured by Toray Industries, Inc.)) having a thickness of 16 μm was pressure-bonded onto the second resin layer to produce a photosensitive transfer material (transfer film) of Example 1.

<Evaluation Method>

The obtained photosensitive transfer material was used and evaluated as follows.

<Evaluation of Rust Preventive Property>

After peeling off the protective film, the obtained photosensitive transfer material was laminated on one surface of a copper plate. In the laminating conditions, a laminating roll temperature was set as 110° C., a linear pressure was set as 3 N/cm, and a transportation speed was set as 2 m/min.

Thereafter, with regard to the obtained laminate before exposure, using a proximity type exposure machine (manufactured by Hitachi High-Tech Electronics Engineering Co., Ltd.) including an ultra-high pressure mercury lamp, a distance between a surface of an exposure mask (quartz exposure mask having a pattern for forming an overcoat, 1 mm line and space: 5 lines) and the temporary support was set to 125 μm, and pattern exposure was performed through the temporary support with an exposure amount of 100 $mJ/cm^2$ (i ray). After peeling off the temporary support, the laminate after pattern exposure was washed with a 2% aqueous solution of sodium carbonate at 32° C. for 60 seconds. After the washing, the residue was removed by injecting ultrapure water from an ultrapure water washing nozzle onto the copper substrate. Subsequently, air was blown to remove moisture on the copper substrate, and post-baking treatment was performed at 140° C. for 30 minutes.

Thereafter, the patterned sample was allowed to stand in an environment of 85° C. and 85% RH for 24 hours.

Discoloration of copper in a space portion of this pattern was visually confirmed.

In the following evaluation standard, A was the best rust preventive property and E was the worst. Any one of A, B, or C is preferable, A or B is more preferable, and A is particularly preferable.

A: same as the color of copper before treatment, no discoloration at all

B: slightly discolored red

C: discolored red

D: discolored blue

E: very discolored blue

<Rust Prevention Area>

In the above-described rust prevention evaluation, a vicinity of a portion on the copper plate 1 mm away from the cured film of the photosensitive resin composition was visually observed, and the range in which the effects of evaluations A to C in the above-described evaluation standard of rust preventive property were recognized was evaluated according to the following standard. In the following evaluation standard, A is preferable.

A: effect of rust preventive property was recognized even in a portion 1 mm or more away from the cured film.

B: portion where the effect of rust preventive property was recognized was only a portion less than 1 mm away from the cured film.

<Evaluation of Development Residue Inhibitory Property>

After peeling off the protective film, the obtained photosensitive transfer material was laminated on one surface of a copper plate. In the laminating conditions, a laminating roll temperature was set as 110° C., a linear pressure was set as 3 N/cm, and a transportation speed was set as 2 m/min.

Thereafter, with regard to the obtained laminate before exposure, using a proximity type exposure machine (manufactured by Hitachi High-Tech Electronics Engineering Co., Ltd.) including an ultra-high pressure mercury lamp, a distance between a surface of an exposure mask (quartz exposure mask having a pattern for forming an overcoat, 1 mm line and space: 5 lines) and the temporary support was set to 125 μm, and pattern exposure was performed through the temporary support with an exposure amount of 100 $mJ/cm^2$ (i ray).

After peeling off the temporary support, the laminate after pattern exposure was immersed in a 1% aqueous solution of sodium carbonate at 23° C. and allowed to stand for 45 seconds for development treatment. Thereafter, the laminate was allowed to stand in pure water at 23° C. for 25 seconds for washing treatment. Air was blown onto the copper substrate after the washing treatment with a blower to remove water droplets, and the sample was used as a sample for evaluating development residue inhibitory property.

Residue on the copper in a space portion of this pattern was visually confirmed.

In the following evaluation standard, A was the best development residue inhibitory property and E was the worst. It is preferable to be better evaluation.

A: there was no discoloration of copper, and no attachment on copper was confirmed.

B: copper was slightly reddish, and no attachment on copper was confirmed.

C: copper was reddish to some extent, and no attachment on copper was confirmed.

D: copper was reddish to some extent, and attachment on copper was sparsely confirmed.

E: copper was reddish to some extent, and attachment on copper was confirmed on the front surface.

<Evaluation of Substrate Adhesiveness (Adhesiveness)>

A copper substrate was used as a support, the protective film of the transfer film was peeled off on the copper substrate, and an exposed surface of the second resin layer was closely attached thereto and laminated to form a laminate A having a laminated structure of temporary support/photosensitive layer/second resin layer/copper substrate. In the laminating conditions at this time, a laminating roll temperature was set as 110° C., a linear pressure was set as 3 N/cm, and a transportation speed was set as 2 m/min.

The produced laminate A was exposed through the temporary support using a proximity type exposure machine (manufactured by Hitachi High-Tech Electronics Engineering Co., Ltd.) including an ultra-high pressure mercury lamp with an exposure amount of 100 $mJ/cm^2$ (i ray). After the exposure, the temporary support was peeled off.

After peeling off the temporary support, post-exposure was further performed with an exposure amount of 375 $mJ/cm^2$ (i ray), and post-baking was further performed at 145° C. for 30 minutes to prepare a sample for evaluation.

Using the above-described sample for evaluation, by a method compliant with JIS standard (K5400), a cross-cut test was carried out on a laminate in which 10×10 lattice cuts were formed.

Specifically, from the surface of the cured film of the photosensitive layer to the second resin layer of the laminate, cuts were formed in a lattice form of 1 mm×1 mm square using a cutter knife, and a transparent pressure-sensitive adhesive tape #600 (manufactured by 3M Japan) was pressure-bonded to the surface of the cured film of the photosensitive layer. One end of the bonded transparent pressure-sensitive adhesive tape was grasped and pulled in the direction of 180° along the surface of the cured film of the photosensitive layer to peel off the transparent pressure-sensitive adhesive tape.

Thereafter, a state of the surface (peeled surface) of the cured film of the photosensitive layer was visually observed, the ratio of the area of the peeled portion to the total area of the region in which the cuts were formed in a lattice form was calculated, and the evaluation was performed according to the following evaluation standard based on the calculated value.

In the evaluation standard, A is the best and E is the worst.

—Evaluation Standard—

A: cured film and second resin layer of the photosensitive layer, which were 100% of the total area, remained while being closely attached to each other.

B: cured film and second resin layer of the photosensitive layer, which were 95% or more and less than 100% of the total area, remained while being closely attached to each other.

C: cured film and second resin layer of the photosensitive layer, which were 65% or more and less than 95% of the total area, remained while being closely attached to each other.

D: cured film and second resin layer of the photosensitive layer, which were 35% or more and less than 65% of the total area, remained while being closely attached to each other.

E: portion where the cured film and second resin layer of the photosensitive layer remained while being closely attached to each other was less than 35% of the total area.

<Measurement of Storage Elastic Modulus>

The storage elastic modulus of the photosensitive resin composition at 100° C. was measured by the following method.

A rheometer (Discovery HR-2) manufactured by TA Instruments was used for measuring the storage elastic modulus. In addition, a 20 mmφ parallel plate was used as a jig for a sample fixing.

On a polyethylene terephthalate film (temporary support, 16QS62 (16KS40) (manufactured by Toray Industries, Inc.)) having a thickness of 16 μm, a coating liquid for a photosensitive layer was applied using a slit-shaped nozzle such that the thickness after drying was adjusted to 10 μm, and the solvent was removed by drying the coating liquid with a hot air convection dryer having a temperature gradient of 75° C. to 120° C. to form a photosensitive layer. This operation was repeated 50 times to be laminated, thereby obtaining a sample having a film thickness of approximately 500 μm.

The produced sample was placed between the plates, and the sample was closely attached to the plates. Dynamic viscoelasticity was measured at a heating rate of 5° C./min in a temperature range of 20° C. to 125° C. in a shear mode, frequency of 1.0 Hz, and a strain of 0.5% to obtain a storage elastic modulus G' (Pa) at 100° C.

Examples 2 to 40 and Comparative Examples 1 to 5

A photosensitive resin composition and a transfer film were produced in the same manner as in Example 1, respectively, except that the type and content (solid content) of each component other than the solvent were changed as shown in Tables 1 to 4.

In addition, each evaluation was performed in the same manner as in Example 1 using the obtained photosensitive transfer material.

Examples 41 to 44

A photosensitive resin composition and a transfer film were produced in the same manner as in Example 1, respectively, except that the type and content (solid content) of each component other than the solvent were changed as shown in Table 4, and in Examples 41 and 43, the coating liquid for the second resin layer was prepared according to the following formulation 202, and in Examples 42 and 44, the coating liquid for the second resin layer was prepared according to the following formulation 203.

In addition, each evaluation was performed in the same manner as in Example 1 using the obtained photosensitive transfer material.

The formulation 202 and the formulation 203 in the preparation of the coating liquid for the second resin layer are shown below.

—Coating Liquid for Second Resin Layer: Formulation 202 (Aqueous Resin Composition)—

- Acrylic resin (ZB-015M, manufactured by FUJIFILM Fine Chemicals Co., Ltd., copolymer resin of methacrylic acid/allyl methacrylate, weight-average molecular weight: 25,000, compositional ratio (molar ratio)=20/80, solid content: 5.00%, ammonia aqueous solution): 4.92 parts
- Polyfunctional ethylenically unsaturated compound having a carboxylic acid group (ARONIX TO-2349, manufactured by Toagosei Co., Ltd.): 0.04 parts
- $ZrO_2$ particles (NanoUse OZ-S30M, solid content: 30.5%, methanol 69.5, refractive index: 2.2, average particle diameter: approximately 12 nm, manufactured by Nissan Chemical Corporation): 4.34 parts
- Additive (adenine, manufactured by Tokyo Chemical Industry Co., Ltd.): 0.03 parts
- Additive (N-methyldiethanolamine, manufactured by Tokyo Chemical Industry Co., Ltd.): 0.03 parts
- Surfactant (fluorine-based surfactant, MEGAFACE F444, manufactured by DIC Corporation): 0.01 parts
- Distilled water: 24.83 parts
- Methanol: 65.83 parts —Coating Liquid for Second Resin Layer: Formulation 203 (Aqueous Resin Composition)—

- Acrylic resin (ZB-015M, manufactured by FUJIFILM Fine Chemicals Co., Ltd., copolymer resin of methacrylic acid/allyl methacrylate, weight-average molecular weight: 25,000, compositional ratio (molar ratio)=20/80, solid content: 5.00%, ammonia aqueous solution): 4.92 parts
- Polyfunctional ethylenically unsaturated compound having a carboxylic acid group (ARONIX TO-2349, manufactured by Toagosei Co., Ltd.): 0.04 parts
- $ZrO_2$ particles (NanoUse OZ-S30M, solid content: 30.5%, methanol 69.5, refractive index: 2.2, average particle diameter: approximately 12 nm, manufactured by Nissan Chemical Corporation): 4.34 parts
- Additive (pyrimidine, manufactured by Tokyo Chemical Industry Co., Ltd.): 0.03 parts
- Additive (N-methyldiethanolamine, manufactured by Tokyo Chemical Industry Co., Ltd.): 0.03 parts
- Surfactant (fluorine-based surfactant, MEGAFACE F444, manufactured by DIC Corporation): 0.01 parts
- Distilled water: 24.83 parts
- Methanol: 65.83 parts

Examples 45 to 48

A photosensitive resin composition and a transfer film were produced in the same manner as in Example 1, respectively, except that the type and content (solid content) of each component other than the solvent were changed as shown in Table 5, the thickness of the photosensitive layer after drying was changed to 5.5 μm, the coating liquid for the second resin layer was prepared according to the following formulation 204, and the second resin layer was changed to be formed as follows.

In addition, each evaluation was performed in the same manner as in Example 1 using the obtained photosensitive transfer material.

—Coating Liquid for Second Resin Layer: Formulation 204 (Aqueous Resin Composition)—

Binder Polymer

- Copolymer resin of methacrylic acid/allyl methacrylate (Mw: 38,000, compositional ratio (molar ratio)=20/80): 12.85 parts
- ARUFON UC-3920 (manufactured by Toagosei Co., Ltd.): 0.47 parts
  - Polyfunctional ethylenically unsaturated compound having a carboxylic acid group (ARONIX TO-2349, manufactured by Toagosei Co., Ltd.): 2.00 parts
  - $ZrO_2$ particles (NanoUse OZ-S30M, refractive index: 2.2, average particle diameter: approximately 12 nm, manufactured by Nissan Chemical Corporation): 80.00 parts
  - Additive 1 (N-methyldiethanolamine): 2.00 parts
  - Additive 2 (adenine): 2.00 parts
  - Surfactant (fluorine-based surfactant, MEGAFACE F444, manufactured by DIC Corporation): 0.68 parts Solvent: mixed solvent of 7:3 (mass ratio) of methanol and distilled water was added so that the concentration of solid contents of the coating liquid for the second resin layer was 1.66% by mass.

<<Formation of Second Resin Layer>>

On the photosensitive layer, a coating liquid for a second resin layer composed of the formulation 204 was applied using a slit-shaped nozzle such that the thickness after drying was adjusted to 73 nm, and the solvent was removed by drying the coating liquid with a hot air convection dryer having a temperature gradient of 40° C. to 95° C. to form a second resin layer which was disposed to be directly adjacent to the photosensitive layer. The refractive index of the second resin layer was 1.68 at a wavelength of 550 nm at 25° C.

Here, the formulation 204 was prepared using a resin having an acid group, and an ammonia aqueous solution, and the resin having an acid group was neutralized with the ammonia aqueous solution to prepare the coating liquid for a second resin layer, which was an aqueous resin composition including an ammonium salt of the resin having an acid group.

Example 49

A photosensitive resin composition and a transfer film were produced in the same manner as in Example 1, respectively, except that the type and content (solid content) of each component other than the solvent were changed as shown in Table 5, the thickness of the photosensitive layer after drying was changed to 3.5 nm, the coating liquid for the second resin layer was prepared according to the formulation 204, and the second resin layer was changed to be formed as above.

In addition, each evaluation was performed in the same manner as in Example 1 using the obtained photosensitive transfer material.

Example 50

A photosensitive resin composition and a transfer film were produced in the same manner as in Example 1, respectively, except that the type and content (solid content) of each component other than the solvent were changed as shown in Table 5, the thickness of the photosensitive layer after drying was changed to 6.5 nm, the coating liquid for the second resin layer was prepared according to the formulation 204, and the second resin layer was changed to be formed as above.

In addition, each evaluation was performed in the same manner as in Example 1 using the obtained photosensitive transfer material.

The evaluation results are summarized in Tables 1 to 5.

TABLE 1

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Ethylenically unsaturated compound | M-1 | 8.41% | 8.41% | 8.41% | 8.41% | 8.41% | 8.41% | 8.41% | 8.41% | 8.41% | 8.41% | 8.41% | 8.41% | 8.41% | 8.41% | 8.41% |
| | M-2 | — | — | — | — | — | — | — | — | — | — | — | — | — | — | — |
| | M-3 | 16.83% | 16.83% | 16.83% | 16.83% | 16.83% | 16.83% | 16.83% | 16.83% | 16.83% | 16.83% | 16.83% | 16.83% | 16.83% | 16.83% | 16.83% |
| | M-4 | 2.80% | 2.80% | 2.80% | 2.80% | 2.80% | 2.80% | 2.80% | 2.80% | 2.80% | 2.80% | 2.80% | 2.80% | 2.80% | 2.80% | 2.80% |
| | M-5 | — | — | — | — | — | — | — | — | — | — | — | — | — | — | — |
| Alkali-soluble binder polymer | P-1 | 56.32% | 56.32% | 56.32% | 56.32% | 56.32% | 56.32% | 56.32% | 56.32% | 56.32% | 56.32% | 56.32% | 56.32% | 56.32% | 56.32% | 56.32% |
| | P-2 | — | — | — | — | — | — | — | — | — | — | — | — | — | — | — |
| Photo-polymer-ization initiator | D-1 | 0.32% | 0.32% | 0.32% | 0.32% | 0.32% | 0.32% | 0.32% | 0.32% | 0.32% | 0.32% | 0.32% | 0.32% | 0.32% | 0.32% | 0.32% |
| | D-2 | 0.64% | 0.64% | 0.64% | 0.64% | 0.64% | 0.64% | 0.64% | 0.64% | 0.64% | 0.64% | 0.64% | 0.64% | 0.64% | 0.64% | 0.64% |
| | D-3 | — | — | — | — | — | — | — | — | — | — | — | — | — | — | — |
| | D-4 | — | — | — | — | — | — | — | — | — | — | — | — | — | — | — |
| | D-5 | — | — | — | — | — | — | — | — | — | — | — | — | — | — | — |
| Thermal crosslinking compound | E-1 | — | — | — | — | — | — | — | — | — | — | — | — | — | — | — |
| | E-2 | — | — | — | — | — | — | — | — | — | — | — | — | — | — | — |
| | E-3 | 12.50% | 12.50% | 12.50% | 12.50% | 12.50% | 12.50% | 12.50% | 12.50% | 12.50% | 12.50% | 12.50% | 12.50% | 12.50% | 12.50% | 12.50% |
| Compound A | Pyridine-2-carboxylic acid | 0.69% | — | — | — | — | — | — | — | — | — | — | — | — | — | — |
| | Pyridine-3-carboxylic acid (nicotinic acid) | — | 0.69% | — | — | — | — | — | — | — | — | — | — | — | — | — |
| | 2-Hydroxypyri-dine | — | — | 0.69% | — | — | — | — | — | — | — | — | — | — | — | — |
| | 2-Mercapto-pyridine | — | — | — | 0.69% | — | — | — | — | — | — | — | — | — | — | — |
| | 2-Aminopyridine | — | — | — | — | 0.69% | — | — | — | — | — | — | — | — | — | — |
| | 2,3-Dihydroxy-pyridine | — | — | — | — | — | 0.69% | — | — | — | — | — | — | — | — | — |
| | Pyridine-2-hydroxy-3-carboxylic acid | — | — | — | — | — | — | 0.69% | — | — | — | — | — | — | — | — |
| | 2-Amino-pyrimidine | — | — | — | — | — | — | — | 0.69% | — | — | — | — | — | — | — |
| | 4-Hydroxy-pyrimidine | — | — | — | — | — | — | — | — | 0.69% | — | — | — | — | — | — |
| | Pyrimidine-4- | — | — | — | — | — | — | — | — | — | 0.69% | — | — | — | — | — |

TABLE 1-continued

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| | carboxylic acid | | | | | | | | | | | | | | | |
| | 4,6-Dihydroxy-pyrimidine | — | — | — | — | — | — | — | — | — | — | 0.69% | — | — | — | — |
| | Pyrazole-4-carboxylic acid | — | — | — | — | — | — | — | — | — | — | — | 0.69% | — | — | — |
| | 5-Benzotriazole-carboxylic acid | — | — | — | — | — | — | — | — | — | — | — | — | 0.69% | — | — |
| | 2,6-Dihydroxy-isonicotinic acid | — | — | — | — | — | — | — | — | — | — | — | — | — | 0.69% | — |
| | Cyanulic acid (trihydroxytria-zine) | — | — | — | — | — | — | — | — | — | — | — | — | — | — | 0.69% |
| Other additives | AD-1 | 0.10% | 0.10% | 0.10% | 0.10% | 0.10% | 0.10% | 0.10% | 0.10% | 0.10% | 0.10% | 0.10% | 0.10% | 0.10% | 0.10% | 0.10% |
| | AD-2 | 1.20% | 1.20% | 1.20% | 1.20% | 1.20% | 1.20% | 1.20% | 1.20% | 1.20% | 1.20% | 1.20% | 1.20% | 1.20% | 1.20% | 1.20% |
| | AD-3 | 0.19% | 0.19% | 0.19% | 0.19% | 0.19% | 0.19% | 0.19% | 0.19% | 0.19% | 0.19% | 0.19% | 0.19% | 0.19% | 0.19% | 0.19% |
| Evaluation result | Rust preventive property | A | A | A | C | B | A | A | B | A | A | A | B | B | B | B |
| | Rust prevention area | A | A | A | A | A | A | B | A | A | A | A | A | A | B | B |
| | Development residue inhibitory property | A | A | B | C | C | B | A | C | B | A | B | A | A | A | A |
| | Adhesiveness | A | A | A | B | B | A | A | B | A | A | A | A | A | A | B |
| | Storage elastic modulus P ($10^2$ Pa) | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| | $P/W^A$ | 0.72 | 0.72 | 0.72 | 0.72 | 0.72 | 0.72 | 0.72 | 0.72 | 0.72 | 0.72 | 0.72 | 0.72 | 0.72 | 0.72 | 0.72 |

TABLE 2

| | | Example | | | | | | | | | | | | | | |
|---|---|---|---|---|---|---|---|---|---|---|---|---|---|---|---|---|
| | | 16 | 17 | 18 | 19 | 20 | 21 | 22 | 23 | 24 | 25 | 26 | 27 | 28 | 29 | 30 |
| Ethylenically unsaturated compound | M-1 | 8.41% | 8.41% | 8.41% | 7.00% | 9.00% | — | 8.41% | 8.41% | 8.41% | 8.41% | 8.41% | 8.41% | 8.41% | 8.41% | 8.41% |
| | M-2 | — | — | — | — | — | 8.41% | 16.83% | 16.83% | — | — | — | — | — | — | — |
| | M-3 | 16.83% | 16.83% | 16.83% | 15.50% | 18.00% | 16.83% | — | — | 16.83% | 16.83% | 16.83% | 16.83% | 16.83% | 16.83% | 16.83% |
| | M-4 | 2.80% | 2.80% | 2.80% | 2.50% | 3.00% | 2.80% | 2.80% | — | 2.80% | 2.80% | 2.80% | 2.80% | 2.80% | 2.80% | 2.80% |
| | M-5 | — | — | — | — | — | — | — | 2.80% | — | — | — | — | — | — | — |
| Alkali-soluble binder polymer | P-1 | 56.91% | 56.01% | 55.51% | 59.36% | 54.36% | 56.32% | 56.32% | 56.32% | — | 56.32% | 56.28% | 56.18% | 56.32% | 56.32% | 54.82% |
| | P-2 | — | — | — | — | — | — | — | — | 56.32% | — | — | — | — | — | — |
| Photopoly-merization initiator | D-1 | 0.32% | 0.32% | 0.32% | 0.32% | 0.32% | 0.32% | 0.32% | 0.32% | 0.32% | — | — | — | 0.32% | 0.32% | 0.32% |
| | D-2 | 0.64% | 0.64% | 0.64% | 0.64% | 0.64% | 0.64% | 0.64% | 0.64% | 0.64% | — | — | — | 0.64% | 0.64% | 0.64% |
| | D-3 | — | — | — | — | — | — | — | — | — | — | 1.00% | — | — | — | — |
| | D-4 | — | — | — | — | — | — | — | — | — | — | — | 1.10% | — | — | — |
| | D-5 | — | — | — | — | — | — | — | — | — | 0.96% | — | — | — | — | — |
| Thermal crosslinking compound | E-1 | — | — | — | — | — | — | — | — | — | | — | — | — | 12.50% | 14.00% |
| | E-2 | — | — | — | — | — | — | — | — | — | | — | — | 12.50% | — | — |
| | E-3 | 12.50% | 12.50% | 12.50% | 12.50% | 12.50% | 12.50% | 12.50% | 12.50% | 12.50% | 12.50% | 12.50% | 12.50% | — | — | — |
| Compound A | Pyridine-2-carboxylic acid | — | — | — | — | — | — | — | — | — | — | — | — | — | — | — |
| | Pyridine-3-carboxylic acid (nicotinic acid) | 0.10% | 1.00% | 1.50% | 0.69% | 0.69% | 0.69% | 0.69% | — | — | 0.69% | 0.69% | 0.69% | 0.69% | 0.69% | 0.69% |
| | 2-Aminopyridine | — | — | — | — | — | — | — | 0.69% | 0.69% | — | — | — | — | — | — |
| Other additives | AD-1 | 0.10% | 0.10% | 0.10% | 0.10% | 0.10% | 0.10% | 0.10% | 0.10% | 0.10% | 0.10% | 0.10% | 0.10% | 0.10% | 0.10% | 0.10% |
| | AD-2 | 1.20% | 1.20% | 1.20% | 1.20% | 1.20% | 1.20% | 1.20% | 1.20% | 1.20% | 1.20% | 1.20% | 1.20% | 1.20% | 1.20% | 1.20% |
| | AD-3 | 0.19% | 0.19% | 0.19% | 0.19% | 0.19% | 0.19% | 0.19% | 0.19% | 0.19% | 0.19% | 0.19% | 0.19% | 0.19% | 0.19% | 0.19% |
| Evaluation result | Rust preventive property | A | A | A | A | A | A | A | B | C | A | A | A | A | A | A |
| | Rust prevention area | B | A | A | A | A | A | A | A | A | A | A | A | A | A | A |
| | Development residue inhibitory property | A | A | A | A | A | A | A | D | C | A | A | A | A | A | A |
| | Adhesiveness | B | A | A | A | A | A | A | A | C | A | A | A | A | A | A |
| | Storage elastic modulus P ($10^2$ Pa) | 0.5 | 0.5 | 0.5 | 2 | 0.2 | 0.5 | 0.5 | 0.5 | 5 | 0.5 | 0.5 | 0.5 | 0.5 | 0.5 | 0.5 |
| | $P/W^A$ | 5.00 | 0.50 | 0.33 | 2.90 | 0.29 | 0.72 | 0.72 | 0.72 | 7.25 | 0.72 | 0.72 | 0.72 | 0.72 | 0.72 | 0.72 |

TABLE 3

| | | Example | | Comparative example | | | | |
|---|---|---|---|---|---|---|---|---|
| | | 31 | 32 | 1 | 2 | 3 | 4 | 5 |
| Ethylenically unsaturated compound | M-1 | 8.41% | 8.41% | 8.41% | 8.41% | 8.41% | 8.41% | 8.41% |
| | M-2 | — | — | — | — | — | — | — |
| | M-3 | 16.83% | 16.83% | 16.83% | 16.83% | 16.83% | 16.83% | 16.83% |
| | M-4 | 2.80% | 2.80% | 2.80% | 2.80% | 2.80% | 2.80% | 2.80% |
| | M-5 | — | — | — | — | — | — | — |
| Alkali-soluble binder polymer | P-1 | 68.82% | 57.81% | 56.32% | 56.32% | 56.32% | 56.32% | 56.32% |
| | P-2 | — | — | — | — | — | — | — |
| Photopolymerization initiator | D-1 | 0.32% | 0.32% | 0.32% | 0.32% | 0.32% | 0.32% | 0.32% |
| | D-2 | 0.64% | 0.64% | 0.64% | 0.64% | 0.64% | 0.64% | 0.64% |
| | D-3 | — | — | — | — | — | — | — |
| | D-4 | — | — | — | — | — | — | — |
| | D-5 | — | — | — | — | — | — | — |
| Thermal crosslinking compound | E-1 | — | — | — | — | — | — | — |
| | E-2 | — | — | — | — | — | — | — |
| | E-3 | — | 12.50% | 12.50% | 12.50% | 12.50% | 12.50% | 12.50% |
| Compound A | Pyridine-3-carboxylic acid (nicotinic acid) | — | 0.69% | — | — | — | — | — |
| | 2-Aminopyridine | 0.69% | — | — | — | — | — | — |
| Rust inhibitor | Benzimidazole | — | — | 0.69% | — | — | — | — |
| | Benzotriazole | — | — | — | 0.69% | — | — | — |
| | Pyridine | — | — | — | — | 0.69% | — | — |
| | Pyrimidine | — | — | — | — | — | 0.69% | — |
| | 1,3,5-Triazine | — | — | — | — | — | — | 0.69% |
| Other additives | AD-1 | 0.10% | — | 0.10% | 0.10% | 0.10% | 0.10% | 0.10% |
| | AD-2 | 1.20% | — | 1.20% | 1.20% | 1.20% | 1.20% | 1.20% |
| | AD-3 | 0.19% | — | 0.19% | 0.19% | 0.19% | 0.19% | 0.19% |
| Evaluation result | Rust preventive property | C | A | E | E | E | E | E |
| | Rust prevention area | A | A | B | B | B | B | B |
| | Development residue inhibitory property | C | A | E | E | E | E | E |
| | Adhesiveness | C | A | A | A | C | C | C |
| | Storage elastic modulus P ($10^2$ Pa) | 0.5 | 0.5 | 0.5 | 0.5 | 0.5 | 0.5 | 0.5 |
| | $P/W^4$ | 0.72 | 0.72 | 0.72 | 0.72 | 0.72 | 0.72 | 0.72 |

TABLE 4

| | | Example | | | | | | | | | | | |
|---|---|---|---|---|---|---|---|---|---|---|---|---|---|
| | | 33 | 34 | 35 | 36 | 37 | 38 | 39 | 40 | 41 | 42 | 43 | 44 |
| Ethylenically unsaturated compound | M-1 | 8.41% | 8.41% | 8.41% | 8.41% | 8.41% | 8.41% | 2.73% | 2.73% | 2.73% | 2.73% | 2.73% | 2.73% |
| | M-2 | — | — | — | — | — | — | — | — | — | — | — | — |
| | M-3 | 16.83% | 16.83% | 16.83% | 16.83% | 16.83% | 16.83% | 17.90% | 17.90% | 17.90% | 17.90% | 17.90% | 17.90% |
| | M-4 | 2.80% | 2.80% | 2.80% | 2.80% | 2.80% | 2.80% | 2.98% | 2.98% | 2.98% | 2.98% | 2.98% | 2.98% |
| | M-5 | — | — | — | — | — | — | — | — | — | — | — | — |
| | DPHA | — | — | — | — | — | — | 7.99% | 7.99% | 7.99% | 7.99% | 7.99% | 7.99% |
| Alkali-soluble binder polymer | P-1 | 56.32% | 56.32% | 56.32% | 56.32% | 56.32% | 56.32% | 52.67% | 52.67% | 52.67% | 52.67% | 52.67% | 52.67% |
| | P-2 | — | — | — | — | — | — | — | — | — | — | — | — |
| Photopolymerization initiator | D-1 | 0.32% | 0.32% | 0.32% | 0.32% | 0.32% | 0.32% | 0.36% | 0.36% | 0.36% | 0.36% | 0.36% | 0.36% |
| | D-2 | 0.64% | 0.64% | 0.64% | 0.64% | 0.64% | 0.64% | 0.73% | 0.73% | 0.73% | 0.73% | 0.73% | 0.73% |
| | D-3 | — | — | — | — | — | — | — | — | — | — | — | — |
| | D-4 | — | — | — | — | — | — | — | — | — | — | — | — |
| | D-5 | — | — | — | — | — | — | — | — | — | — | — | — |
| Thermal crosslinking compound | E-1 | — | — | — | — | — | — | — | — | — | — | — | — |
| | E-2 | — | — | — | — | — | — | — | — | — | — | — | — |
| | E-3 | 12.50% | 12.50% | 12.50% | 12.50% | 12.50% | 12.50% | 12.50% | 12.50% | 12.50% | 12.50% | 12.50% | 12.50% |
| Compound A | Nicotinamide | 0.69% | — | — | — | — | — | — | — | — | — | — | — |
| | 6-Methylnicotinamide | — | 0.69% | — | — | — | — | — | — | — | — | — | — |
| | Isonicotinamide | — | — | 0.69% | 1.00% | 1.50% | — | 0.52% | 0.45% | 0.52% | 0.52% | 0.45% | 0.45% |
| | 2-Aminoisonicotinamide | — | — | — | — | — | 0.69% | — | — | — | — | — | — |
| Rust inhibitor | Benzimidazole | — | — | — | — | — | — | 0.13% | — | 0.13% | 0.13% | — | — |
| | Benzotriazole | — | — | — | — | — | — | — | 0.20% | — | — | 0.20% | 0.20% |
| Other additives | AD-1 | 0.10% | 0.10% | 0.10% | 0.10% | 0.10% | 0.10% | 0.10% | 0.10% | 0.10% | 0.10% | 0.10% | 0.10% |
| | AD-2 | 1.20% | 1.20% | 1.20% | 1.20% | 1.20% | 1.20% | 1.20% | 1.20% | 1.20% | 1.20% | 1.20% | 1.20% |
| | AD-3 | 0.19% | 0.19% | 0.19% | 0.19% | 0.19% | 0.19% | 0.19% | 0.19% | 0.19% | 0.19% | 0.19% | 0.19% |
| Evaluation result | Rust preventive property | A | A | A | A | A | A | A | A | A | A | A | A |
| | Rust prevention area | A | A | A | A | A | A | A | A | A | A | A | A |
| | Development residue inhibitory property | A | A | A | A | A | A | A | A | A | A | A | A |

TABLE 4-continued

| | Example | | | | | | | | | | | |
|---|---|---|---|---|---|---|---|---|---|---|---|---|
| | 33 | 34 | 35 | 36 | 37 | 38 | 39 | 40 | 41 | 42 | 43 | 44 |
| Adhesiveness | A | A | A | A | A | A | A | A | A | A | A | A |
| Storage elastic modulus P ($10^2$ Pa) | 0.5 | 0.5 | 0.5 | 0.5 | 0.5 | 0.5 | 0.5 | 0.5 | 0.5 | 0.5 | 0.5 | 0.5 |
| P/$W^A$ | 0.72 | 0.72 | 0.72 | 0.50 | 0.33 | 0.72 | 0.72 | 0.72 | 0.72 | 0.72 | 0.72 | 0.72 |

TABLE 5

| | | Example | | | | | |
|---|---|---|---|---|---|---|---|
| | | 45 | 46 | 47 | 48 | 49 | 50 |
| Ethylenically unsaturated compound | M-1 | 2.73% | 2.73% | 2.79% | — | — | 8.41% |
| | M-2 | — | — | — | — | — | — |
| | M-3 | 17.90% | 17.90% | 9.13% | — | — | 16.83% |
| | M-4 | 2.98% | 2.98% | 3.04% | 2.80% | 3.04% | 3.04% |
| | M-5 | — | — | — | — | — | — |
| | DPHA | 7.99% | 7.99% | 17.28% | — | 17.28% | 17.28% |
| Alkali-soluble binder polymer | P-1 | 52.67% | 52.50% | — | 56.32% | — | — |
| | P-3 | — | — | 49.04% | — | 49.04% | 49.04% |
| Photopolymerization initiator | D-1 | 0.36% | 0.36% | 0.37% | 0.32% | 0.37% | 0.37% |
| | D-2 | 0.73% | 0.73% | — | 0.64% | — | — |
| | D-6 | — | — | 0.74% | — | 0.74% | 0.74% |
| Thermal crosslinking compound | E-3 | 12.50% | 12.50% | 12.50% | 12.50% | 12.50% | 12.50% |
| | E-4 | — | — | 2.97% | — | 2.97% | 2.97% |
| Compound A | Nicotinamide | — | 0.17% | — | — | — | — |
| | 6-Methylnicotinamide | — | — | — | — | — | — |
| | Isonicotinamide | 0.52% | 0.52% | 0.52% | 1.50% | 0.52% | 0.52% |
| | 2-Aminoisonicotinamide | — | — | — | — | — | — |
| Rust inhibitor | Benzimidazole | 0.13% | 0.13% | 0.13% | — | 0.13% | 0.13% |
| | Benzotriazole | — | — | — | — | — | — |
| Other additives | AD-1 | 0.10% | 0.10% | 0.10% | 0.10% | 0.10% | 0.10% |
| | AD-2 | 1.20% | 1.20% | 1.20% | 1.20% | 1.20% | 1.20% |
| | AD-3 | 0.19% | 0.19% | 0.18% | 0.19% | 0.18% | 0.18% |
| Evaluation result | Rust preventive property | A | A | A | A | A | A |
| | Rust prevention area | A | A | A | A | A | A |
| | Development residue inhibitory property | A | A | A | A | A | A |
| | Adhesiveness | A | A | A | A | A | A |
| | Storage elastic modulus P ($10^2$ Pa) | 0.5 | 0.5 | 0.5 | 0.5 | 0.5 | 0.5 |
| | P/$W^A$ | 0.72 | 0.72 | 0.72 | 0.33 | 0.72 | 0.72 |

The storage elastic modulus P in Tables 1 to 5 represents the storage elastic modulus (unit: $10^2$ Pa) of the obtained photosensitive resin composition at 100° C.

In addition, the compounds used as the compound A in Examples are all manufactured by Tokyo Chemical Industry Co., Ltd.

The abbreviations shown in Tables 1 to 5 other than those described above are as follows.

M-2: dipentaerythritol hexaacrylate (A-DPH, manufactured by Shin-Nakamura Chemical Co., Ltd.)

M-5: urethane acrylate 8UX-015A (manufactured by Taisei Fine Chemical Co., Ltd.)

DPHA: dipentaerythritol hexaacrylate (manufactured by Toshin Yushi Co., Ltd.)

P-2: resin shown below (ratio of each constitutional unit is a molar ratio), Mw=29,000

P-2

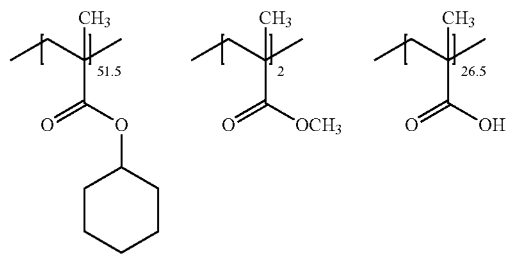

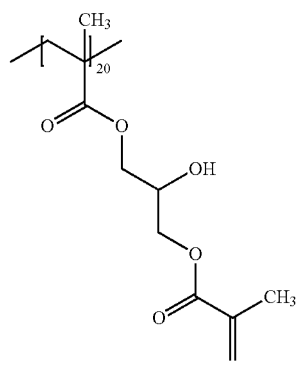

P-3: resin shown below; constitutional unit derived from styrene (St)/constitutional unit derived from methacrylic acid (MAA)/constitutional unit obtained by adding glycidyl methacrylate to a constitutional unit derived from methacrylic acid (GMA-MAA)/methyl methacrylate=55.1/26.5/16.85/1.6 (mol %), Mw=17,000

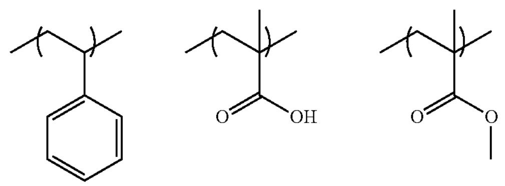

-continued

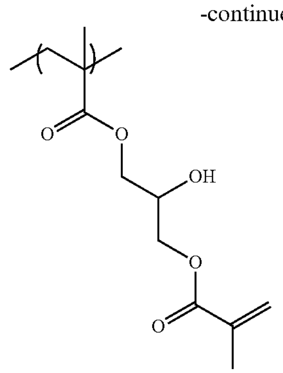

D-3: 1-[4-(phenylthio)phenyl]-1,2-octanedione-2-(O-benzoyloxime) (IRGACURE OXE-01, manufactured by BASF SE)

D-4: [8-[5-(2,4,6-trimethylphenyl)-11-(2-ethylhexyl)-11H-benzo[a]carbazoyl][2-(2,2,3,3-tetrafluoro propoxy)phenyl]methanone-(O-acetyloxime) (IRGACURE OXE-03, manufactured by BASF SE)

D-5: 2-(dimethylamino)-2-[(4-methylphenyOmethyl]-1-[4-(4-morpholinyl)phenyl]-1-butanone (IRGACURE 379EG, manufactured by BASF SE)

D-6: 1-(biphenyl-4-yl)-2-methyl-2-morpholinopropan-1-one (APi 307, manufactured by Shenzhen UV ChemTech Co., Ltd.)

E-1: Karenz AOI-BM (photopolymerizable blocked isocyanate compound, 2-(O-[1'-methylpropylideneamino] carboxyamino) ethyl acrylate, manufactured by SHOWA DENKO K.K.)

E-2: Karenz MOI-BM (photopolymerizable blocked isocyanate compound, 2-(O-[1'-methylpropylideneamino] carboxyamino) ethyl methacrylate, manufactured by SHOWA DENKO K.K.)

E-4: compound having the following structure

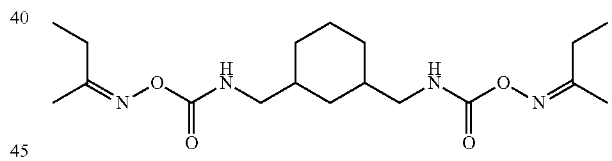

From the results shown in Tables 1 to 5, as compared with the photosensitive resin compositions of Comparative Examples 1 to 5, in the photosensitive resin compositions of Examples 1 to 50, which were the photosensitive resin composition according to the embodiment of the present disclosure, it was found that the development residue inhibitory property and the rust preventive property for exposed wire around a film or a cured film to be obtained after a heat treatment were excellent.

Further, from the results shown in Tables 1 to 5, in the photosensitive resin compositions of Examples 1 to 50, which were the photosensitive resin composition according to the embodiment of the present disclosure, it was found that the range in which the above-described rust preventive effect could be obtained was wide and the substrate adhesiveness was also excellent.

Example 101

A photosensitive resin composition and a photosensitive transfer film were produced in the same manner as in Example 1, except that, in Example 1, the second resin layer was not formed, and each evaluation was performed. The evaluation results were the same as in Example 1.

Examples 102 to 150

A photosensitive resin composition and a photosensitive transfer film were produced in the same manner as in Example 101, respectively, except that the type and content (solid content) of each component were changed as described in Examples 2 to 50 shown in Tables 1 to 5. The evaluation results were the same as in Examples 2 to 50, respectively.

Examples 201A to 201D

A transfer film and a laminate were produced in the same manner as in Example 1, except that the temporary support and the protective film in Example 1 were changed as shown in Table 6, and the transfer film and the laminate were evaluated in the same manner as in Example 1. All had the same evaluation results as in Example 1.

TABLE 6

| Example | Temporary support | Protective film |
|---|---|---|
| 201A | LUMIRROR (registered trademark) 16FB40 (manufactured by Toray Industries, Inc.) | LUMIRROR (registered trademark) 16FB40 (manufactured by Toray Industries, Inc.) |
| 201B | LUMIRROR (registered trademark) 16FB40 (manufactured by Toray Industries, Inc.) | ALPHAN (registered trademark) FG-201 (manufactured by Oji F-Tex Co., Ltd.) |
| 201C | LUMIRROR (registered trademark) 16FB40 (manufactured by Toray Industries, Inc.) | ALPHAN (registered trademark) E-201F (manufactured by Oji F-Tex Co., Ltd.) |
| 201D | COSMOSHINE (registered trademark) A4100 (film thickness: 50 μm, manufactured by TOYOBO Co., Ltd.) | ALPHAN (registered trademark) FG-201 (manufactured by Oji F-Tex Co., Ltd.) |

Examples 202 to 250

The temporary support and protective film of Examples 201A to 201D were changed with respect to Example 1 for Examples 2 to 50 to produce a transfer film and a laminate, and the transfer film and the laminate were evaluated in the same manner as in Example 1. In each case, the evaluation results were the same as in Examples before the change of the temporary support and protective film.

Examples 301 to 350

<Production of Transparent Laminate>

A substrate in which a second refractive index adjusting layer, an ITO transparent electrode pattern, and copper lead wire were formed on a cycloolefin transparent film was prepared.

Using the transfer films of Examples 1 to 50 (corresponding to Examples 301 to 350, respectively) from which the protective film was peeled off, the second refractive index adjusting layer, the ITO transparent electrode pattern, and the copper lead wire were laminated at a position covered by the transfer film. The laminating was performed using a vacuum laminator manufactured by MCK under conditions of a cycloolefin transparent film temperature: 40° C., a rubber roller temperature: 100° C., a linear pressure: 3 N/cm, and a transportation speed: 2 m/min.

Thereafter, using a proximity type exposure machine (manufactured by Hitachi High-Tech Electronics Engineering Co., Ltd.) including an ultra-high pressure mercury lamp, a surface of an exposure mask (quartz exposure mask having a pattern for forming an overcoat) and the temporary support were closely attached, and the laminate was exposed in a patterned shape with an exposure amount of 100 $mJ/cm^2$ (i ray) through the temporary support.

After peeling off the temporary support, development treatment was performed at 33° C. in a 1% sodium carbonate aqueous solution for 45 seconds.

Thereafter, the residue was removed by injecting ultrapure water from an ultrapure water washing nozzle onto the transparent film substrate after the development treatment. Subsequently, air was blown to remove water on the transparent film substrate, and post-baking treatment was performed at 145° C. for 30 minutes to form a transparent laminate in which the second refractive index adjusting layer, the ITO transparent electrode pattern, the copper lead wire, the first refractive index adjusting layer, and the cured film are laminated in this order on the transparent film substrate.

Using the produced transparent laminate, an electrostatic capacity-type touch panel was produced by a known method.

The produced touch panel was attached to a liquid crystal display element produced by a method described in paragraphs 0097 to 0119 of JP2009-47936A, thereby producing a liquid crystal display device equipped with a touch panel.

It was confirmed that the liquid crystal display device equipped with a touch panel had excellent display properties and operated without problems.

EXPLANATION OF REFERENCES

- 10: transfer film
- 12: temporary support
- 16: protective film
- 18, 18A: photosensitive layer (electrode protective film for touch panel)
- 20, 20A: second resin layer (first refractive index adjusting layer)
- 30: touch panel
- 32: substrate
- 34: transparent electrode pattern
- 36: second refractive index adjusting layer
- 40: first region where transparent electrode pattern is present
- 42: second region where transparent electrode pattern is not present
- 56: lead wire
- 70: first transparent electrode pattern
- 72: second transparent electrode pattern
- 74: image display region
- 75: image non-display region
- 90: touch panel

What is claimed is:

1. A photosensitive resin composition comprising:

a compound A;

an alkali-soluble binder polymer;

an ethylenically unsaturated compound; and a photopolymerization initiator, wherein the compound A is selected from the group consisting of compounds represented by Formulae (A-2) and (A-3):

(A-2)

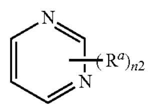

(A-3)

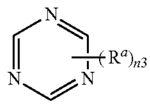

wherein, in Formulae (A-2) and (A-3), each $R^a$ represents —$CONH_2$, n2 represents an integer of from 1 to 4, and n3 represents an integer of from 1 to 3, and wherein the alkali-soluble binder polymer comprises a structural unit having an aliphatic hydrocarbon ring represented by Formula (Cy):

(Cy)

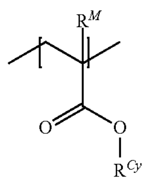

wherein, in Formula (Cy), $R^M$ represents a hydrogen atom or a methyl group, and $R^{Cy}$ represents a tetrahydrodicyclopentadiene ring structure.

2. The photosensitive resin composition according to claim 1, wherein n2 represents an integer of 1 or 2, and n3 represents an integer of 1 or 2.

3. The photosensitive resin composition according to claim 1, wherein a content of the compound A is 0.2% by mass to 1.8% by mass with respect to a total solid content of the photosensitive resin composition.

4. The photosensitive resin composition according to claim 1, wherein, in a case where a storage elastic modulus of the photosensitive resin composition at 100° C. is defined as $P\times10^2$ Pa and a content of the compound A with respect to a total solid content in the photosensitive resin composition is defined as $W^A$ % by mass, Expression 1 is satisfied, $$0.01\leq P/W^A\leq1{,}000 \qquad \text{Expression 1.}$$

5. The photosensitive resin composition according to claim 1, wherein, in a case where a storage elastic modulus of the photosensitive resin composition at 100° C. is defined as $P\times10^2$ Pa and a content of the compound A with respect to a total solid content in the photosensitive resin composition is defined as $W^A$ % by mass, Expression 2 is satisfied, $$0.1\leq P/W^A\leq500 \qquad \text{Expression 2.}$$

6. The photosensitive resin composition according to claim 1, wherein the photosensitive resin composition is a photosensitive resin composition for forming a protective film in a touch panel.

7. A transfer film comprising:

a temporary support; and a photosensitive layer consisting of the photosensitive resin composition according to claim 1, or that is a dried product of the photosensitive resin composition according to claim 1.

8. A cured film obtained by curing the photosensitive resin composition according to claim 1.

9. A laminate comprising:

a substrate; and a cured film obtained by curing the photosensitive resin composition according to claim 1.

10. A manufacturing method of a touch panel, comprising:

preparing a substrate for a touch panel having a surface on which at least one of an electrode for a touch panel or a wire for a touch panel is disposed;

forming a photosensitive layer consisting of the photosensitive resin composition according to claim 1 or a photosensitive layer obtained by drying the photosensitive resin composition according to claim 1 on the surface of the substrate for a touch panel, on which at least one of the electrode for a touch panel or the wire for a touch panel is disposed;

performing a pattern exposure on the photosensitive layer formed on the substrate for a touch panel; and developing the photosensitive layer subjected to the pattern exposure to obtain a protective film which protects at least a part of at least one of the electrode for a touch panel or the wire for a touch panel.

11. A photosensitive resin composition comprising:

a compound A;

an alkali-soluble binder polymer;

an ethylenically unsaturated compound; and a photopolymerization initiator, wherein the compound A is selected from the group consisting of compounds represented by Formulae (A-2) and (A-3):

(A-2)

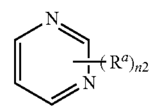

(A-3)

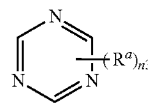

wherein, in Formula (A-2), each $R^a$ represents —$CONH_2$, n2 represents an integer of from 1 to 4, and n3 represents an integer of from 1 to 3; and in Formula (A-3), each $R^a$ represents —$CONH_2$, n2 represents an integer of from 1 to 4, and n3 represents an integer of from 1 to 3.

12. The photosensitive resin composition according to claim 11, wherein a content of the compound A is 0.2% by mass to 1.8% by mass with respect to a total solid content of the photosensitive resin composition.

13. The photosensitive resin composition according to claim 11, wherein, in a case where a storage elastic modulus of the photosensitive resin composition at 100° C. is defined as $P\times10^2$ Pa and a content of the compound A with respect to a total solid content in the photosensitive resin composition is defined as WA % by mass, Expression 1 is satisfied:

$$0.01 \leq P/W^A \leq 1{,}000 \quad \text{Expression 1.}$$

14. A transfer film comprising:

a temporary support; and a photosensitive layer consisting of the photosensitive resin composition according to claim 11, or that is a dried product of the photosensitive resin composition according to claim 11.

15. A cured film obtained by curing the photosensitive resin composition according to claim 11.

16. A laminate comprising:

a substrate; and a cured film obtained by curing the photosensitive resin composition according to claim 11.

17. A manufacturing method of a touch panel, comprising:

preparing a substrate for a touch panel having a surface on which at least one of an electrode for a touch panel or a wire for a touch panel is disposed;

forming a photosensitive layer consisting of the photosensitive resin composition according to claim 11 or a photosensitive layer obtained by drying the photosensitive resin composition according to claim 11 on the surface of the substrate for a touch panel, on which at least one of the electrode for a touch panel or the wire for a touch panel is disposed;

performing a pattern exposure on the photosensitive layer formed on the substrate for a touch panel; and developing the photosensitive layer subjected to the pattern exposure to obtain a protective film which protects at least a part of at least one of the electrode for a touch panel or the wire for a touch panel.

* * * * *